US012603585B2

(12) United States Patent
Taniguchi et al.

(10) Patent No.: US 12,603,585 B2
(45) Date of Patent: Apr. 14, 2026

(54) RECTIFIER

(71) Applicant: ROHM CO., LTD., Kyoto (JP)

(72) Inventors: Satoki Taniguchi, Kyoto (JP); Kentaro Nasu, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 335 days.

(21) Appl. No.: 18/331,735

(22) Filed: Jun. 8, 2023

(65) Prior Publication Data

US 2023/0421072 A1     Dec. 28, 2023

(30) Foreign Application Priority Data

Jun. 28, 2022   (JP) ................................. 2022-103295

(51) Int. Cl.
| | |
|---|---|
| *H02M 7/00* | (2006.01) |
| *G01R 19/22* | (2006.01) |
| *H02M 7/217* | (2006.01) |
| *H10D 84/80* | (2025.01) |
| *H10D 84/83* | (2025.01) |
| *H10D 84/85* | (2025.01) |
| *H10D 30/65* | (2025.01) |
| *H10D 84/00* | (2025.01) |

(52) U.S. Cl.
CPC .......... *H02M 7/217* (2013.01); *H10D 84/811* (2025.01); *H10D 84/83* (2025.01); *H10D 84/85* (2025.01); *H10D 30/658* (2025.01); *H10D 84/154* (2025.01)

(58) Field of Classification Search
CPC .......... G01R 19/22; H02M 7/00; H02M 7/02; H02M 7/05; H02M 7/217; H02M 7/2176; H03K 17/687; H03K 17/74
USPC ................ 327/128, 343, 428, 445, 453, 531
See application file for complete search history.

(56) References Cited

U.S. PATENT DOCUMENTS

| | | | |
|---|---|---|---|
| 7,692,473 B2 * | 4/2010 | Ono ..................... | H10D 89/611 |
| | | | 327/427 |
| 7,932,753 B2 * | 4/2011 | Ilkov ..................... | H02M 7/217 |
| | | | 327/104 |
| 2007/0145474 A1 | 6/2007 | Annese et al. | |
| 2011/0216566 A1 | 9/2011 | Kamata | |

* cited by examiner

*Primary Examiner* — Hai L Nguyen
(74) *Attorney, Agent, or Firm* — Rabin & Berdo, P.C.

(57) ABSTRACT
A rectifier includes a first transistor of a drain/source common field effect type and a second transistor of a drain/source common field effect type in which the second transistor is diode-connected to the first transistor so as to allow the first transistor to perform a diode operation, and configures a rectifier stage with the first transistor.

15 Claims, 54 Drawing Sheets

1A

13(13A)

11
12

13(13B)

1st Transistor

14(Tr1)

2nd Transistor

15(Tr2)

1A

1E

RECTIFIER

CROSS REFERENCE TO RELATED APPLICATIONS

This application claims the benefit of priority to Japanese Patent Application No. 2022-103295 filed on Jun. 28, 2022. The entire contents of the application are hereby incorporated herein by reference.

BACKGROUND OF THE INVENTION

1. Field of the Invention

The present invention relates to a rectifier.

2. Description of the Related Art

US2007-0145474 discloses a drain/source common field effect transistor. US2011-0216566 discloses a MOS transistor having a source or a drain that is diode-connected to a gate.

SUMMARY OF THE INVENTION

An embodiment provides a rectifier including a first transistor of a drain/source common field effect type and a second transistor of a drain/source common field effect type in which the second transistor is diode-connected to the first transistor so as to allow the first transistor to perform a diode operation, and configures a rectifier stage with the first transistor.

An embodiment provides a rectifier including a transistor of a drain/source common field effect type of a p-channel, the transistor having a gate fixed at a zero potential, a first drain source that functions as an anode of a rectifier stage, a second drain source that functions as a cathode of the rectifier stage, and a back gate electrically connected to the first drain source.

An embodiment provides a rectifier including a transistor of a drain/source common field effect type of an n-channel, the transistor having a gate, a first drain source that is electrically connected to the gate and that functions as an anode of a rectifier stage, a second drain source that functions as a cathode of the rectifier stage, and a back gate fixed at a zero potential.

The aforementioned or other objects, features, and effects will be clarified by the following description of embodiments given below with reference to the accompanying drawings.

DETAILED DESCRIPTION OF THE
PREFERRED EMBODIMENTS

An embodiment provides a rectifier having a novel configuration.

An embodiment provides a rectifier including a first transistor of a drain/source common field effect type and a second transistor of a drain/source common field effect type in which the second transistor is diode-connected to the first transistor so as to allow the first transistor to perform a diode operation, and configures a rectifier stage with the first transistor.

An embodiment provides a rectifier including a transistor of a drain/source common field effect type of a p-channel, the transistor having a gate fixed at a zero potential, a first drain source that functions as an anode of a rectifier stage, a second drain source that functions as a cathode of the rectifier stage, and a back gate electrically connected to the first drain source.

An embodiment provides a rectifier including a transistor of a drain/source common field effect type of an n-channel, the transistor having a gate, a first drain source that is electrically connected to the gate and that functions as an anode of a rectifier stage, a second drain source that functions as a cathode of the rectifier stage, and a back gate fixed at a zero potential.

An embodiment will be hereinafter described in detail with reference to the accompanying drawings. The accompanying drawing is a schematic view, and is not a precisely-depicted view, and its reduced scale or the like does not necessarily coincide with those of the other accompanying drawings. Additionally, the same reference sign is assigned to a mutually-equivalent constituent among the accompanying drawings, and a duplicative description of this constituent is omitted or simplified. A description given before being omitted or simplified is applied to the configuration a description of which has been omitted or simplified.

When the phrase "substantially equal" or the like is used in this description, this phrase includes a numerical value (form) equal to a numerical value (form) of a comparable object, and, in addition, includes a numerical error (form error) within the range of ±10% based on the numerical value of the comparable object (form). The term "first," "second," "third" or the like is used in the embodiment, and each of these terms is a symbol given to the name of each constituent for clarifying the descriptive order, and is not given with the aim of limiting the name of each constituent.

The term "rectifier" according to this description is a concept including a rectifier circuit, a rectifier instrument, a rectifier module, etc., and may be referred to as a "rectifier circuit," a "semiconductor rectifier circuit," a "semiconductor rectifier," a "semiconductor rectifier instrument," a "semiconductor device," a "semiconductor module," or the like if necessary.

Figure 1:
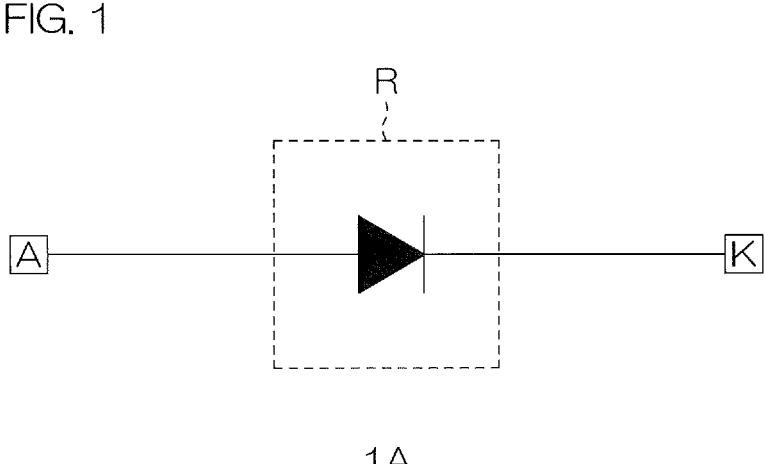
FIG. 1 is a circuit diagram showing an electrical configuration of a rectifier according to a first embodiment.
Figure 2:
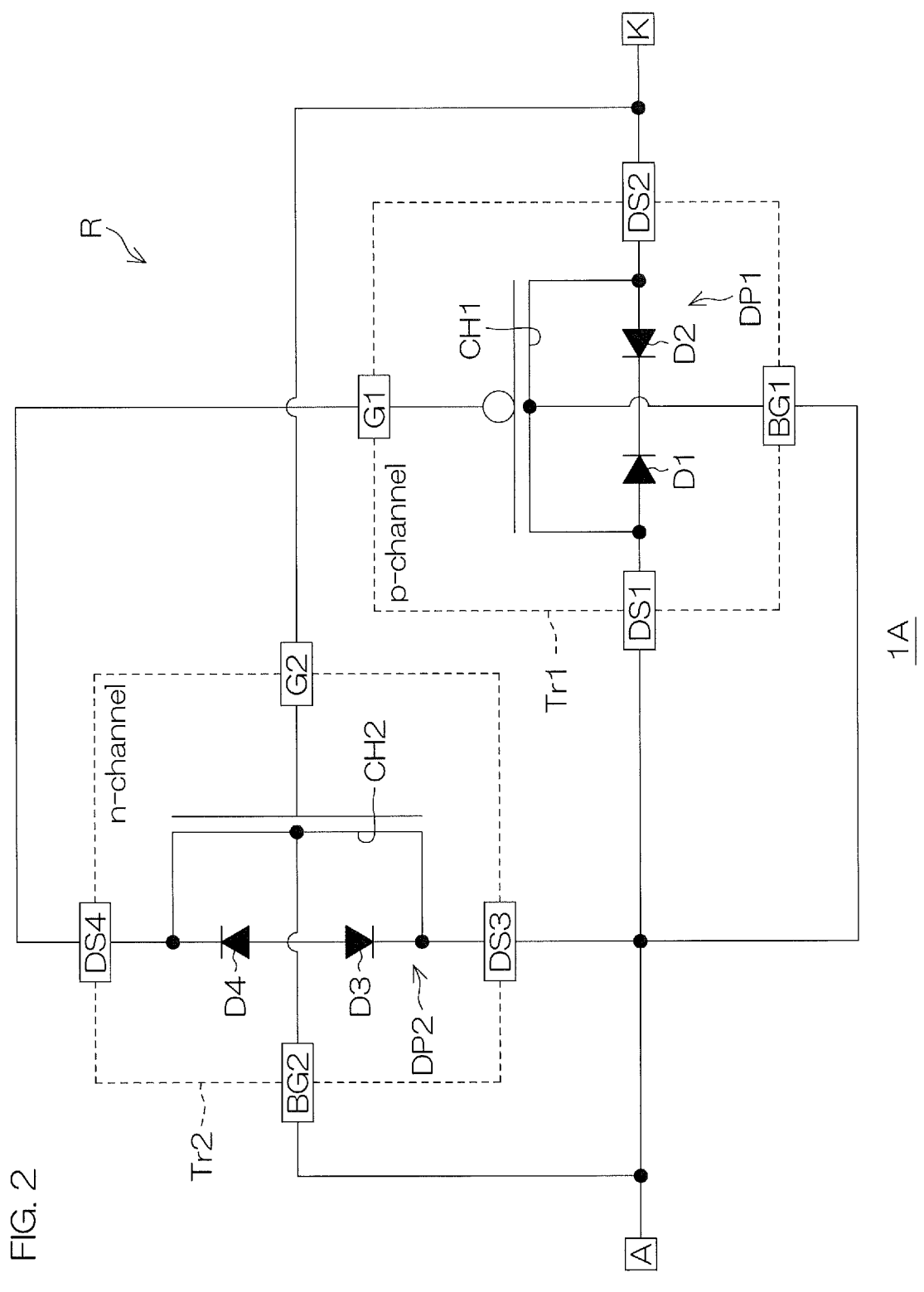
FIG. 2 is a circuit diagram showing a concrete electrical configuration of the rectifier shown in FIG. 1.

FIG. 1 is a circuit diagram showing an electrical configuration of a rectifier LA according to a first embodiment. FIG. 2 is a circuit diagram showing a concrete electrical configuration of the rectifier LA shown in FIG. 1. Referring to FIG. 1, the rectifier LA includes a rectifier stage R, an anode end A, and a cathode end K. The rectifier stage R may be referred to as a "rectifier portion," a "diode stage," or a "diode portion." The rectifier stage R has an anode and a cathode. The anode end A is an application end of an anode potential, and is electrically connected to the anode of the rectifier stage R. The cathode end K is an application end of a cathode potential, and is electrically connected to the cathode of the rectifier stage R.

Referring to FIG. 2, the rectifier stage R includes a first transistor Tr1 of a drain/source common field effect type and a second transistor Tr2 of the drain/source common field effect type. In this embodiment, the first transistor Tr1 is a p-channel type, and the second transistor Tr2 is an n-channel type. Hereinafter, a fundamental configuration of each of the first and second transistors Tr1 and Tr2 will be first described, and then a configuration of the rectifier stage R will be described.

The first transistor Tr1 may be an Si transistor formed in an Si (silicon) monocrystal, or may be a wide bandgap semiconductor transistor formed in a monocrystal of a wide bandgap semiconductor. The wide bandgap semiconductor is a semiconductor having a bandgap larger than the bandgap of Si. The first transistor Tr1 may be an SiC transistor formed in an SiC (silicon carbide) monocrystal as an example of the wide bandgap semiconductor.

The first transistor Tr1 has a first gate G1, a first drain source DS1, a second drain source DS2, a first back gate BG1, and a first diode pair DP1. Each of the first drain source DS1 and the second drain source DS2 integrally includes a source and a drain.

The first gate G1 has a first gate threshold voltage Vgth1. The first gate threshold voltage Vgth1 may exceed 0 V and not more than 1.0 V. The first gate threshold voltage Vgth1 may have a value that belongs to any one of the ranges of beyond 0 V and not more than 0.1 V, not less than 0.1 V and not more than 0.2 V, not less than 0.2 V and not more than 0.3 V, not less than 0.3 V and not more than V, not less than 0.4 V and not more than 0.5 V, not less than 0.5 V and not more than 0.6 V, not less than 0.6 V and not more than 0.7 V, not less than 0.7 V and not more than V, not less than 0.8 V and not more than 0.9 V, and not less than 0.9 V and not more than 1.0 V. Preferably, the first gate threshold voltage Vgth1 is 0.5 V or less.

The first diode pair DP1 includes a first body diode D1 and a second body diode D2 that are reverse bias connected so as to be a cathode common, and is electrically connected to the first drain source DS1 and to the second drain source DS2. The first body diode D1 is a pn junction diode, and the second body diode D2 is a pn junction diode.

The first body diode D1 includes an anode that is electrically connected to the first drain source DS1 and a cathode that forms a node with respect to the second body diode D2. The second body diode D2 includes an anode that is electrically connected to the second drain source DS2 and a cathode that is electrically connected to the cathode of the first body diode D1.

The first diode pair DP1 has a first breakdown voltage VB1. The first breakdown voltage VB1 is limited to the breakdown voltage of either the first body diode D1 or the second body diode D2 by means of a voltage application direction with respect to the first diode pair DP1.

The first breakdown voltage VB1 may be not less than 5 V and not more than 3000 V. The first breakdown voltage VB1 may have a value that belongs to any one of the ranges of not less than 5 V and not more than 50 V, not less than 50 V and not more than 100 V, not less than 100 V and not more than 250 V, not less than 250 V and not more than 500 V, not less than 500 V and not more than 750 V, not less than 750 V and not more than 1000 V, not less than 1000 V and not more than 1250 V, not less than 1250 V and not more than 1500 V, not less than 1500 V and not more than 1750 V, not less than 1750 V and not more than 2000 V, not less than 2000 V and not more than 2250 V, not less than 2250 V and not more than 2500 V, not less than 2500 V and not more than 2750 V, and not less than 2750 V and not more than 3000 V.

When a voltage equal to or more than the first gate threshold voltage Vgth1 is applied to the first gate G1 and when a predetermined drain-source voltage is applied between the first drain source DS1 and the second drain source DS2, a drain-source current flows between the first drain source DS1 and the second drain source DS2 through a first channel CH1 of the first transistor Tr1. The direction of the drain-source current is to be reversed by the positive/negative of the drain-source voltage. In other words, the first transistor Tr1 is a bidirectional device that is capable of passing a drain-source current in both directions of the first drain source DS1 and the second drain source DS2.

When a voltage less than the first gate threshold voltage Vgth1 is applied to the first gate G1 and when a drain-source voltage equal to or more than the first breakdown voltage VB1 is applied between the first drain source DS1 and the second drain source DS2, a breakdown current flows between the first drain source DS1 and the second drain source DS2 through the first diode pair DP1.

The characteristic (inclination) of the drain-source current is adjusted by a first on-resistance Ron1 of the first transistor Tr1. The first transistor Tr1 may have the first on-resistance Ron1 of, for example, not less than 50 mΩ and not more than 200 mΩ per unit area (1 square millimeter).

The first on-resistance Ron1 may have a value that belongs to any one of the ranges of not less than 50 mΩ and not more than 75 mS), not less than 75 mΩ and not more than 100 mΩ, not less than 100 mΩ and not more than 125 mS), not less than 125 mΩ and not more than 150 mS), not less than 150 mΩ and not more than 175 mS), and not less than 175 mS) and not more than 200 mc). Preferably, the first on-resistance Ron1 is 150 mΩ or less.

The second transistor Tr2 may be an Si transistor formed in an Si monocrystal, or may be a wide bandgap semiconductor transistor formed in a monocrystal of a wide bandgap semiconductor. The second transistor Tr2 may be an SiC transistor formed in an SiC monocrystal as an example of the wide bandgap semiconductor.

The second transistor Tr2 has a second gate G2, a third drain source DS3, a fourth drain source DS4, a second back gate BG2, and a second diode pair DP2. Each of the third drain source DS3 and the fourth drain source DS4 integrally includes a source and a drain.

The second gate G2 has a second gate threshold voltage Vgth2. The second gate threshold voltage Vgth2 may be substantially equal to the first gate threshold voltage Vgth1, or may be less than the first gate threshold voltage Vgth1, or may be larger than the first gate threshold voltage Vgth1. Preferably, the second gate threshold voltage Vgth2 is equal to or more than the first gate threshold voltage Vgth1. The second gate threshold voltage Vgth2 is less than the first breakdown voltage VB1 of the first diode pair DP1.

The second gate threshold voltage Vgth2 may exceed 0 V and not more than 1.0 V. The second gate threshold voltage Vgth2 may have a value that belongs to any one of the ranges of beyond 0 V and not more than 0.1 V, not less than 0.1 V and not more than 0.2 V, not less than 0.2 V and not more than 0.3 V, not less than 0.3 V and not more than 0.4 V, not less than 0.4 V and not more than 0.5 V, not less than 0.5 V and not more than 0.6 V, not less than 0.6 V and not more than 0.7 V, not less than 0.7 V and not more than 0.8 V, not less than 0.8 V and not more than 0.9 V, and not less than 0.9 V and not more than 1.0 V. Preferably, the second gate threshold voltage Vgth2 is equal to or less than 0.5 V.

The second diode pair DP2 includes a third body diode D3 and a fourth body diode D4 that are reverse bias connected so as to be an anode common, and is electrically connected to the third drain source DS3 and to the fourth body diode D4. The third body diode D3 is a pn junction diode, and the fourth body diode D4 is a pn junction diode.

The third body diode D3 includes an anode that forms a node with respect to the fourth body diode D4 and a cathode that is electrically connected to the third drain source DS3. The fourth body diode D4 includes an anode that is electrically connected to the anode of the third body diode D3 and a cathode that is electrically connected to the fourth drain source DS4.

The second diode pair DP2 has a second breakdown voltage VB2. The second breakdown voltage VB2 is limited to the breakdown voltage of either the third body diode D3 or the fourth body diode D4 by means of a voltage application direction with respect to the second diode pair DP2. The second breakdown voltage VB2 may be substantially equal to the first breakdown voltage VB1, or may be less than the first breakdown voltage VB1, or may be larger than the first breakdown voltage VB1.

The second breakdown voltage VB2 may be not less than 5 V and not more than 2000 V. The second breakdown voltage VB2 may have a value that belongs to any one of the ranges of not less than 5 V and not more than 50 V, not less than 50 V and not more than 100 V, not less than 100 V and not more than 250 V, not less than 250 V and not more than 500 V, not less than 500 V and not more than 750 V, not less than 750 V and not more than 1000 V, not less than 1000 V and not more than 1250 V, not less than 1250 V and not more than 1500 V, not less than 1500 V and not more than 1750 V, not less than 1750 V and not more than 2000 V, not less than 2000 V and not more than 2250 V, not less than 2250 V and not more than 2500 V, not less than 2500 V and not more than 2750 V, and not less than 2750 V and not more than 3000 V.

When a voltage equal to or more than the second gate threshold voltage Vgth2 is applied to the second gate G2 and when a predetermined drain-source voltage is applied between the third drain source DS3 and the fourth drain source DS4, a drain-source current flows between the third drain source DS3 and the fourth drain source DS4 through a second channel CH2 of the second transistor Tr2. The direction of the drain-source current is to be reversed by the positive/negative of the drain-source voltage. In other words, the second transistor Tr2 is a bidirectional device that is capable of passing a drain-source current in both directions of the third drain source DS3 and the fourth drain source DS4.

When a voltage less than the second gate threshold voltage Vgth2 is applied to the second gate G2 and when a drain-source voltage equal to or more than the second breakdown voltage VB2 is applied between the third drain source DS3 and the fourth drain source DS4, a breakdown current flows between the third drain source DS3 and the fourth drain source DS4 through the second diode pair DP2.

The characteristic (inclination) of the drain-source current is adjusted by a second on-resistance Ron2 of the second transistor Tr2. The second transistor Tr2 may have the second on-resistance Ron2 of, for example, not less than 50 mΩ and not more than 200 mΩ per unit area (1 square millimeter).

The second on-resistance Ron2 may have a value that belongs to any one of the ranges of not less than 50 mΩ and not more than 75 mS), not less than 75 mΩ and not more than 100 mΩ, not less than 100 mΩ and not more than 125 mS), not less than 125 mΩ and not more than 150 mS), not less than 150 mΩ and not more than 175 mS), and not less than 175 mS) and not more than 200 mc). Preferably, the second on-resistance Ron2 is 150 mΩ or less.

The rectifier stage R is configured by allowing the second transistor Tr2 to be diode-connected to the first transistor Tr1 so that the first transistor Tr1 performs a diode operation. In detail, the second transistor Tr2 is provided as a bias circuit that enables the first transistor Tr1 to perform a diode operation by means of a bias voltage, hence configuring the rectifier stage R together with the first transistor Tr1.

In more detail, the second gate G2 is electrically connected to the second drain source DS2, the third drain source DS3 is electrically connected to the first drain source DS1 and to the first back gate BG1, the fourth drain source DS4 is electrically connected to the first gate G1, and the second back gate BG2 is electrically connected to the first drain source DS1 and to the first back gate BG1.

In other words, the first back gate BG1 is electrically connected to the first drain source DS1 on the first transistor Tr1 side, and the second back gate BG2 is electrically connected to the third drain source DS3 on the second transistor Tr2 side. Hence, the first drain source DS1, the first back gate BG1, the third drain source DS3, and the second back gate BG2 are fixed at the same potential. Also, the first gate G1 and the fourth drain source DS4 are fixed at the same potential. Also, the second drain source DS2 and the second gate G2 are fixed at the same potential.

The fourth drain source DS4 configures a short circuit with the first gate G1, and does not form a voltage drop between the first gate G1 and the fourth drain source DS4. In other words, the first gate G1 and the fourth drain source DS4 are fixed at a zero potential (same potential). The first gate G1 and the fourth drain source DS4 are fixed at a zero potential both at ON and at OFF of the rectifier stage R (the first transistor Tr1).

The first drain source DS1 is electrically connected to the anode end A, and the second drain source DS2 is electrically connected to the cathode end K. In this description and in the accompanying drawings, the anode end A and the first drain source DS1 are represented separately from each other, and the cathode end K and the second drain source DS2 are represented separately from each other. However, the anode end A may be regarded as being configured by the first drain source DS1, and the cathode end K may be regarded as being configured by the second drain source DS2.

Figure 3A:
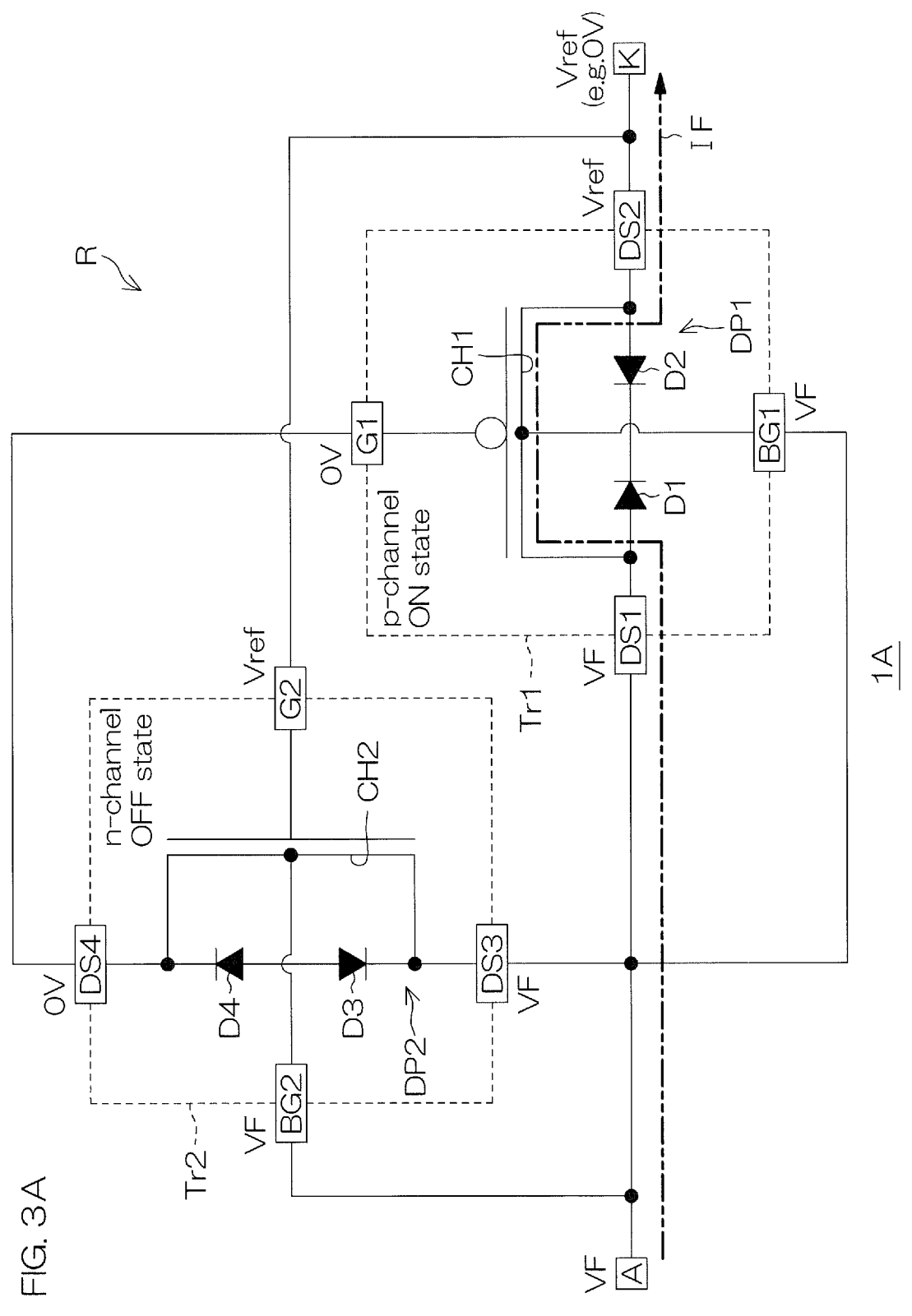
FIG. 3A is a circuit diagram showing a forward operation of the rectifier shown in FIG. 1.
Figure 3B:
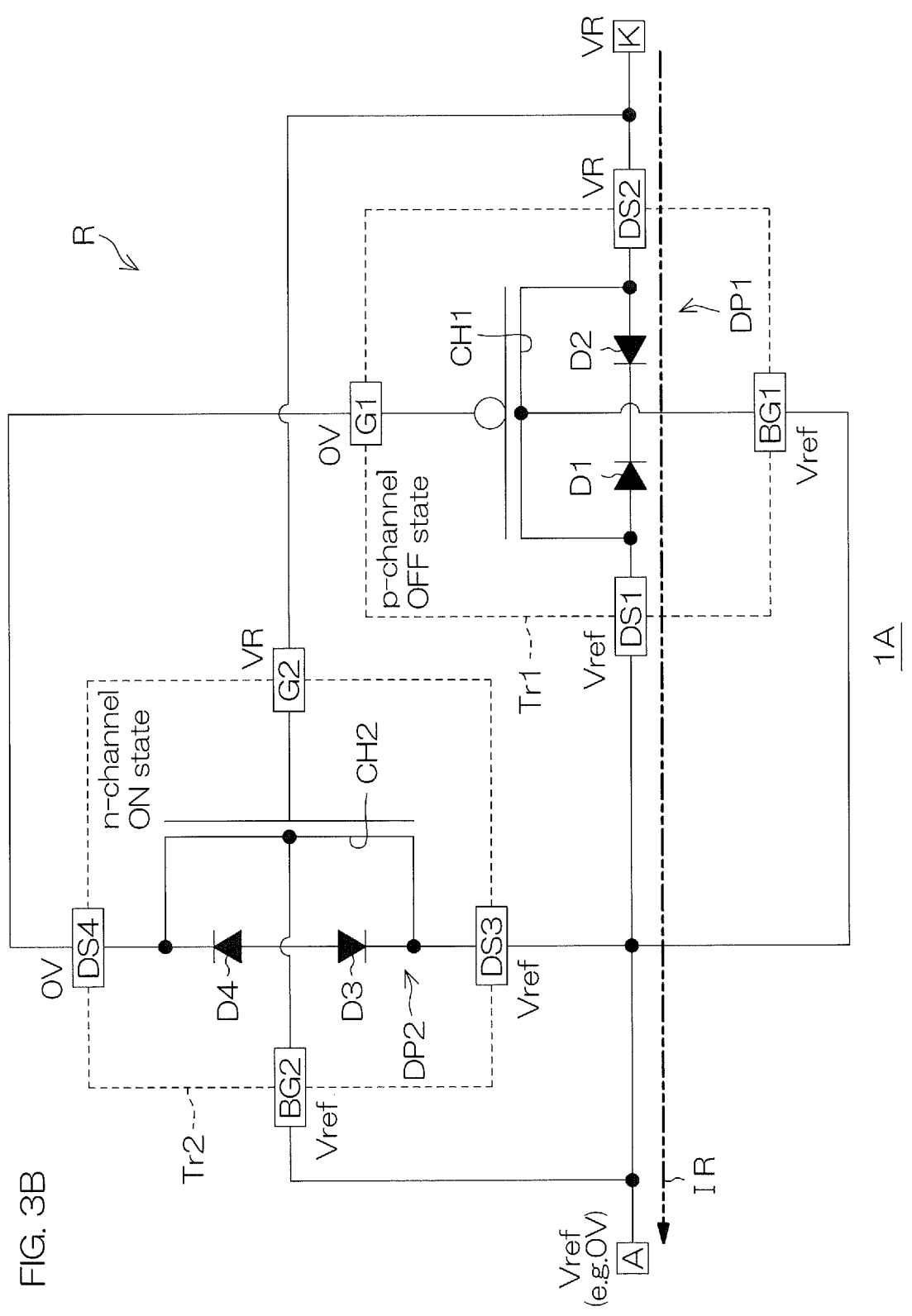
FIG. 3B is a circuit diagram showing a reverse operation of the rectifier shown in FIG. 1.

FIG. 3A is a circuit diagram showing a forward operation of the rectifier LA shown in FIG. 1. FIG. 3B is a circuit diagram showing a reverse operation of the rectifier LA shown in FIG. 1. Referring to FIG. 3A and FIG. 3B, a forward current IF flows to the first transistor Tr1 in the forward operation, and a reverse current IR flows to the first transistor Tr1 in the reverse operation.

In detail, in the forward operation, a forward potential VF based on the second drain source DS2 is applied to the first drain source DS1, and the forward current IF flows from the first drain source DS1 toward the second drain source DS2 with reference to FIG. 3A. In FIG. 3A, a circuit operation is shown when a reference potential Vref (for example, ground potential) is applied to the second drain source DS2 and when the forward potential VF is applied to the first drain source DS1. A forward voltage will be hereinafter referred to at times as the "forward voltage VF."

In the forward operation, the first drain source DS1, the first back gate BG1, the third drain source DS3, and the second back gate BG2 are fixed at the forward potential VF. The second drain source DS2 and the second gate G2 are fixed at the reference potential Vref. The first gate G1 and the fourth drain source DS4 are fixed at a zero potential without forming a voltage drop.

In the first transistor Tr1, the first gate G1 is fixed at a zero potential, and the first back gate BG1 is fixed at the forward potential VF. Therefore, the first transistor Tr1 reaches an OFF state when the forward voltage VF is less than the first gate threshold voltage Vgth1 of the first gate G1, and the first transistor Tr1 reaches an ON state when the forward voltage VF is equal to or more than the first gate threshold voltage Vgth1. When the first transistor Tr1 reaches an ON state, the forward current IF flows from the first drain source DS1 toward the second drain source DS2 through the first channel CH1 of the first transistor Tr1.

In the second transistor Tr2, the second gate G2 is fixed at the reference potential Vref, and the second back gate BG2 is fixed at the forward potential VF. Therefore, the second transistor Tr2 reaches an OFF state. The second transistor Tr2 does not form a current path between the first drain source DS1 and the second drain source DS2, and therefore the forward current IF does not flow through the second transistor Tr2.

Thus, in the forward operation, the first transistor Tr1 is controlled to be an ON state, and the second transistor Tr2 is controlled to be an OFF state by means of a bias effect caused by the second transistor Tr2. In this state, the forward current IF flows between the first drain source DS1 and the second drain source DS2 through the first channel CH1 of the first transistor Tr1.

In other words, the first transistor Tr1 has the first gate threshold voltage Vgth1 that serves as a forward threshold voltage Vth of the rectifier stage R. Also, the first transistor Tr1 passes a drain-source current that serves as the forward current IF of the rectifier stage R. In other words, the characteristic of the forward current IF of the rectifier stage R coincides with the characteristic of the drain-source current of the first transistor Tr1.

Referring to FIG. 3B, in the reverse operation, a reverse potential VR based on the first drain source DS1 is applied to the second drain source DS2, and the reverse current IR flows from the second drain source DS2 toward the first drain source DS1. In FIG. 3B, a circuit operation is shown when the reference potential Vref (for example, ground potential) is applied to the first drain source DS1 and when the reverse potential VR is applied to the second drain source DS2. A reverse voltage will be hereinafter referred to at times as the "reverse voltage VR."

In the reverse operation, the first drain source DS1, the first back gate BG1, the third drain source DS3, and the second back gate BG2 are fixed at the reference potential Vref. The second gate G2 and the second drain source DS2 are fixed at the reverse potential VR. The first gate G1 and the fourth drain source DS4 are fixed at a zero potential without forming a voltage drop.

In the first transistor Tr1, the first gate G1 is fixed at a zero potential, and the first back gate BG1 is fixed at the reference potential Vref (zero potential). Therefore, the first transistor Tr1 reaches an OFF state. When the reverse voltage VR is less than the first breakdown voltage VB1, a leak current serving as the reverse current IR flows between the first drain source DS1 and the second drain source DS2.

When the reverse voltage VR is equal to or more than the first breakdown voltage VB1, the first diode pair DP1 breaks down, and a breakdown current serving as the reverse current IR flows between the first drain source DS1 and the second drain source DS2. Both the characteristic of the leak current and the characteristic of the breakdown current depend on the characteristic of the first diode pair DP1.

In the second transistor Tr2, the second gate G2 is fixed at the reverse potential VR, and the second back gate BG2 is fixed at the reference potential Vref. Therefore, the second transistor Tr2 reaches an OFF state when the reverse voltage VR is less than the second gate threshold voltage Vgth2, and the second transistor Tr2 reaches an ON state when the reverse voltage VR is equal to or more than the second gate threshold voltage Vgth2.

The second gate threshold voltage Vgth2 is less than the first breakdown voltage VB1. Therefore, the second transistor Tr2 reaches an ON state before the first diode pair DP1 breaks down. The second transistor Tr2 does not form a current path between the first drain source DS1 and the second drain source DS2, and therefore the reverse current IR does not flow through the second transistor Tr2.

Thus, in the reverse operation, the first transistor Tr1 is controlled to be an OFF state, and the second transistor Tr2 is controlled to be an ON state by means of a bias effect caused by the second transistor Tr2. In this state, the reverse current IR flows between the first drain source DS1 and the second drain source DS2 through the first diode pair DP1.

In other words, the characteristic of the reverse current IR coincides with the characteristic of the first diode pair DP1. The withstand voltage of the rectifier stage R with respect to the reverse voltage VR is limited to a lower withstand voltage between the withstand voltage of the first diode pair DP1 (the first breakdown voltage VB1) and the gate withstand voltage of the second transistor Tr2 (the gate dielectric breakdown resistance).

Figure 4:
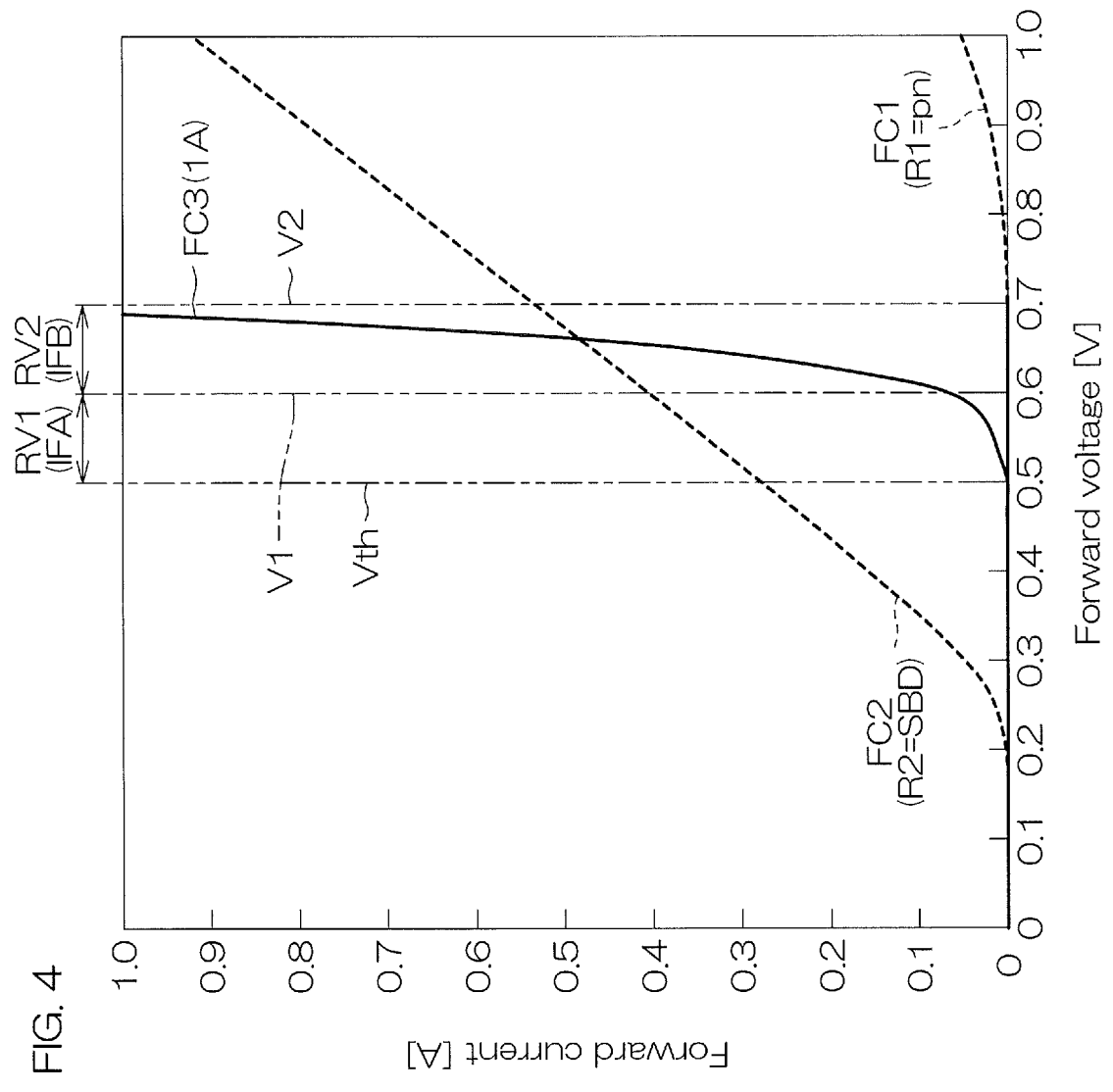
FIG. 4 is a graph showing a forward characteristic.

FIG. 4 is a graph showing a forward characteristic. In FIG. 4, the ordinate axis represents the forward current IF [A], and the abscissa axis represents the forward voltage VF [V]. A first forward characteristic FC1, a second forward characteristic FC2, and a third forward characteristic FC3 are shown in FIG. 4. The first forward characteristic FC1 represents the characteristic of a first reference rectifier R1, and the second forward characteristic FC2 represents the characteristic of a second reference rectifier R2, and the third forward characteristic FC3 represents the characteristic of the rectifier LA. The first reference rectifier R1 is configured by a pn junction diode element. The second reference rectifier R2 is configured by a Schottky barrier diode element.

Referring to the first forward characteristic FC1, the first reference rectifier R1 has the comparatively high forward threshold voltage Vth (here, about 0.7 V). The forward current IF of the first reference rectifier R1 has a comparatively sluggish rise characteristic. In the first reference rectifier R1, electric power that is consumed when the forward current IF of 100 mA is passed is calculated by the multiplication of the forward voltage VF and the forward current IF, and is 113 mW (=1.13 V×100 mA) in this embodiment.

Referring to the second forward characteristic FC2, the second reference rectifier R2 has the forward threshold voltage Vth (here, about 0.2 V) that is lower than the forward threshold voltage Vth of the first reference rectifier R1. The forward current IF of the second reference rectifier R2 has a steeper rise characteristic than the first reference rectifier R1.

In other words, the second reference rectifier R2 has a more excellent switching response characteristic than the first reference rectifier R1. In the second reference rectifier R2, electric power that is consumed when the forward current IF of 100 mA is passed is calculated by the multiplication of the forward voltage VF and the forward current IF, and is 32 mW (=0.32 V×100 mA) in this embodiment.

Referring to the third forward characteristic FC3, the rectifier LA has the forward threshold voltage Vth (first gate threshold voltage Vgth1) that is lower than the forward threshold voltage Vth of the first reference rectifier R1 and that is higher than the forward threshold voltage Vth of the second reference rectifier R2 in this embodiment. The forward threshold voltage Vth (first gate threshold voltage Vgth1) is about 0.5 V in this embodiment. The forward current IF of the rectifier LA has a steeper rise characteristic than the first reference rectifier R1 and than the second reference rectifier R2.

In detail, the forward current IF of the rectifier LA has a low current region IFS in a first voltage range RV1, and has a high current region IFL in a second voltage range RV2. The first voltage range RV1 is a voltage range between the forward threshold voltage Vth and a first voltage V1 that is higher by 0.1 V than this forward threshold voltage Vth. The second voltage range RV2 is a voltage range between the first voltage V1 and a second voltage V2 that is higher by 0.1 V than this first voltage V1.

Preferably, an amplification factor AR of the forward current IF is beyond 1 and is equal to or less than 100. The amplification factor AR is a ratio of a second maximum value of the forward current IF in the high current region IFL to a first maximum value of the forward current IF in the low current region IFS.

The amplification factor AR may be set at a value that belongs to any one of the ranges of beyond 1 and not more than 5, not less than 5 and not more than 10, not less than 10 and not more than 15, not less than 15 and not more than 20, not less than 20 and not more than 25, not less than 25 and not more than 30, not less than 30 and not more than 35, not less than 35 and not more than 40, not less than 40 and not more than 45, not less than 45 and not more than 50, not less than 50 and not more than 60, not less than 60 and not more than 70, not less than 70 and not more than 80, not less than 80 and not more than 90, and not less than 90 and not more than 100. Preferably, the amplification factor AR is 5 or more. Particularly preferably, the amplification factor AR is 10 or more.

The first maximum value of the forward current IF may be not less than 0.01 A and not more than 0.2 A. The first maximum value may be 0.15 A or less. Preferably, the first maximum value is 0.1 A or less. The second maximum value of the forward current IF may be not less than 0.1 A and not more than 5 A. Preferably, the second maximum value is 0.5 A or more. Particularly preferably, the second maximum value is 1 A or more. The second maximum value may be 4 A or less. The second maximum value may be 3 A or less. The second maximum value may be 2 A or less.

The inclination of a tangent line of the low current region IFS in the first voltage range RV1 is not less than 0.1 and not more than 1. The inclination of the tangent line of the low current region IFS may be set at a value that belongs to any one of the ranges of not less than and not more than 0.25, not less than 0.25 and not more than 0.5, not less than 0.5 and not more than 0.75, and not less than 0.75 and not more than 1. Preferably, the inclination of the tangent line of the low current region IFS is not less than 0.5 and not more than 0.9.

The inclination of a tangent line of the high current region IFL in the second voltage range RV2 is larger than the inclination of the tangent line of the low current region IFS. The inclination of the tangent line of the high current region IFL is not less than 2.5 and not more than 20. The inclination of the tangent line of the high current region IFL may be set at a value that belongs to any one of the ranges of not less than 2.5 and not more than 5, not less than 5 and not more than 7.5, not less than 7.5 and not more than 10, not less than 10 and not more than 12.5, not less than 12.5 and not more than 15, not less than 15 and not more than 17.5, and not less than 17.5 and not more than 20.

Preferably, the inclination of the tangent line of the high current region IFL is 5 or more. Particularly preferably, the inclination of the tangent line of the high current region IFL is 10 or more. Preferably, the inclination of the tangent line of the high current region IFL is 15 or less.

As thus described, the rectifier 1A has a more excellent switching response characteristic than the first reference rectifier R1 and than the second reference rectifier R2. Particularly, the rectifier LA is capable of passing the forward current IF equal to or more than 0.5 A by applying the forward voltage VF higher by 0.2 V than the forward threshold voltage Vth. In detail, the rectifier LA is capable of passing the forward current IF equal to or more than 1 A by applying the forward voltage VF higher by 0.2 V than the forward threshold voltage Vth.

In other words, the rectifier LA is enabled to make power consumption in the high current region IFL (for example, a current region equal to or more than 0.5 A) smaller than the second reference rectifier R2. In the rectifier LA, electric power that is consumed when the forward current IF of 100 mA is passed is calculated by the multiplication of the square of the forward current IF and the first on-resistance Ron1 (IF×IF×R1, 50 mΩ≤Ron1≤200 mΩ), and is not less than 0.5 mW and not more than 2 mW in this embodiment. In other words, the rectifier LA is enabled to make the power consumption smaller than the first reference rectifier R1 and than the second reference rectifier R2.

In this embodiment, an example has been shown in which the rectifier LA has the forward threshold voltage Vth (first gate threshold voltage Vgth1) higher than the forward threshold voltage Vth of the second reference rectifier R2. However, the forward threshold voltage Vth is adjustable to have a desired value (i.e., a value that is beyond 0 V and that is equal to or less than 1.0 V) by means of the first gate threshold voltage Vgth1.

Figure 5:
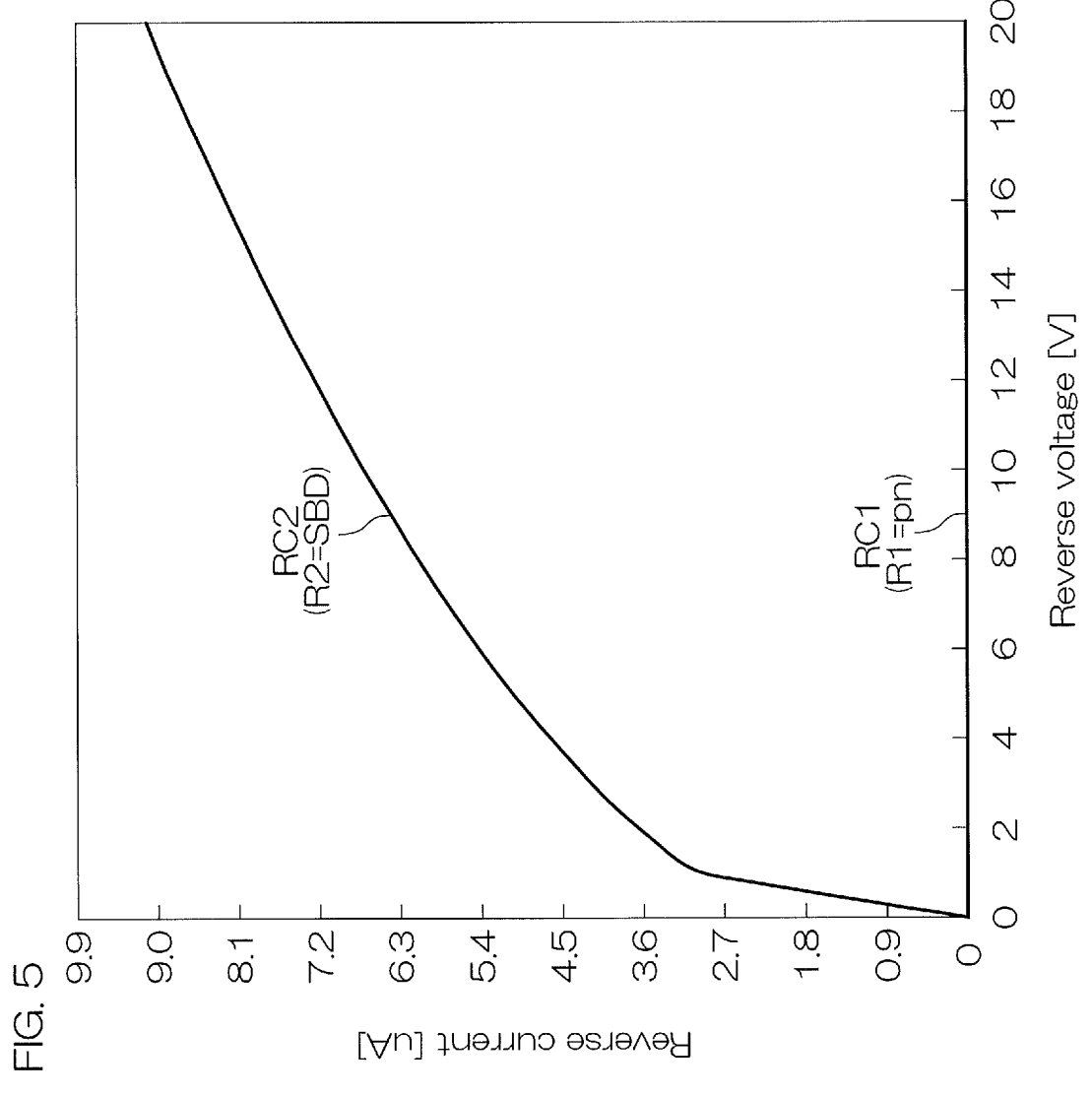
FIG. 5 is a graph showing a reverse characteristic.

FIG. 5 is a graph showing a reverse characteristic. In FIG. 5, the ordinate axis represents the reverse current IR [μA], and the abscissa axis represents the reverse voltage VR [V]. A first reverse characteristic RC1 and a second reverse characteristic RC2 are shown in FIG. 5. The first reverse characteristic RC1 shows the characteristic of the first reference rectifier R1 (pn junction diode) mentioned above. The second reverse characteristic RC2 shows the characteristic of the second reference rectifier R2 (Schottky barrier diode) mentioned above.

Referring to the first reverse characteristic RC1, the reverse current IR of the first reference rectifier R1 was less than 1 μA in a measured voltage range (0 V to 20 V). In other words, the first reference rectifier R1 has a comparatively large power consumption characteristic in the forward characteristic, and has a comparatively small power consumption characteristic in the reverse characteristic.

Referring to the second reverse characteristic RC2, the reverse current IR of the second reference rectifier R2 increases together with an increase in the reverse voltage VR, and becomes larger than the reverse current IR of the first reference rectifier R1. In other words, the second reference rectifier R2 has a power consumption characteristic smaller than the first reference rectifier R1 in the forward characteristic, and has a power consumption characteristic larger than the first reference rectifier R1 in the reverse characteristic.

Figure 6:
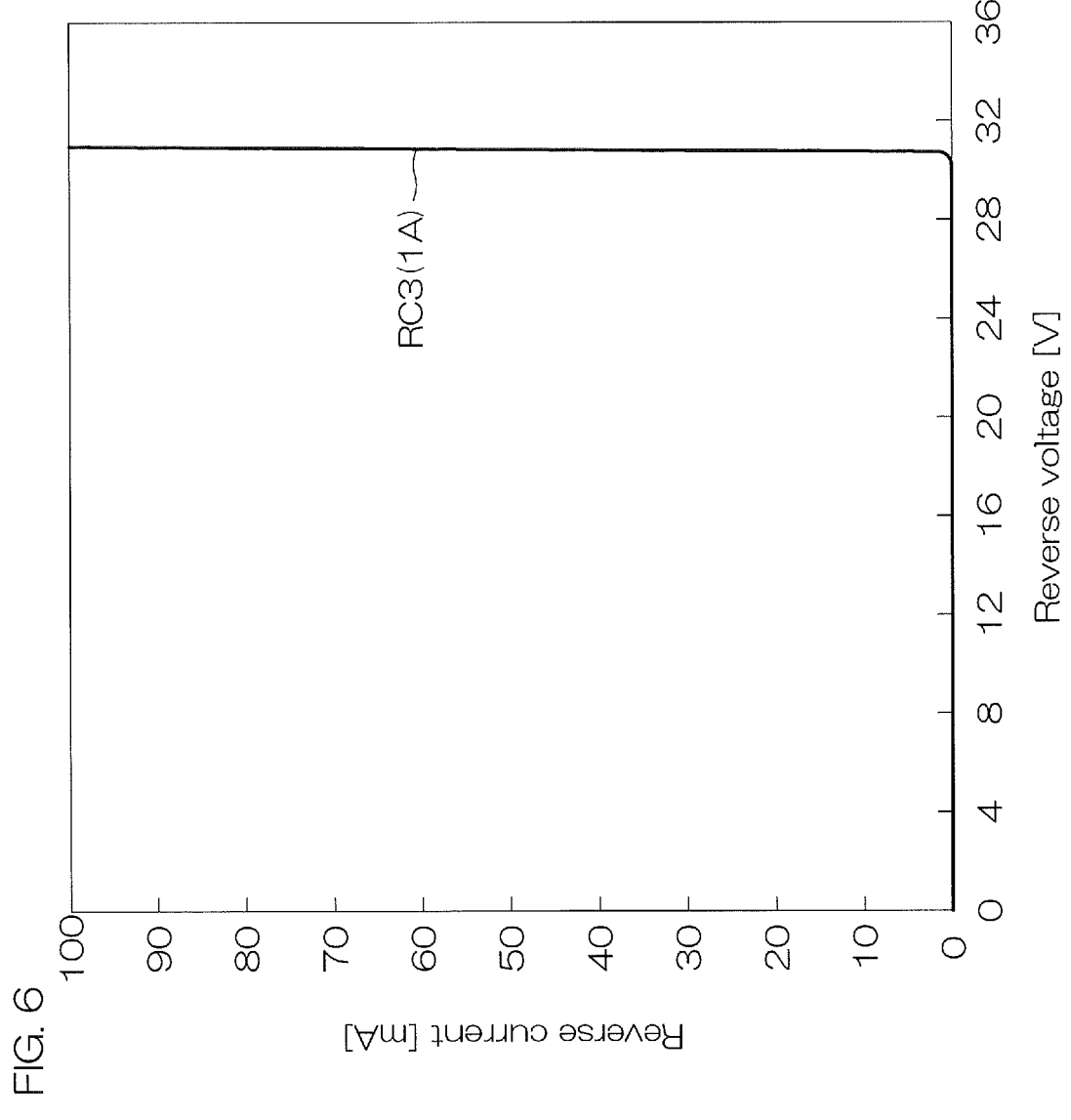
FIG. 6 is a graph showing a reverse characteristic.

FIG. 6 is a graph showing a reverse characteristic. In FIG. 6, the ordinate axis represents the reverse current IR [mA], and the abscissa axis represents the reverse voltage VR [V]. A third reverse characteristic RC3 is shown in FIG. 6. The third reverse characteristic RC3 shows the characteristic of the rectifier 1A.

Referring to the third reverse characteristic RC3, the reverse current IR (leak current) of the rectifier 1A was less than 1 μA in the voltage range (here, equal to or more than 0 V and less than 30 V) less than the first breakdown voltage VB1 of the first diode pair DP1. When the reverse voltage VR becomes equal to or more than the first breakdown voltage VB1 (here, equal to or more than 30 V), the first diode pair DP1 breaks down, and the reverse current IR rapidly rises.

The reverse current IR of the rectifier LA has a characteristic that is substantially equivalent to the characteristic of the reverse current IR of the first reference rectifier R1 in the range less than the first breakdown voltage VB1. In other words, the rectifier LA has a power consumption characteristic smaller than the first reference rectifier R1 in the forward characteristic, and has a power consumption characteristic smaller than the second reference rectifier R2 in the reverse characteristic. Also, the rectifier 1A has a power consumption characteristic smaller than the second reference rectifier R2 in the high current region IFL of the forward characteristic (for example, in a current region equal to or more than 0.5 A).

The rectifier 1A includes the drain/source common field effect type first transistor Tr1 and the drain/source common field effect type second transistor Tr2 as described above. The second transistor Tr2 is diode-connected to the first transistor Tr1 so as to allow the first transistor Tr1 to perform a diode operation, and configures the rectifier stage R with the first transistor Tr1.

This structure makes it possible to provide the rectifier 1A having a novel configuration. In detail, this structure makes it possible to provide the rectifier 1A having electrical properties that cannot be realized by the pn junction diode (first reference rectifier R1) or by the Schottky barrier diode (second reference rectifier R2) (see also FIG. 4, etc.).

The rectifier stage R has the first gate threshold voltage Vgth1 of the first transistor Tr1 as the forward threshold voltage Vth. The rectifier stage R is configured so that the first transistor Tr1 reaches an ON state, and the second transistor Tr2 reaches an OFF state when the forward voltage VF is applied to the first transistor Tr1. The forward current IF flows to the first transistor Tr1, and does not flow to the second transistor Tr2.

The rectifier stage R is configured so that the first transistor Tr1 reaches an OFF state, and the second transistor Tr2 reaches an ON state when the reverse voltage VR is applied to the first transistor Tr1. The reverse current IR flows to the first transistor Tr1, and does not flow to the second transistor Tr2.

The first transistor Tr1 is a p-channel type in this embodiment. The first transistor Tr1 has the first gate G1, the first drain source DS1 that functions as an anode of the rectifier stage R, the second drain source DS2 that functions as a cathode of the rectifier stage R, and the first back gate BG1 electrically connected to the first drain source DS1.

The second transistor Tr2 is provided as a bias circuit with respect to the first transistor Tr1. In detail, the second transistor Tr2 configures a bias circuit that fixes the first gate G1 of the first transistor Tr1 at a zero potential. Preferably, the first gate G1 is fixed at a zero potential both at ON and at OFF of the rectifier stage R.

The second transistor Tr2 is an n-channel type in this embodiment. The second transistor Tr2 has the second gate G2 electrically connected to the second drain source DS2, the third drain source DS3 electrically connected to the first drain source DS1 and to the first back gate BG1, the fourth drain source DS4 electrically connected to the first gate G1, and the second back gate BG2 electrically connected to the first drain source DS1 and to the first back gate BG1. With this configuration, the first gate G1 is fixed at a zero potential both at ON of the rectifier stage R and at OFF of the rectifier stage R.

An anode potential is given to the first drain source DS1, and a cathode potential is given to the second drain source DS2. The first transistor Tr1 reaches an OFF state, and the second transistor Tr2 reaches an ON state when a forward voltage VF is applied between the first drain source DS1 and the second drain source DS2.

In this control state, the forward current IF flows between the first drain source DS1 and the second drain source DS2 through the first transistor Tr1. In detail, the forward current IF flows between the first drain source DS1 and the second drain source DS2 through the first transistor Tr1. In detail, the forward current IF flows between the first drain source DS1 and the second drain source DS2 through the first channel CH1 of the first transistor Tr1.

The first transistor Tr1 reaches an OFF state, and the second transistor Tr2 reaches an ON state when the reverse voltage VR is applied between the first drain source DS1 and the second drain source DS2. In this control state, the reverse current IR flows between the first drain source DS1 and the second drain source DS2 through the first transistor Tr1.

The first transistor Tr1 has the first diode pair DP1 electrically connected to the first drain source DS1 and to the second drain source DS2. The first diode pair DP1 includes the first body diode D1 and the second body diode D2 that are connected together in series with a reverse bias.

The aforementioned reverse current IR flows between the first drain source DS1 and the second drain source DS2 through the first diode pair DP1 of the first transistor Tr1.

The breakdown current serving as the reverse current IR flows between the first drain source DS1 and the second drain source DS2 through the first diode pair DP1 when the reverse voltage VR is equal to or more than the first breakdown voltage VB1 of the first diode pair DP1.

The second transistor Tr2 includes the second diode pair DP2 electrically connected to the third drain source DS3 and to the fourth drain source DS4. The second diode pair DP2 has the third body diode D3 and the fourth body diode D4 that are connected together in series with a reverse bias.

Figure 7:
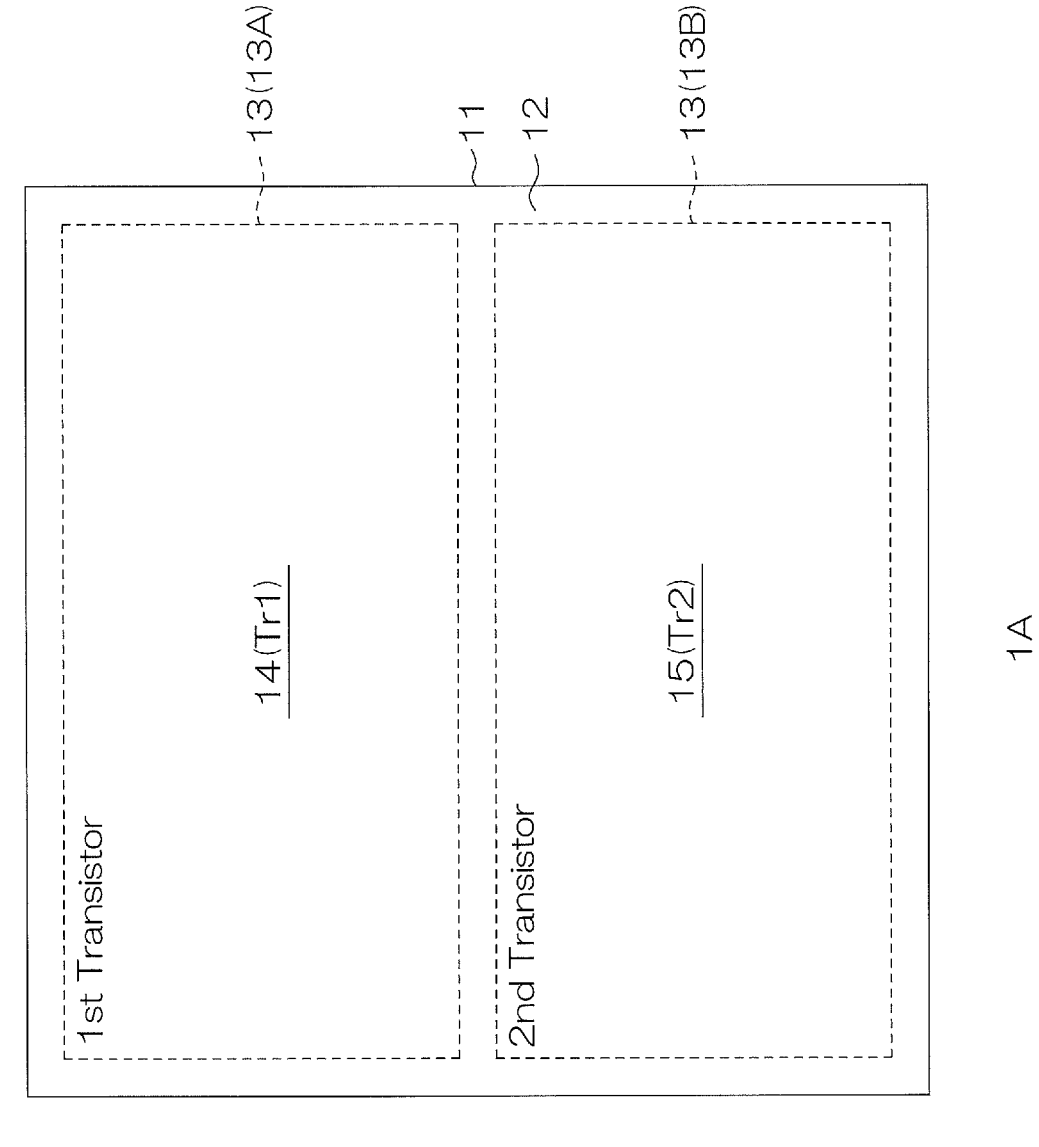
FIG. 7 is a schematic plan view showing a first configuration example of the rectifier shown in FIG. 1.
Figure 8:
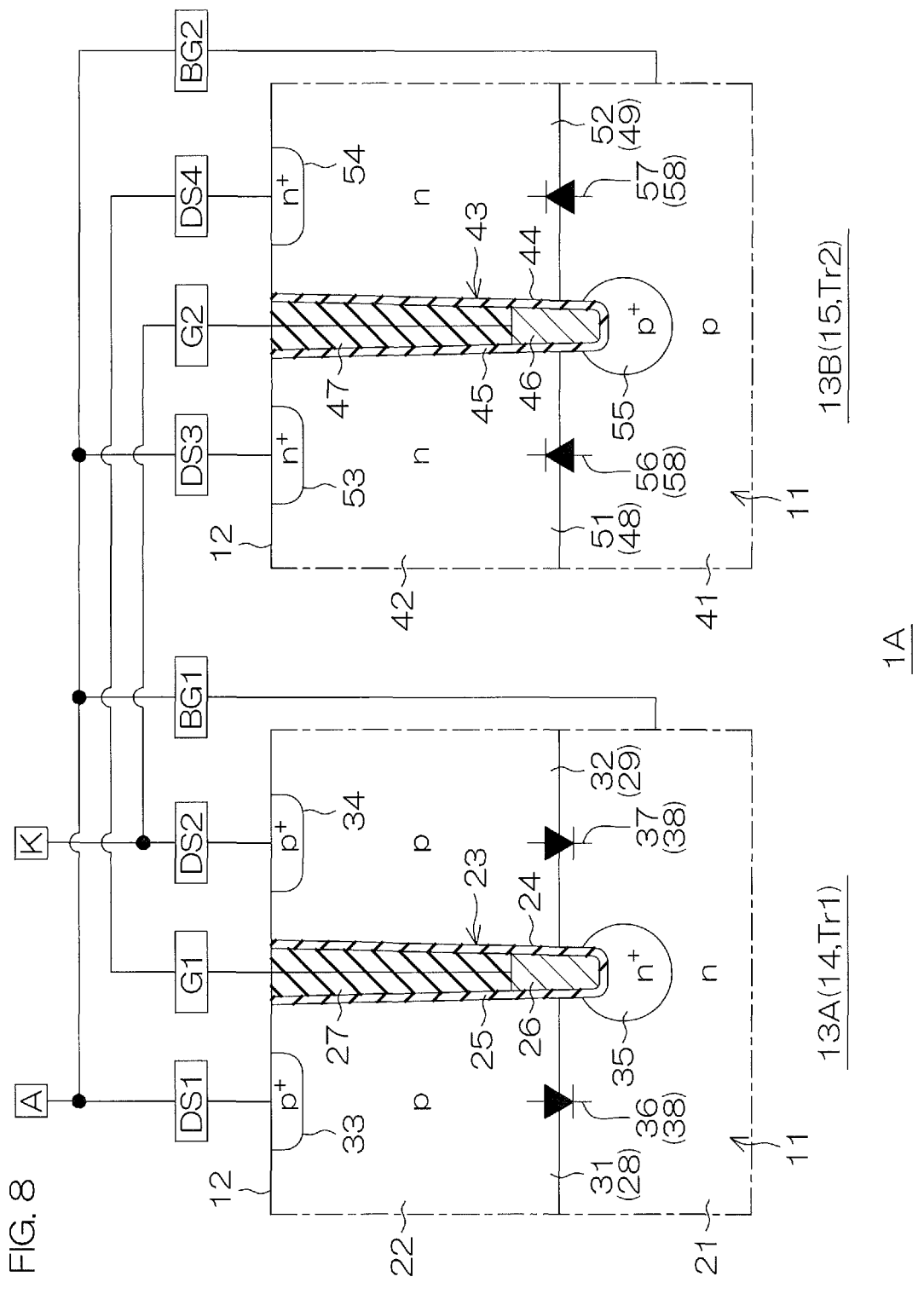
FIG. 8 is a schematic cross-sectional view of the rectifier shown in FIG. 7.

The rectifier 1A may have a configuration shown in FIG. 7 and FIG. 8. FIG. 7 is a schematic plan view showing a first configuration example of the rectifier 1A shown in FIG. 1. FIG. 8 is a schematic cross-sectional view of the rectifier 1A shown in FIG. 7.

The rectifier 1A may have a single chip structure including a chip 11 in which the first transistor Tr1 and the second transistor Tr2 are formed as shown in FIG. 7 and FIG. 8. The chip 11 is formed in a rectangular parallelepiped shape, and has a quadrangular main surface 12. The chip 11 may include an Si monocrystal or a monocrystal of a wide bandgap semiconductor (for example, SiC monocrystal).

The rectifier LA includes at least one circuit region 13 (in this embodiment, a plurality of circuit regions 13) provided at the main surface 12. The circuit regions 13 include a first circuit region 13A and a second circuit region 13B in this embodiment. The first circuit region 13A is provided on one side of the main surface 12, and the second circuit region 13B is provided on the other side of the main surface 12. The second circuit region 13B is electrically separated from the first circuit region 13A.

The rectifier 1A includes the first transistor Tr1 formed in the first circuit region 13A and the second transistor Tr2 formed in the second circuit region 13B. In this embodiment, the first transistor Tr1 includes a p-type transistor structure 14 of the drain/source common field effect type of a p-channel, and the second transistor Tr2 includes an n-type transistor structure 15 of the drain/source common field effect type of an n-channel. A configuration of the p-type transistor structure 14 (=the first transistor Tr1) and a configuration of the n-type transistor structure 15 (=the second transistor Tr2) will be hereinafter described in this order.

Referring to FIG. 8, the p-type transistor structure 14 (first transistor Tr1) has a trench-gate lateral structure. The p-type transistor structure 14 includes an n-type first back gate region 21 formed in a surface layer portion of the main surface 12 in the first circuit region 13A. The first back gate region 21 is formed in a layer shape extending along the main surface 12.

The p-type transistor structure 14 includes a p-type first drift region 22 formed in a region between the main surface 12 and the first back gate region 21 in the surface layer portion of the main surface 12 of the first circuit region 13A. The first drift region 22 is formed in a layer shape extending along the main surface 12 in the region between the main surface 12 and the first back gate region 21, and is exposed from the main surface 12.

The p-type transistor structure 14 includes a plurality of first trench gate structures 23 formed in the main surface 12 of the first circuit region 13A. In FIG. 8, the single first trench gate structure 23 is shown. The first trench gate structures 23 may be each formed in a belt shape extending in a first direction along the main surface 12, and may be arranged at a distance from each other in a second direction that intersects (preferably, perpendicularly intersects) the first direction along the main surface 12. The first trench gate structures 23 pass through the first drift region 22 so as to reach the first back gate region 21 and each have a bottom wall that is placed in the first back gate region 21.

Each of the first trench gate structures 23 includes a first trench 24, a first gate insulating film 25, a first gate electrode 26, and a first insulator 27. The first trench 24 is formed in the main surface 12, and defines a wall surface of the first trench gate structure 23. The first gate insulating film 25 covers a wall surface of the first trench 24.

The first gate electrode 26 is embedded in the first trench 24 with the first gate insulating film 25 between the first gate electrode 26 and the first trench 24. The first gate electrode 26 is embedded in the first trench 24 at a distance from the opening end of the first trench 24 toward the bottom wall side of the first trench 24 in this embodiment. Preferably, the first gate electrode 26 is embedded at a distance from an intermediate portion in the depth direction of the first trench 24 toward the bottom wall side of the first trench 24. The first gate electrode 26 has a thickness that crosses a boundary portion between the first back gate region 21 and the first drift region 22, and faces both the first back gate region 21 and the first drift region 22 across the first gate insulating film 25.

The first insulator 27 is embedded in the first trench 24 with the first gate insulating film 25 between the first insulator 27 and the first trench 24 so as to cover the first gate electrode 26. The first insulator 27 is exposed from the first trench 24, and faces the first drift region 22 across the first gate insulating film 25. The first trench gate structures 23 demarcate a plurality of first mesa regions 28 and a plurality of second mesa regions 29 alternately in the first circuit region 13A.

The p-type transistor structure 14 includes a plurality of p-type first drain source regions 31 formed in the first mesa regions 28. The first drain source regions 31 are regions that integrally include a drain region and a source region. The first drain source regions 31 are formed by use of a part of the first drift region 22 in this embodiment.

The p-type transistor structure 14 includes a plurality of p-type second drain source regions 32 formed in the second mesa regions 29. The second drain source regions 32 are regions that integrally include a drain region and a source region. In this embodiment, the second drain source regions 32 are formed by use of a part of the first drift region 22.

The second drain source regions 32 are formed alternately with the first drain source regions 31 with the single first trench gate structure 23 between the second drain source regions 32 and the first drain source regions 31. When paying attention to the single first trench gate structure 23, the first drain source region 31 is formed in a region (first mesa region 28) on one side with respect to the first trench gate structure 23, and the second drain source region 32 is formed in a region (second mesa region 29) on the other side with respect to the first trench gate structure 23.

The p-type transistor structure 14 includes a plurality of p-type first contact regions 33 formed in a surface layer portion of the first drain source regions 31. The first contact region 33 has a p-type impurity concentration higher than the first drain source region 31. The first contact region 33 faces the first insulator 27 across a part of the first drain source region 31.

The p-type transistor structure 14 includes a plurality of p-type second contact regions 34 formed in a surface layer portion of the second drain source regions 32. The second contact region 34 has a p-type impurity concentration higher than the second drain source region 32. The second contact region 34 faces the first insulator 27 across a part of the second drain source region 32.

The p-type transistor structure 14 includes a plurality of n-type first channel regions 35 respectively formed in regions along a bottom wall of the first trench gate structures 23 in the first back gate region 21. The first channel region 35 has an n-type impurity concentration higher than the first back gate region 21. The first channel region 35 faces the first gate electrode 26 across the first gate insulating film 25.

Preferably, the first channel region 35 is formed at a distance from a bottom portion of the first drain source region 31 and from a bottom portion of the second drain source region 32 toward the bottom wall side of the first trench gate structure 23. Preferably, the first channel region 35 faces both the bottom portion of the first drain source region 31 and the bottom portion of the second drain source region 32 across a part of the first back gate region 21.

The p-type transistor structure 14 includes a first body diode portion 36 formed by a pn junction portion between the first back gate region 21 and the first drain source region 31. The first body diode portion 36 includes an anode formed by the first drain source region 31 and a cathode formed by the first back gate region 21.

The p-type transistor structure 14 includes a second body diode portion 37 formed by a pn junction portion between the first back gate region 21 and the second drain source region 32. The second body diode part 37 includes an anode formed by the second drain source region 32 and a cathode formed by the first back gate region 21. In other words, the cathode of the second body diode part 37 is electrically connected to the cathode of the first body diode portion 36. Hence, a first diode pair portion 38 is formed between the first drain source region 31 and the second drain source region 32.

Referring to FIG. 8, the n-type transistor structure 15 (second transistor Tr2) has a trench-gate lateral structure. The n-type transistor structure 15 includes a p-type second back gate region 41 formed in the surface layer portion of the main surface 12 in the second circuit region 13B. The second back gate region 41 is formed in a layer shape extending along the main surface 12.

The n-type transistor structure 15 includes an n-type second drift region 42 formed in a region between the main surface 12 and the second back gate region 41 in the surface layer portion of the main surface 12 of the second circuit region 13B. The second drift region 42 is formed in a layer shape extending along the main surface 12 through a region between the main surface 12 and the second back gate region 41, and is exposed from the main surface 12.

The n-type transistor structure 15 includes a plurality of second trench gate structures 43 formed in the main surface 12 of the second circuit region 13B. In FIG. 8, the single second trench gate structure 43 is shown. The second trench gate structures 43 may be each formed in a belt shape extending in the first direction along the main surface 12, and may be arranged at a distance from each other in the second direction that intersects (preferably, perpendicularly intersects) the first direction along the main surface 12. The second trench gate structures 43 pass through the second drift region 42 so as to reach the second back gate region 41 and each have a bottom wall that is placed in the second back gate region 41.

Each of the second trench gate structures 43 includes a second trench 44, a second gate insulating film 45, a second gate electrode 46, and a second insulator 47. The second trench 44 is formed in the main surface 12, and defines a wall surface of the second trench gate structure 43. The second gate insulating film 45 covers a wall surface of the second trench 44.

The second gate electrode 46 is embedded in the second trench 44 with the second gate insulating film 45 between the second gate electrode 46 and the second trench 44. The second gate electrode 46 is embedded in the second trench 44 at a distance from the opening end of the second trench 44 toward the bottom wall side of the second trench 44 in this embodiment. Preferably, the second gate electrode 46 is embedded at a distance from an intermediate portion in the depth direction of the second trench 44 toward the bottom wall side of the second trench 44. The second gate electrode 46 has a thickness that crosses a boundary portion between the second back gate region 41 and the second drift region 42, and faces both the second back gate region 41 and the second drift region 42 across the second gate insulating film 45.

The second insulator 47 is embedded in the second trench 44 with the second gate insulating film 45 between the second insulator 47 and the second trench 44 so as to cover the second gate electrode 46. The second insulator 47 is exposed from the second trench 44, and faces the second drift region 42 across the second gate insulating film 45. The second trench gate structures 43 demarcate a plurality of third mesa regions 48 and a plurality of fourth mesa regions 49 alternately at the main surface 12 of the second circuit region 13B.

The n-type transistor structure 15 includes a plurality of n-type third drain source regions 51 formed in the third mesa regions 48. The third drain source regions 51 are regions that integrally include a drain region and a source region. In this embodiment, the third drain source regions 51 are formed by use of a part of the second drift region 42.

The n-type transistor structure 15 includes a plurality of n-type fourth drain source regions 52 formed in the fourth mesa regions 49. The fourth drain source regions 52 are regions that integrally include a drain region and a source region. In this embodiment, the fourth drain source regions 52 are formed by use of a part of the second drift region 42.

The fourth drain source regions 52 are formed alternately with the third drain source regions 51 with the single second trench gate structure 43 between the fourth drain source regions 52 and the third drain source regions 51. When paying attention to the single second trench gate structure 43, the third drain source region 51 is formed in a region (third mesa region 48) on one side with respect to the second trench gate structure 43, and the fourth drain source region 52 is formed in a region (fourth mesa region 49) on the other side with respect to the second trench gate structure 43.

The n-type transistor structure 15 includes a plurality of n-type third contact regions 53 formed in a surface layer portion of the third drain source regions 51. The third contact region 53 has an n-type impurity concentration higher than the third drain source region 51. The third contact region 53 faces the second insulator 47 across a part of the third drain source region 51.

The n-type transistor structure 15 includes a plurality of n-type fourth contact regions 54 formed in a surface layer portion of the fourth drain source regions 52. The fourth contact region 54 has an n-type impurity concentration higher than the fourth drain source region 52. The fourth contact region 54 faces the second insulator 47 across a part of the fourth drain source region 52.

The n-type transistor structure 15 includes a plurality of p-type second channel regions 55 respectively formed in regions along a bottom wall of the second trench gate structures 43 in the second back gate region 41. The second channel region 55 has a p-type impurity concentration higher than the second back gate region 41. The second channel region 55 faces the second gate electrode 46 across the second gate insulating film 45.

Preferably, the second channel region 55 is formed at a distance from a bottom portion of the third drain source region 51 and from a bottom portion of the fourth drain source region 52 toward the bottom wall side of the second trench gate structure 43. Preferably, the second channel region 55 faces both the bottom portion of the third drain source region 51 and the bottom portion of the fourth drain source region 52 across a part of the second back gate region 41.

The n-type transistor structure 15 includes a third body diode portion 56 formed by a pn junction portion between the second back gate region 41 and the third drain source region 51. The third body diode portion 56 includes an anode formed by the second back gate region 41 and a cathode formed by the third drain source region 51.

The n-type transistor structure 15 includes a fourth body diode portion 57 formed by a pn junction portion between the second back gate region 41 and the fourth drain source region 52. The fourth body diode portion 57 includes an anode formed by the second back gate region 41 and a cathode formed by the fourth drain source region 52. In other words, the anode of the fourth body diode portion 57 is electrically connected to the anode of the third body diode portion 56. Hence, a second diode pair portion 58 is formed between the third drain source region 51 and the fourth drain source region 52.

As thus described, in the rectifier LA according to the first configuration example, the p-type transistor structure 14 serving as the first transistor Tr1 is formed in the first circuit region 13A, and the n-type transistor structure 15 serving as the second transistor Tr2 is formed in the second circuit region 13B.

The first gate G1, the first drain source DS1, the second drain source DS2, the first back gate BG1, the first channel CH1, and the first diode pair DP1 of the first transistor Tr1 are configured by the first trench gate structure 23, the first drain source region 31 (first contact region 33), the second drain source region 32 (second contact region 34), the first back gate region 21, the first channel region 35 (part of the first back gate region 21), and the first diode pair portion 38 of the p-type transistor structure 14, respectively.

The second gate G2, the third drain source DS3, the fourth drain source DS4, the second back gate BG2, the second channel CH2, and the second diode pair DP2 of the second transistor Tr2 are configured by the second trench gate structure 43, the third drain source region 51 (third contact region 53), the fourth drain source region 52 (fourth contact region 54), the second back gate region 41, the second channel region 55 (part of the second back gate region 41), and the second diode pair portion 58 of the n-type transistor structure 15, respectively.

The n-type transistor structure 15 is diode-connected to the p-type transistor structure 14 so that the p-type transistor structure 14 performs a diode operation. In detail, the second trench gate structure 43 is electrically connected to the second drain source region 32. Also, the third drain source region 51 is electrically connected to the first drain source region 31 and to the first back gate region 21. Also, the fourth drain source region 52 is electrically connected to the first trench gate structure 23. Also, the second back gate region 41 is electrically connected to the first drain source region 31 and to the first back gate region 21.

The first back gate region 21 is electrically connected to the first drain source region 31 on the p-type transistor structure 14 side, and the second back gate region 41 is electrically connected to the third drain source region 51 on the n-type transistor structure 15 side. The rectifier stage R including the p-type transistor structure 14 (first transistor Tr1) and the n-type transistor structure 15 (second transistor Tr2) is thus configured in the single chip 11.

The thus formed electrical connection may be realized by forming a multilayer wiring structure on the main surface 12. In this case, the multilayer wiring structure includes a plurality of insulating films stacked on the main surface 12 and a plurality of wirings stacked and arranged in a multi-stage manner through a via electrode on the insulating films. In this case, the anode end A may be arranged on the multilayer wiring structure as an anode terminal. Also, the cathode end K may be arranged on the multilayer wiring structure as a cathode terminal. In other words, the rectifier 1A may be configured as a two-terminal device.

Figure 9:
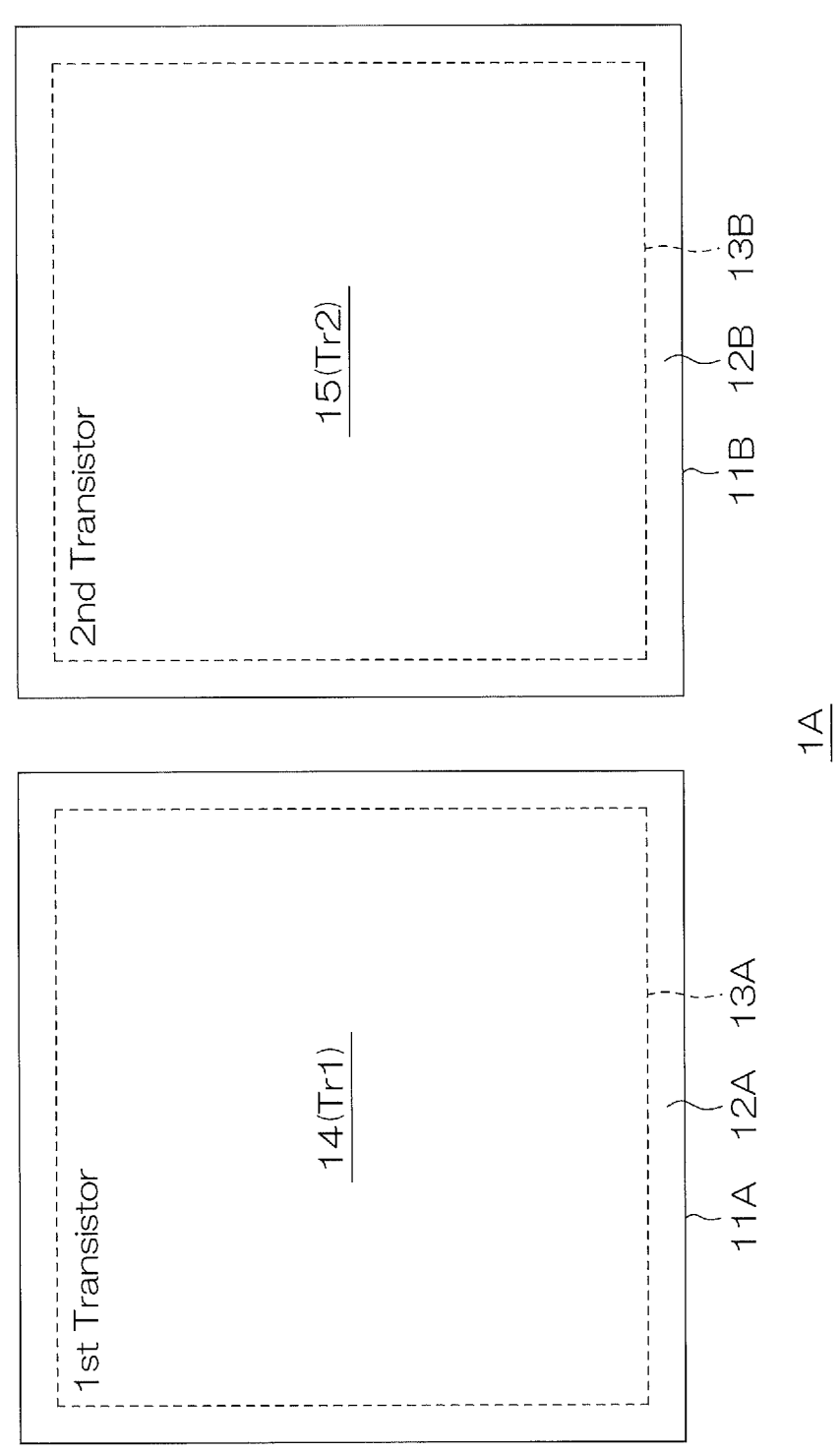
FIG. 9 is a schematic plan view showing a second configuration example of the rectifier shown in FIG. 1.
Figure 10:
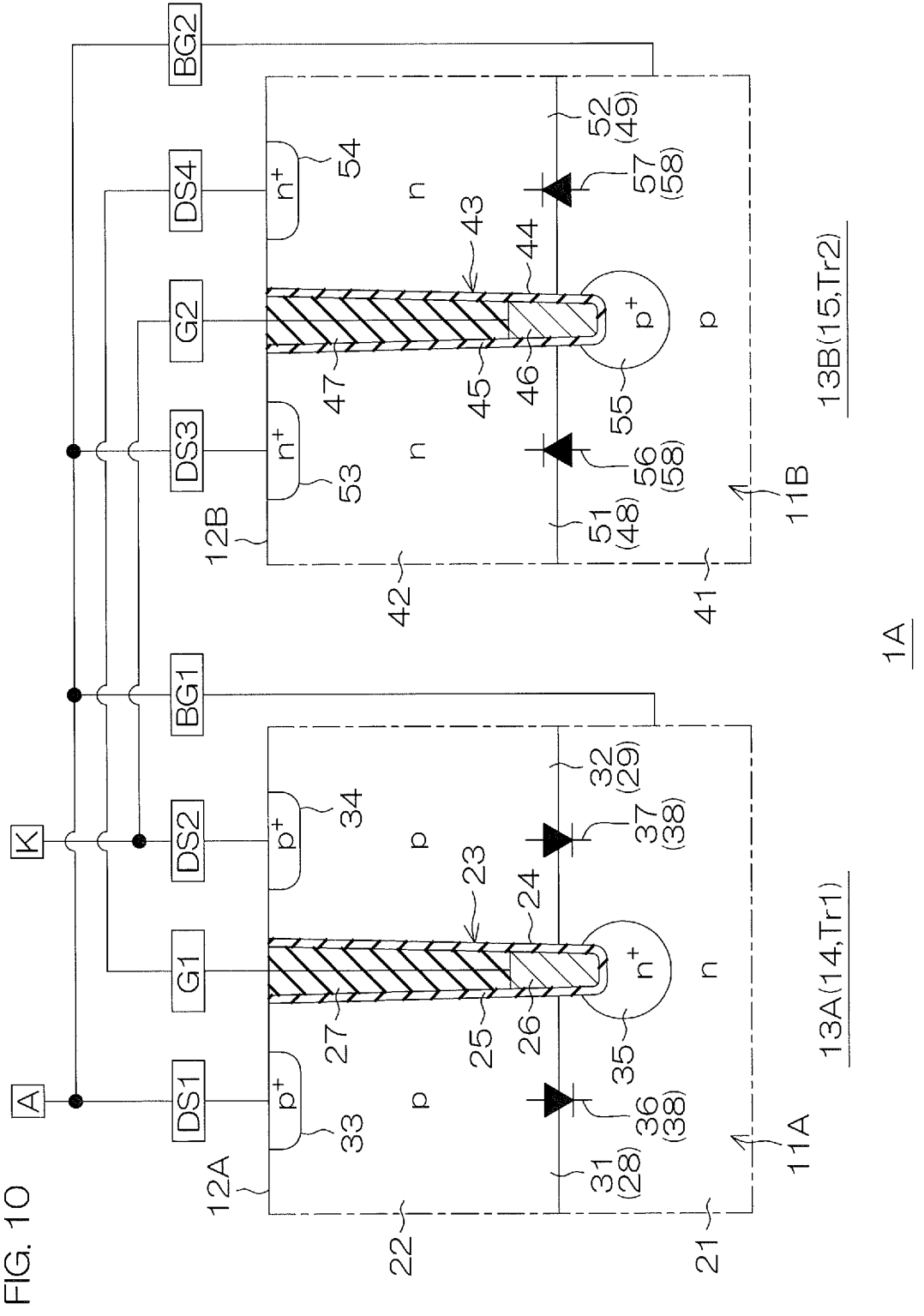
FIG. 10 is a schematic cross-sectional view of the rectifier shown in FIG. 9.

The rectifier 1A may have a configuration shown in FIG. 9 and FIG. 10. FIG. 9 is a schematic plan view showing a second configuration example of the rectifier 1A shown in FIG. 1. FIG. 10 is a schematic cross-sectional view of the rectifier 1A shown in FIG. 9. As shown in FIG. 9 and FIG. 10, the rectifier LA may have a composite chip structure including a first chip 11A in which the first transistor Tr1 is formed and a second chip 11B in which the second transistor Tr2 is formed.

The first chip 11A is formed in a rectangular parallelepiped shape, and has a quadrangular first main surface 12A. The first chip 11A may include an Si monocrystal or a monocrystal of a wide bandgap semiconductor (for example, SiC monocrystal). The rectifier LA includes the first circuit region 13A provided at the first main surface 12A and the first transistor Tr1 formed in the first main surface 12A in the first circuit region 13A. In this embodiment, the first transistor Tr1 includes the p-type transistor structure 14.

The p-type transistor structure 14 includes the n-type first back gate region 21, the p-type first drift region 22, the first trench gate structures 23, the p-type first drain source regions 31, the p-type second drain source regions 32, the p-type first contact regions 33, the p-type second contact regions 34, the n-type first channel regions 35, and the first diode pair portion 38 in the same way as in the case of the first configuration example.

The second chip 11B is formed in a rectangular parallelepiped shape, and has a quadrangular second principal surface 12B. The second chip 11B may include an Si monocrystal or a monocrystal of a wide bandgap semiconductor (for example, SiC monocrystal). The rectifier LA includes the second circuit region 13B provided at the second main surface 12B and the second transistor Tr2 formed in the second main surface 12B in the second circuit region 13B. In this embodiment, the second transistor Tr2 includes the n-type transistor structure 15.

The n-type transistor structure 15 includes the p-type second back gate region 41, the n-type second drift region 42, the second trench gate structures 43, the n-type third drain source regions 51, the n-type fourth drain source regions 52, the n-type third contact regions 53, the n-type fourth contact regions 54, the p-type second channel regions 55, and the second diode pair portion 58 in the same way as in the case of the first configuration example.

The electrical connection mode of the n-type transistor structure 15 with respect to the p-type transistor structure 14 is the same as in the case of the first configuration example. The thus formed electrical connection may be realized by a plurality of wirings formed on a mount board, such as PCB (Printed Circuit Board). In this case, the anode end A and the cathode end K may be formed by the wirings on the mount board.

Of course, the thus formed electrical connection may be realized by devising a connection mode of a plurality of bonding wires, lead terminals, and the like in a package in which the first chip 11A and the second chip 11B have been mounted. In this case, the anode end A and the cathode end K may be formed by lead terminals arranged in the package.

Figure 11:
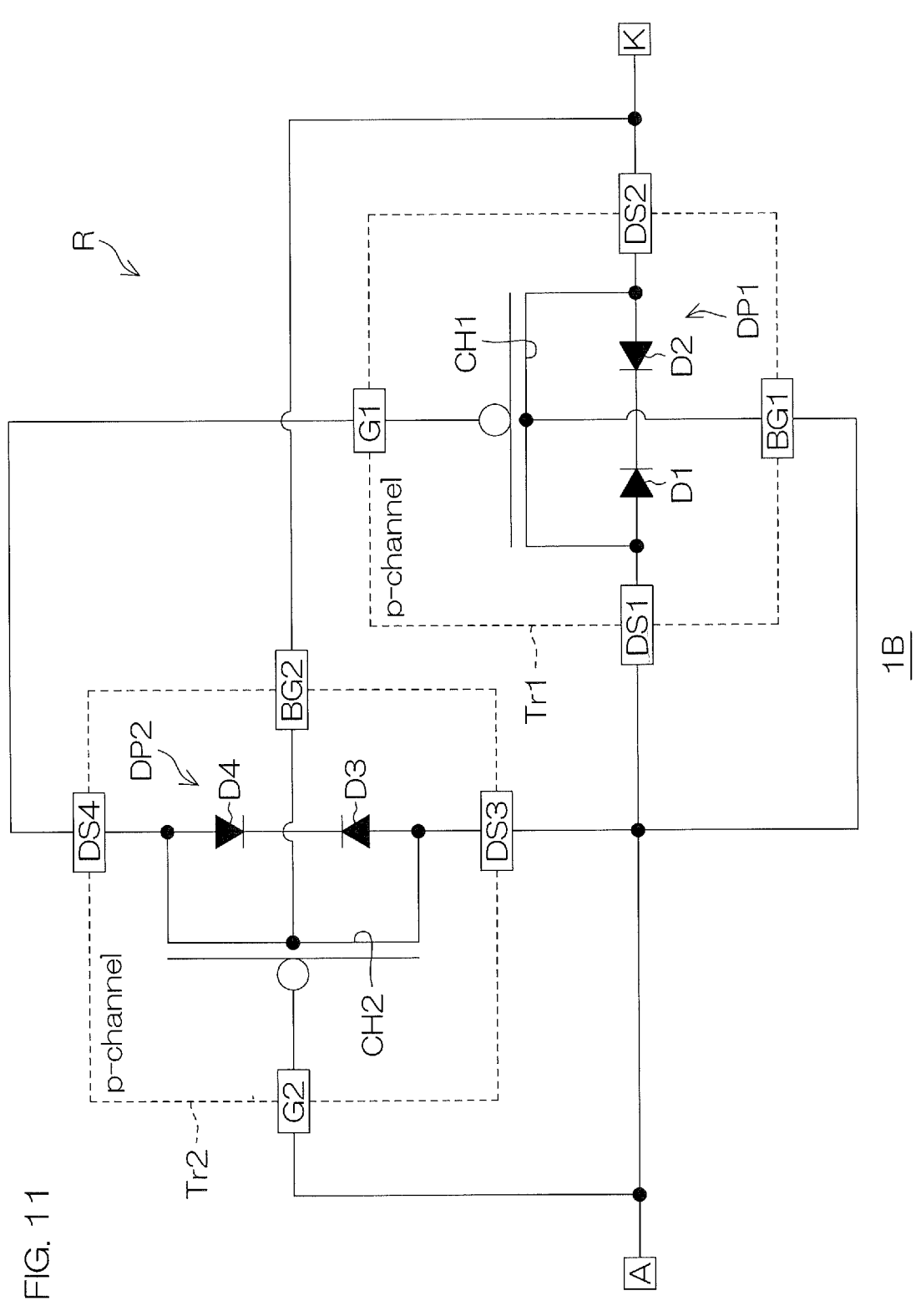
FIG. 11 is a circuit diagram showing an electrical configuration of a rectifier according to a second embodiment.

FIG. 11 is a circuit diagram showing an electrical configuration of a rectifier 1B according to a second embodiment. Referring to FIG. 11, the rectifier 1B has a form in which the rectifier LA has been modified (see FIG. 2). In detail, the rectifier 1B includes the second transistor Tr2 of a drain/source common field effect type of a p-channel instead of the second transistor Tr2 of the drain/source common field effect type of the n-channel.

The second transistor Tr2 may be an Si transistor formed in an Si monocrystal, or may be a wide bandgap semiconductor transistor formed in a monocrystal of a wide bandgap semiconductor. The second transistor Tr2 may be an SiC transistor formed in an SiC monocrystal as an example of the wide bandgap semiconductor.

The second transistor Tr2 has the second gate G2, the third drain source DS3, the fourth drain source DS4, the second back gate BG2, and the second diode pair DP2. Each of the third drain source DS3 and the fourth drain source DS4 integrally includes a source and a drain.

The second diode pair DP2 includes the third body diode D3 and the fourth body diode D4 that are reverse bias connected so as to be a cathode common, and is electrically connected to the third drain source DS3 and to the fourth drain source DS4. The third body diode D3 is a pn junction diode, and the fourth body diode D4 is a pn junction diode.

The third body diode D3 includes an anode that is electrically connected to the third drain source DS3 and a cathode that forms a node with respect to the fourth body diode D4. The fourth body diode D4 includes an anode that is electrically connected to the fourth drain source DS4 and a cathode that is electrically connected to the cathode of the third body diode D3. The second transistor Tr2 has the aforementioned second gate threshold voltage Vgth2, the aforementioned second breakdown voltage VB2, and the aforementioned second on-resistance Ron2.

The rectifier stage R is configured by allowing the second transistor Tr2 to be diode-connected to the first transistor Tr1 so that the first transistor Tr1 performs a diode operation. In detail, the second transistor Tr2 is provided as a bias circuit that enables the first transistor Tr1 to perform a diode operation by means of a bias voltage, hence configuring the rectifier stage R together with the first transistor Tr1.

In more detail, the second gate G2 is electrically connected to the first drain source DS1 and to the first back gate BG1, the third drain source DS3 is electrically connected to the first drain source DS1 and to the first back gate BG1, the fourth drain source DS4 is electrically connected to the first gate G1, and the second back gate BG2 is electrically connected to the second drain source DS2.

In other words, the first back gate BG1 is electrically connected to the first drain source DS1 on the first transistor Tr1 side, and the third drain source DS3 is electrically connected to the second gate G2 on the second transistor Tr2 side. Hence, the first drain source DS1, the first back gate BG1, the second gate G2, and the third drain source DS3 are fixed at the same potential. Also, the first gate G1 and the fourth drain source DS4 are fixed at the same potential. Also, the second drain source DS2 and the second back gate BG2 are fixed at the same potential.

The fourth drain source DS4 configures a short circuit with the first gate G1, and does not form a voltage drop between the first gate G1 and the fourth drain source DS4. In other words, the first gate G1 and the fourth drain source DS4 are fixed at a zero potential (same potential). The first gate G1 and the fourth drain source DS4 are fixed at a zero potential both at ON and at OFF of the rectifier stage R (the first transistor Tr1).

Figure 12A:
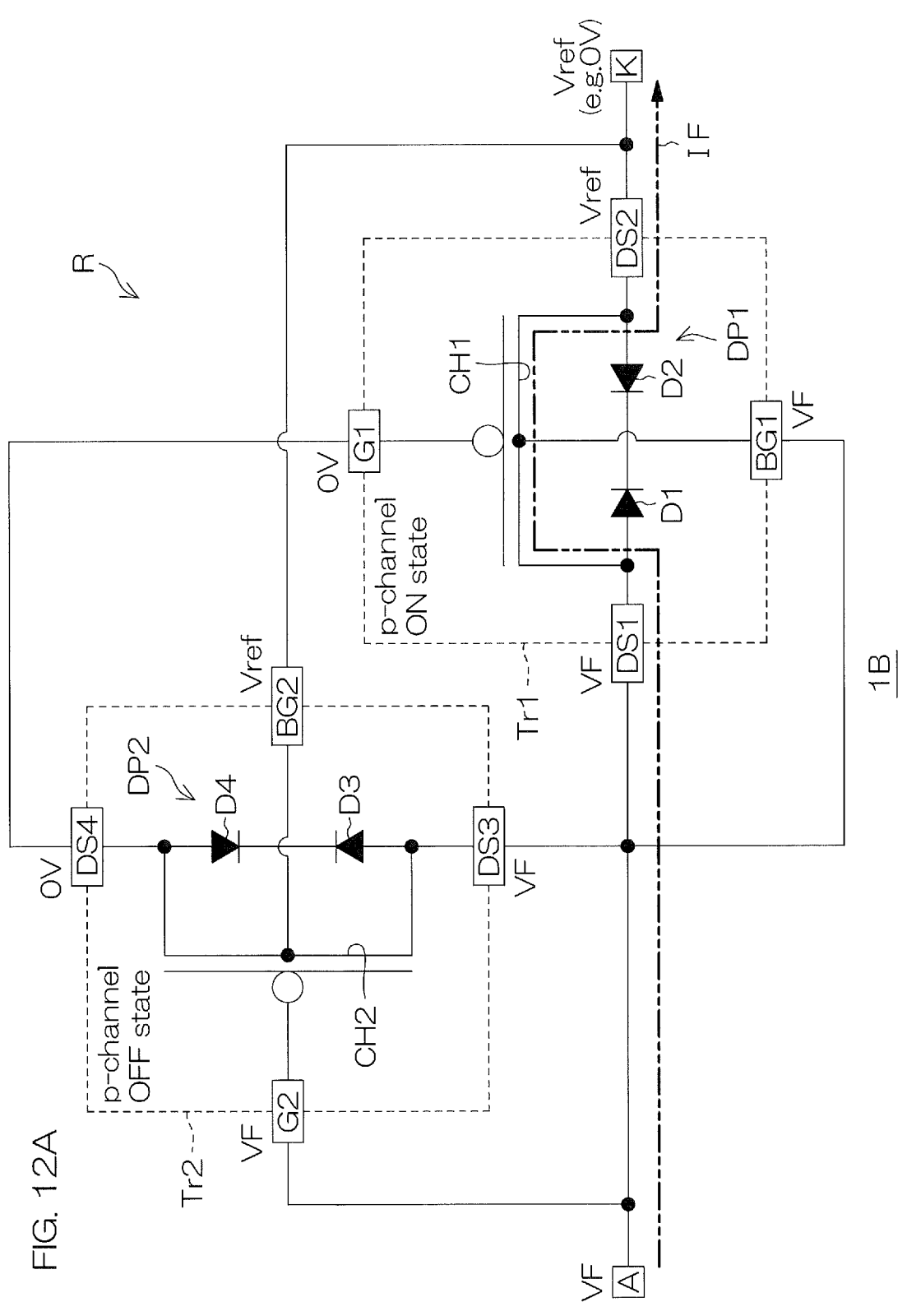
FIG. 12A is a circuit diagram showing a forward operation of the rectifier shown in FIG. 11.
Figure 12B:
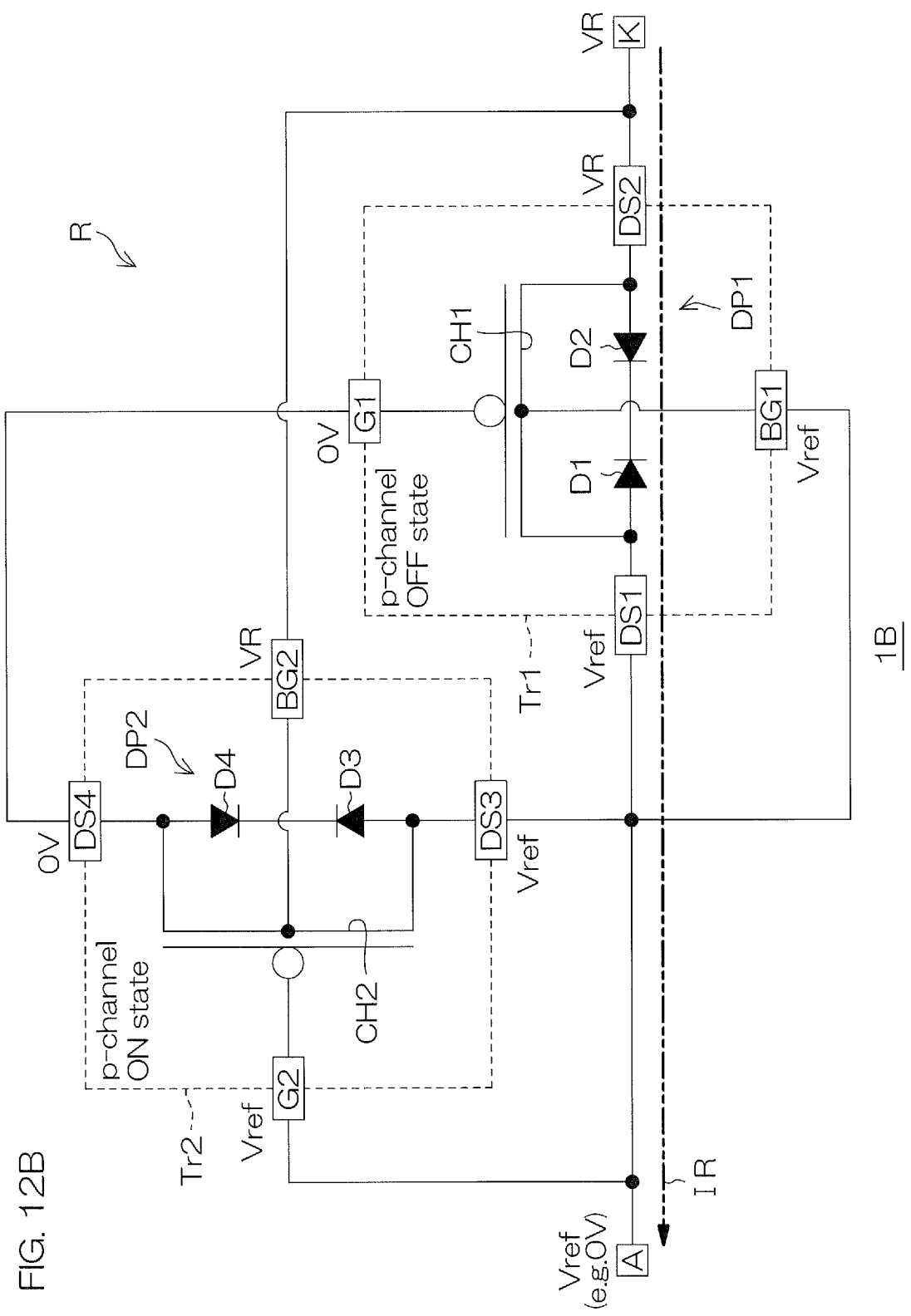
FIG. 12B is a circuit diagram showing a reverse operation of the rectifier shown in FIG. 11.

FIG. 12A is a circuit diagram showing a forward operation of the rectifier 1B shown in FIG. 7. FIG. 12B is a circuit diagram showing a reverse operation of the rectifier 1B shown in FIG. 7. Referring to FIG. 12A and FIG. 12B, the forward current IF flows to the first transistor Tr1 in the forward operation, and the reverse current IR flows to the first transistor Tr1 in the reverse operation.

In detail, in the forward operation, a forward potential VF based on the second drain source DS2 is applied to the first drain source DS1, and the forward current IF flows from the first drain source DS1 toward the second drain source DS2 with reference to FIG. 12A. In FIG. 12A, a circuit operation is shown when a reference potential Vref (for example, ground potential) is applied to the second drain source DS2 and when the forward potential VF is applied to the first drain source DS1.

In the forward operation, the first drain source DS1, the first back gate BG1, the second gate G2, and the third drain source DS3 are fixed at the forward potential VF. The second drain source DS2 and the second back gate BG2 are fixed at the reference potential Vref. The first gate G1 and the fourth drain source DS4 are fixed at a zero potential without forming a voltage drop.

In the first transistor Tr1, the first gate G1 is fixed at a zero potential, and the first back gate BG1 is fixed at the forward potential VF. Therefore, the first transistor Tr1 reaches an OFF state when the forward voltage VF is less than the first gate threshold voltage Vgth1 of the first gate G1, and the first transistor Tr1 reaches an ON state when the forward voltage VF is equal to or more than the first gate threshold voltage Vgth1. When the first transistor Tr1 reaches an ON state, the forward current IF flows from the first drain source DS1 toward the second drain source DS2 through the first channel CH1 of the first transistor Tr1.

In the second transistor Tr2, the second gate G2 is fixed at the forward potential VF, and the second back gate BG2 is fixed at the reference potential Vref. Therefore, the second transistor Tr2 reaches an OFF state. The second transistor Tr2 does not form a current path between the first drain source DS1 and the second drain source DS2, and therefore the forward current IF does not flow through the second transistor Tr2.

Thus, in the forward operation, the first transistor Tr1 is controlled to be an ON state, and the second transistor Tr2 is controlled to be an OFF state by means of a bias effect caused by the second transistor Tr2. In this state, the forward current IF flows between the first drain source DS1 and the second drain source DS2 through the first channel CH1 of the first transistor Tr1.

In other words, the first transistor Tr1 has the first gate threshold voltage Vgth1 that serves as the forward threshold voltage Vth of the rectifier stage R. Also, the first transistor Tr1 passes a drain-source current that serves as the forward current IF of the rectifier stage R. In other words, the characteristic of the forward current IF coincides with the characteristic of the drain-source current of the first transistor Tr1.

Referring to FIG. 12B, in the reverse operation, the reverse potential VR based on the first drain source DS1 is applied to the second drain source DS2, and the reverse current IR flows from the second drain source DS2 toward the first drain source DS1. In FIG. 12B, a circuit operation is shown when the reference potential Vref (for example, ground potential) is applied to the first drain source DS1 and when the reverse potential VR is applied to the second drain source DS2.

In the reverse operation, the first drain source DS1, the first back gate BG1, the second gate G2, and the third drain source DS3 are fixed at the reference potential Vref. The second drain source DS2 and the second back gate BG2 are fixed at the reverse potential VR. The first gate G1 and the fourth drain source DS4 are fixed at a zero potential without forming a voltage drop.

In the first transistor Tr1, the first gate G1 is fixed at a zero potential, and the first back gate BG1 is fixed at the reference potential Vref (zero potential). Therefore, the first transistor Tr1 reaches an OFF state. When the reverse voltage VR is less than the first breakdown voltage VB1, a leak current serving as the reverse current IR flows between the first drain source DS1 and the second drain source DS2.

When the reverse voltage VR is equal to or more than the first breakdown voltage VB1, the first diode pair DP1 breaks down, and a breakdown current serving as the reverse current IR flows between the first drain source DS1 and the second drain source DS2. Both the characteristic of the leak current and the characteristic of the breakdown current depend on the characteristic of the first diode pair DP1.

In the second transistor Tr2, the second gate G2 is fixed at the reference potential Vref, and the second back gate BG2 is fixed at the reverse potential VR. Therefore, the second transistor Tr2 reaches an OFF state when the reverse voltage VR is less than the second gate threshold voltage Vgth2, and the second transistor Tr2 reaches an ON state when the reverse voltage VR is equal to or more than the second gate threshold voltage Vgth2.

The second gate threshold voltage Vgth2 is less than the first breakdown voltage VB1. Therefore, the second transistor Tr2 reaches an ON state before the first diode pair DP1 breaks down. The second transistor Tr2 does not form a current path between the first drain source DS1 and the second drain source DS2, and therefore the reverse current IR does not flow through the second transistor Tr2.

Thus, in the reverse operation, the first transistor Tr1 is controlled to be an OFF state, and the second transistor Tr2 is controlled to be an ON state by means of a bias effect caused by the second transistor Tr2. In this state, the reverse current IR flows between the first drain source DS1 and the second drain source DS2 through the first diode pair DP1.

In other words, the characteristic of the reverse current IR coincides with the characteristic of the first diode pair DP1. The withstand voltage of the rectifier stage R with respect to the reverse voltage VR is limited to a lower withstand voltage between the withstand voltage of the first diode pair DP1 (the first breakdown voltage VB1) and the gate withstand voltage of the second transistor Tr2 (the gate dielectric breakdown resistance).

The rectifier 1B includes the drain/source common field effect type first transistor Tr1 and the drain/source common field effect type second transistor Tr2 as described above. The second transistor Tr2 is diode-connected to the first transistor Tr1 so as to allow the first transistor Tr1 to perform a diode operation, and configures the rectifier stage R with the first transistor Tr1.

The first transistor Tr1 is a p-channel type in this embodiment. The second transistor Tr2 is a p-channel type in this embodiment. This structure makes it possible to provide the rectifier 1B having a novel configuration in the same way as the rectifier 1A. In detail, this structure makes it possible to provide the rectifier 1B having electrical properties that cannot be realized by the pn junction diode (first reference rectifier R1) or by the Schottky barrier diode (second reference rectifier R2) (see also FIG. 4, etc.).

Figure 13:
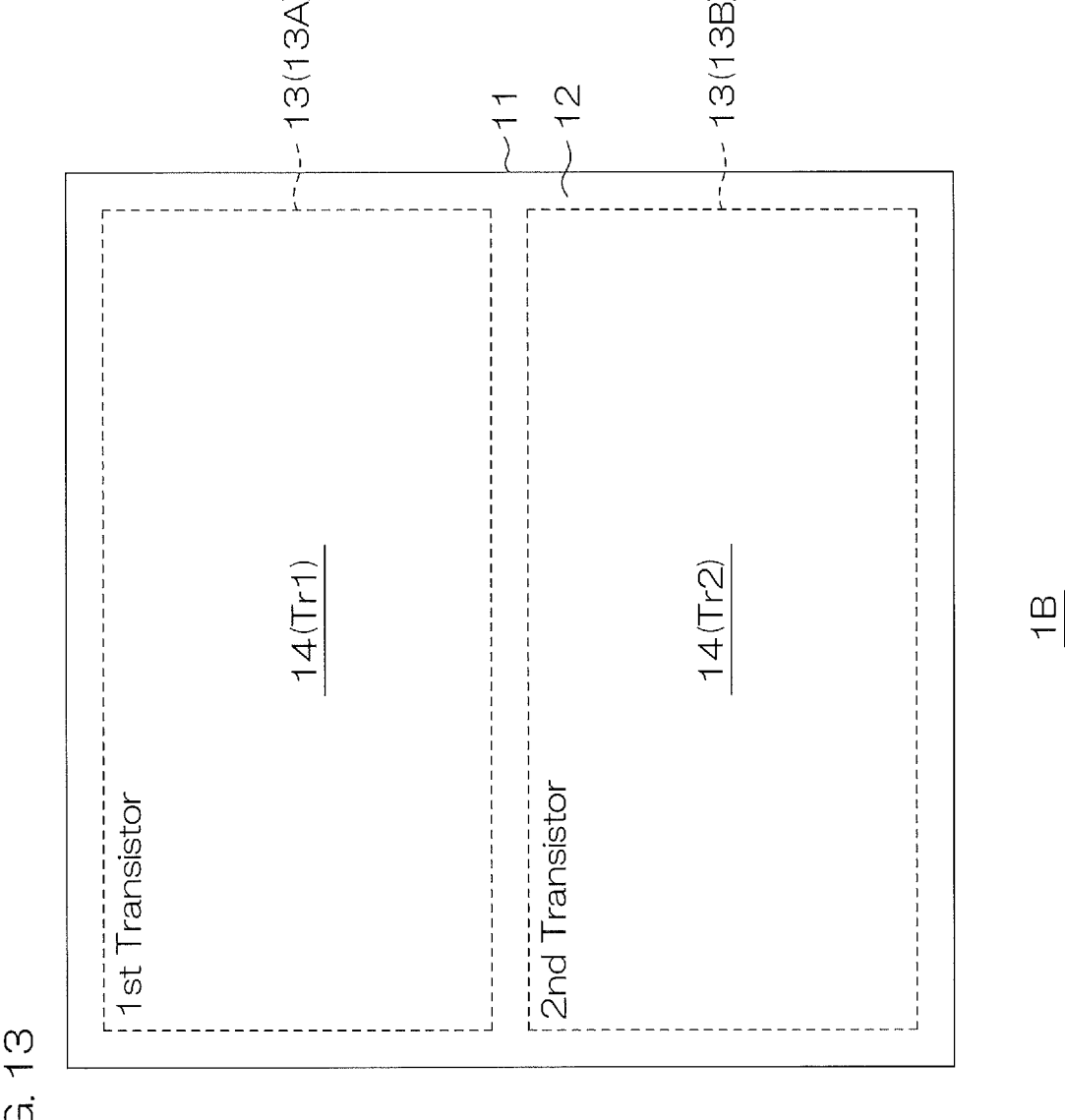
FIG. 13 is a schematic plan view showing a first configuration example of the rectifier shown in FIG. 11.
Figure 14:
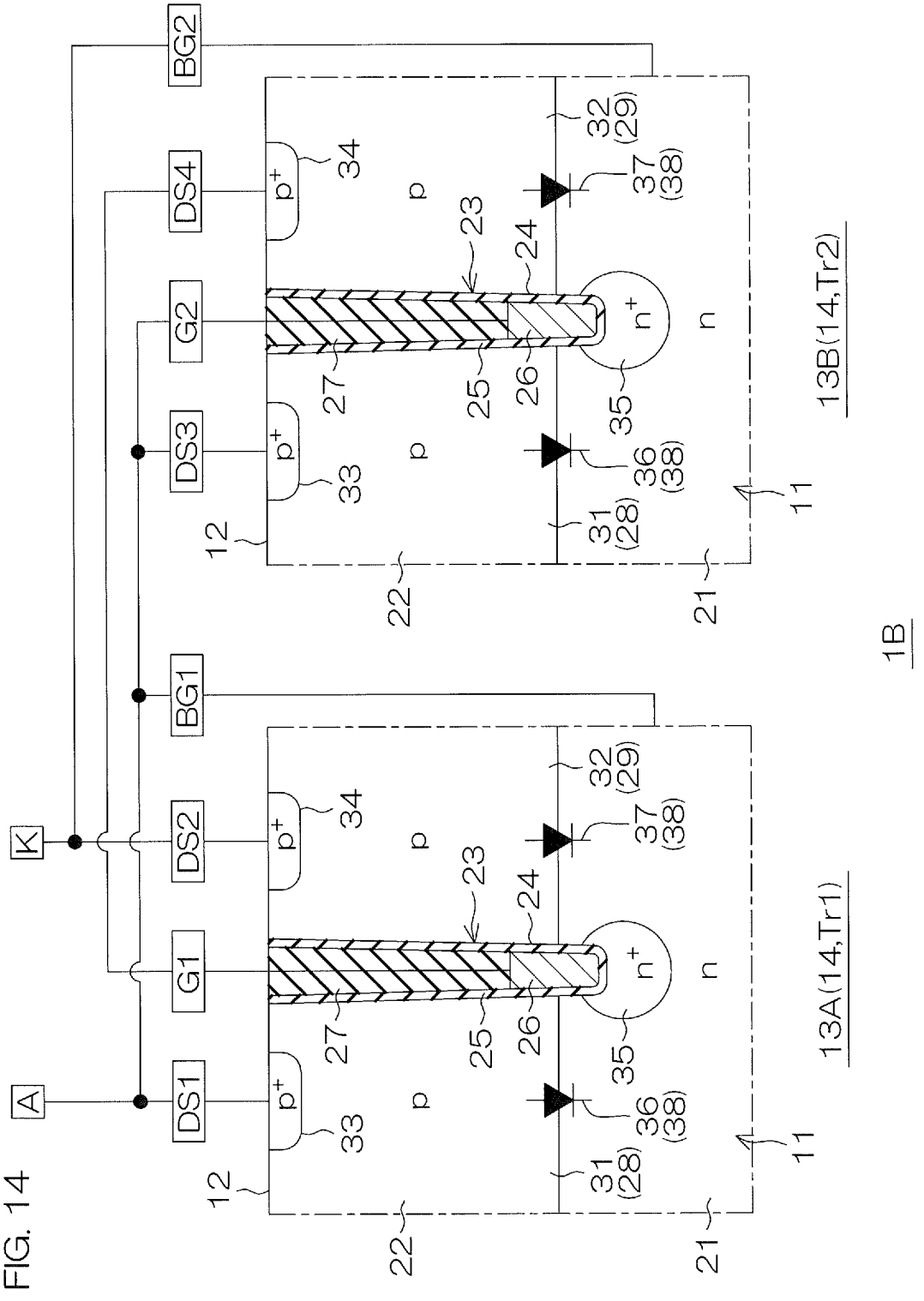
FIG. 14 is a schematic cross-sectional view of the rectifier shown in FIG. 13.

The rectifier 1B may have a configuration shown in FIG. 13 and FIG. 14. FIG. 13 is a schematic plan view showing a first configuration example of the rectifier 1B shown in FIG. 11. FIG. 14 is a schematic cross-sectional view of the rectifier 1B shown in FIG. 13. As shown in FIG. 13 and FIG. 14, the rectifier 1B may have a single chip structure including the chip 11 in which the first transistor Tr1 and the second transistor Tr2 are formed in the same way as the rectifier 1A according to the first configuration example (see FIG. 7 and FIG. 8).

In the rectifier 1B according to the first configuration example, the p-type transistor structure 14 serving as the first transistor Tr1 is formed in the first circuit region 13A, and the p-type transistor structure 14 serving as the second transistor Tr2 is formed in the second circuit region 13B.

The first gate G1, the first drain source DS1, the second drain source DS2, the first back gate BG1, the first channel CH1, and the first diode pair DP1 of the first transistor Tr1 are configured by the first trench gate structure 23, the first drain source region 31 (first contact region 33), the second drain source region 32 (second contact region 34), the first back gate region 21, the first channel region 35 (part of the first back gate region 21), and the first diode pair portion 38 of the p-type transistor structure 14, respectively.

The second gate G2, the third drain source DS3, the fourth drain source DS4, the second back gate BG2, the second channel CH2, and the second diode pair DP2 of the second transistor Tr2 are configured by the first trench gate structure 23, the first drain source region 31 (first contact region 33), the second drain source region 32 (second contact region 34), the first back gate region 21, the first channel region 35 (part of the first back gate region 21), and the first diode pair portion 38 of the p-type transistor structure 14, respectively.

The p-type transistor structure 14 on the second circuit region 13B side is diode-connected to the p-type transistor structure 14 on the first circuit region 13A side so that the p-type transistor structure 14 on the first circuit region 13A side performs a diode operation. In detail, the first trench gate structure 23 on the second circuit region 13B side is electrically connected to the first drain source region 31 and the first back gate region 21 both of which are on the first circuit region 13A side.

Also, the first drain source region 31 on the second circuit region 13B side is electrically connected to the first drain source region 31 and the first back gate region 21 both of which are on the first circuit region 13A side. Also, the second drain source region 32 on the second circuit region 13B side is electrically connected to the first trench gate structure 23 on the first circuit region 13A side. Also, the first back gate region 21 on the second circuit region 13B side is electrically connected to the second drain source region 32 on the first circuit region 13A side.

In other words, on the first circuit region 13A side, the first back gate region 21 is electrically connected to the first drain source region 31, whereas on the second circuit region 13B side, the first drain source region 31 is electrically connected to the first trench gate structure 23. The rectifier stage R including the p-type transistor structure 14 (first transistor

24

Tr1) and the p-type transistor structure 14 (second transistor Tr2) is thus configured in the single chip 11.

The thus formed electrical connection may be realized by forming a multilayer wiring structure on the main surface 12. In this case, the multilayer wiring structure includes a plurality of insulating films stacked on the main surface 12 and a plurality of wirings stacked and arranged in a multistage manner through a via electrode on the insulating films. In this case, the anode end A may be arranged on the multilayer wiring structure as an anode terminal. Also, the cathode end K may be arranged on the multilayer wiring structure as a cathode terminal. In other words, the rectifier 1B may be configured as a two-terminal device.

Figure 15:
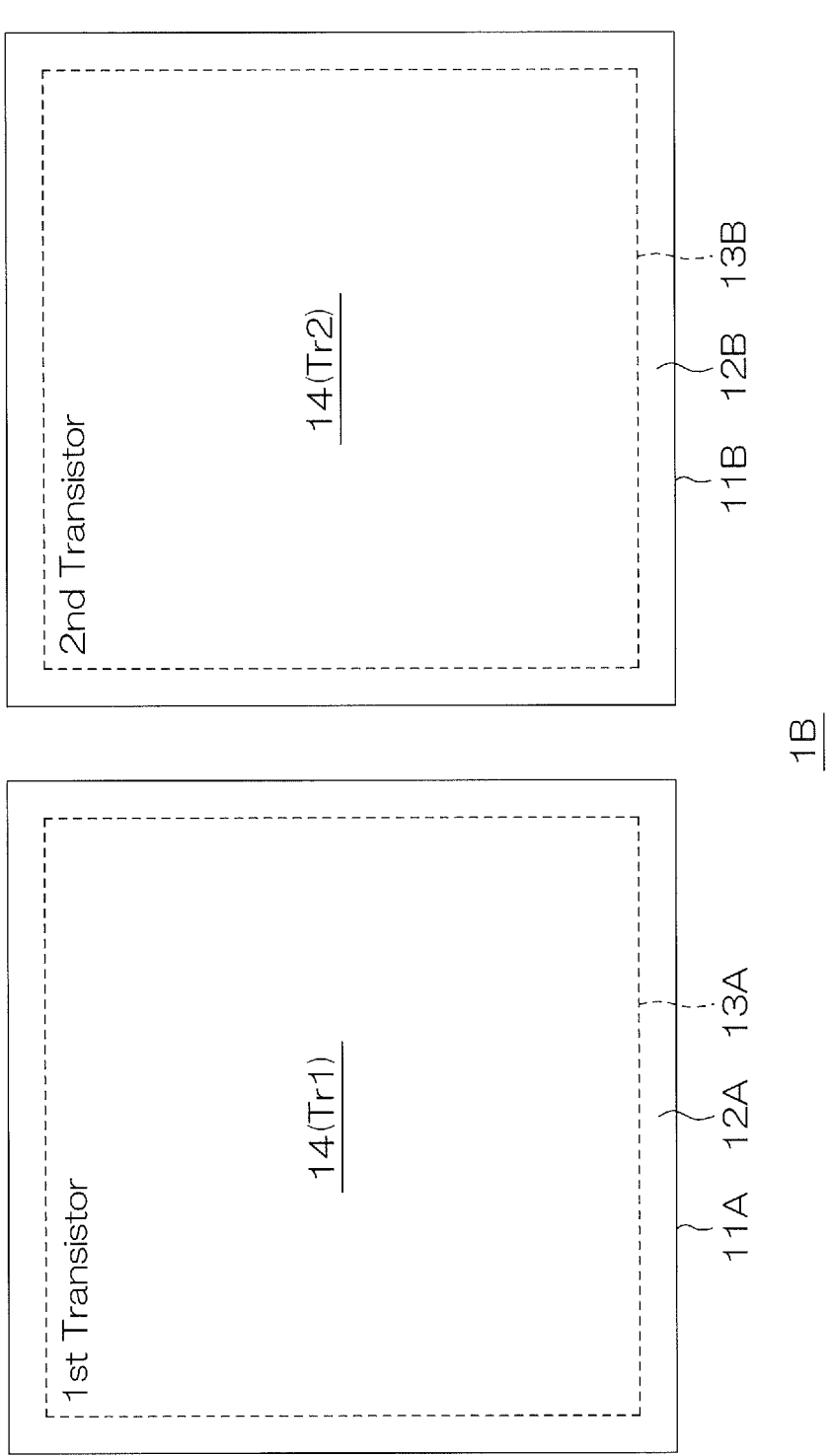
FIG. 15 is a schematic plan view showing a second configuration example of the rectifier shown in FIG. 11.
Figure 16:
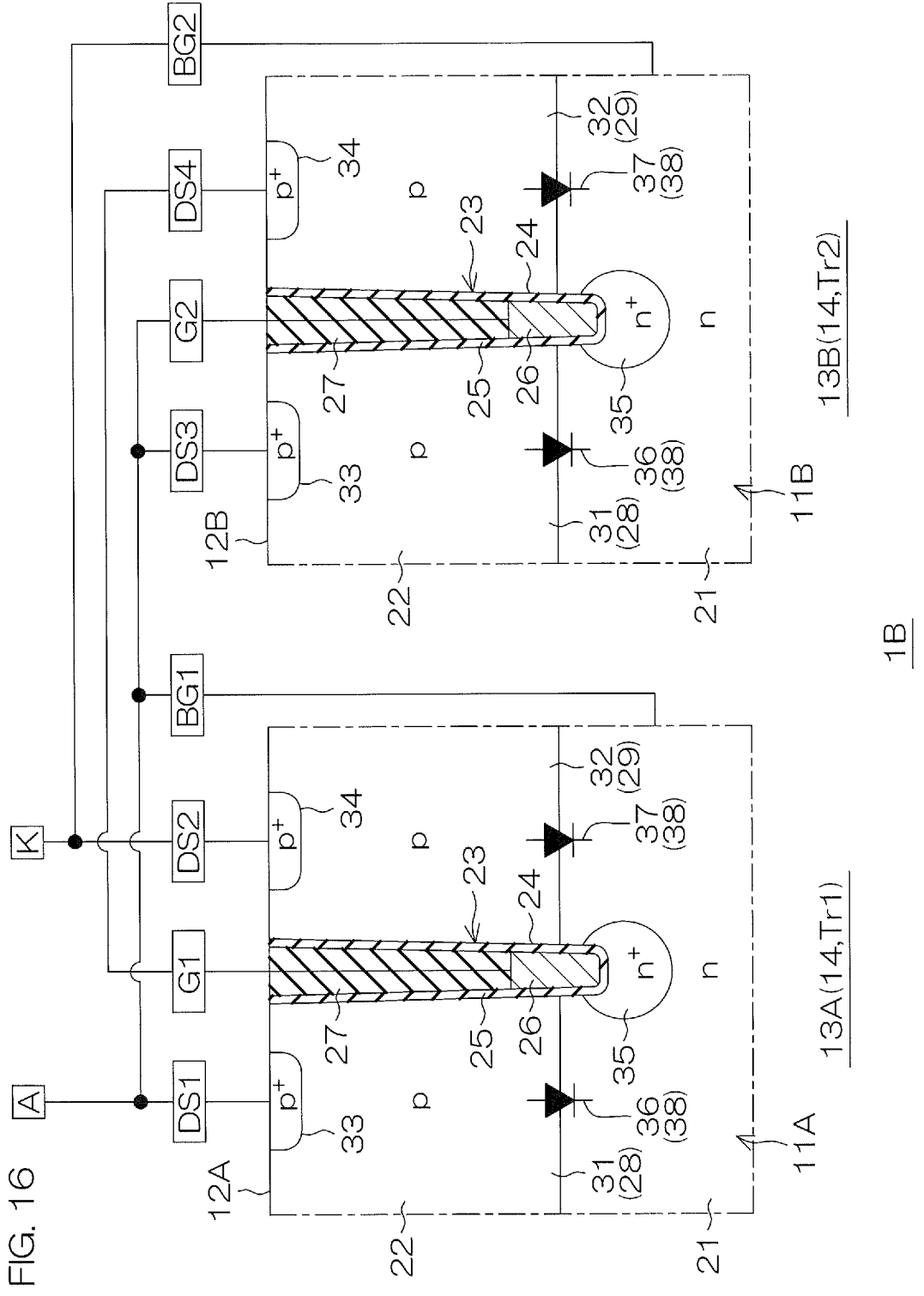
FIG. 16 is a schematic cross-sectional view of the rectifier shown in FIG. 15.

The rectifier 1B may have a configuration shown in FIG. 15 and FIG. 16. FIG. 15 is a schematic plan view showing a second configuration example of the rectifier 1B shown in FIG. 11. FIG. 16 is a schematic cross-sectional view of the rectifier 1B shown in FIG. 15. As shown in FIG. and FIG. 16, the rectifier 1B may have a composite chip structure including the first chip 11A in which the first transistor Tr1 is formed and the second chip 11B in which the second transistor Tr2 is formed in the same way as the rectifier 1A according to the second configuration example (see FIG. 9 and FIG. 10).

In the rectifier 1B according to the second configuration example, the p-type transistor structure 14 serving as the first transistor Tr1 is formed in the first circuit region 13A (first main surface 12A) of the first chip 11A, and the p-type transistor structure 14 serving as the second transistor Tr2 is formed in the second circuit region 13B (second principal surface 12B) of the second chip 11B.

The electrical connection mode of the p-type transistor structure 14 on the second chip 11B side with respect to the p-type transistor structure 14 on the first chip 11A side is the same as in the case of the first configuration example. The thus formed electrical connection may be realized by a plurality of wirings formed on a mount board, such as PCB. In this case, the anode end A and the cathode end K may be formed by the wirings on the mount board.

Of course, the thus formed electrical connection may be realized by devising a connection mode of a plurality of bonding wires, lead terminals, and the like in a package in which the first chip 11A and the second chip 11B have been mounted. In this case, the anode end A and the cathode end K may be formed by lead terminals arranged in the package.

Figure 17:
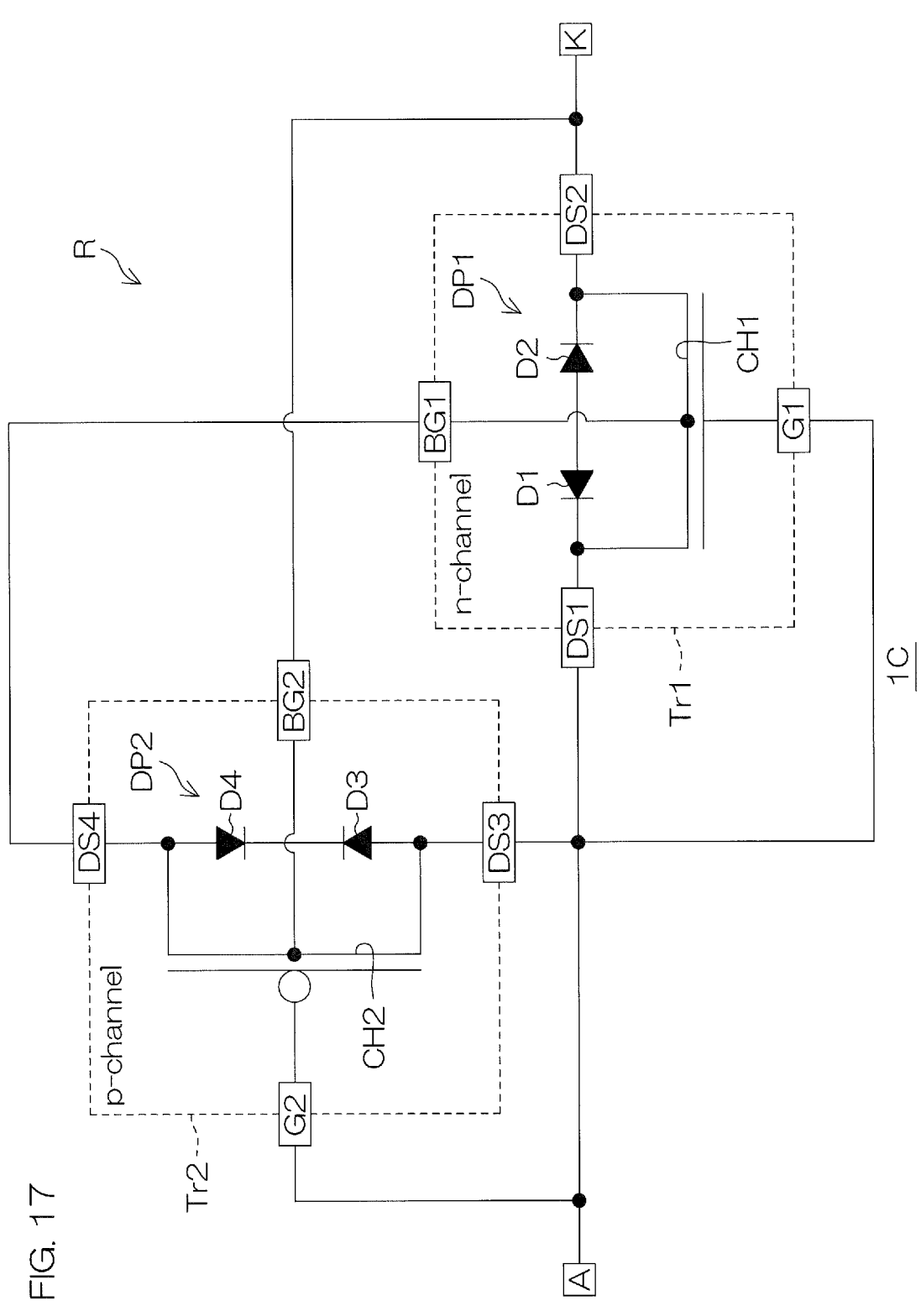
FIG. 17 is a circuit diagram showing an electrical configuration of a rectifier according to a third embodiment.

FIG. 17 is a circuit diagram showing an electrical configuration of a rectifier 1C according to a third embodiment. Referring to FIG. 17, the rectifier 1C has a form in which the rectifier LA has been modified. In detail, the rectifier 1C includes the first transistor Tr1 of a drain/source common field effect type of an n-channel instead of the first transistor Tr1 of the drain/source common field effect type of the p-channel, and includes the second transistor Tr2 of a drain/source common field effect type of a p-channel instead of the second transistor Tr2 of the drain/source common field effect type of the n-channel.

Referring to FIG. 9, the first transistor Tr1 may be an Si transistor formed in an Si monocrystal, or may be a wide bandgap semiconductor transistor formed in a monocrystal of a wide bandgap semiconductor. The first transistor Tr1 may be an SiC transistor formed in an SiC monocrystal as an example of the wide bandgap semiconductor.

The first transistor Tr1 has the first gate G1, the first drain source DS1, the second drain source DS2, the first back gate BG1, and the first diode pair DP1. Each of the first drain source DS1 and the second drain source DS2 integrally includes a source and a drain.

The first diode pair DP1 includes the first body diode D1 and the second body diode D2 that are reverse bias connected so as to be an anode common, and is electrically connected to the first drain source DS1 and to the second drain source DS2. The first body diode D1 is a pn junction diode, and the second body diode D2 is a pn junction diode.

The first body diode D1 includes an anode that forms a node with respect to the second body diode D2 and a cathode electrically connected to the first drain source DS1. The second body diode D2 includes an anode electrically connected to the anode of the first body diode D1 and a cathode electrically connected to the second drain source DS2. The first transistor Tr1 has the aforementioned first gate threshold voltage Vgth1, the aforementioned first breakdown voltage VB1, and the aforementioned first on-resistance Ron1.

The second transistor Tr2 may be an Si transistor formed in an Si monocrystal, or may be a wide bandgap semiconductor transistor formed in a monocrystal of a wide bandgap semiconductor. The second transistor Tr2 may be an SiC transistor formed in an SiC monocrystal as an example of the wide bandgap semiconductor.

The second transistor Tr2 has the second gate G2, the third drain source DS3, the fourth drain source DS4, the second back gate BG2, and the second diode pair DP2. Each of the third drain source DS3 and the fourth drain source DS4 integrally includes a source and a drain.

The second diode pair DP2 includes the third body diode D3 and the fourth body diode D4 that are reverse bias connected so as to be a cathode common, and is electrically connected to the third drain source DS3 and to the fourth drain source DS4. The third body diode D3 is a pn junction diode, and the fourth body diode D4 is a pn junction diode.

The third body diode D3 includes an anode that is electrically connected to the third drain source DS3 and a cathode that forms a node with respect to the fourth body diode D4. The fourth body diode D4 includes an anode that is electrically connected to the fourth drain source DS4 and a cathode that is electrically connected to the cathode of the third body diode D3. The second transistor Tr2 has the aforementioned second gate threshold voltage Vgth2, the aforementioned second breakdown voltage VB2, and the aforementioned second on-resistance Ron2.

The rectifier stage R is configured by allowing the second transistor Tr2 to be diode-connected to the first transistor Tr1 so that the first transistor Tr1 performs a diode operation. In detail, the second transistor Tr2 is provided as a bias circuit that enables the first transistor Tr1 to perform a diode operation by means of a bias voltage, hence configuring the rectifier stage R together with the first transistor Tr1.

In more detail, the second gate G2 is electrically connected to the first gate G1 and to the first drain source DS1, the third drain source DS3 is electrically connected to the first gate G1 and to the first drain source DS1, the fourth drain source DS4 is electrically connected to the first back gate BG1, and the second back gate BG2 is electrically connected to the second drain source DS2.

In other words, the first drain source DS1 is electrically connected to the first gate G1 on the first transistor Tr1 side, and the third drain source DS3 is electrically connected to the second gate G2 on the second transistor Tr2 side. Hence, the first gate G1, the first drain source DS1, the second gate G2, and the third drain source DS3 are fixed at the same potential. Also, the first back gate BG1 and the fourth drain source DS4 are fixed at the same potential. Also, the second drain source DS2 and the second back gate BG2 are fixed at the same potential.

The fourth drain source DS4 configures a short circuit with the first back gate BG1, and does not form a voltage drop between the first back gate BG1 and the fourth drain source DS4. In other words, the first back gate BG1 and the fourth drain source DS4 are fixed at a zero potential (same potential). The first back gate BG1 and the fourth drain source DS4 are fixed at a zero potential both at ON and at OFF of the rectifier stage R (the first transistor Tr1).

Figure 18A:
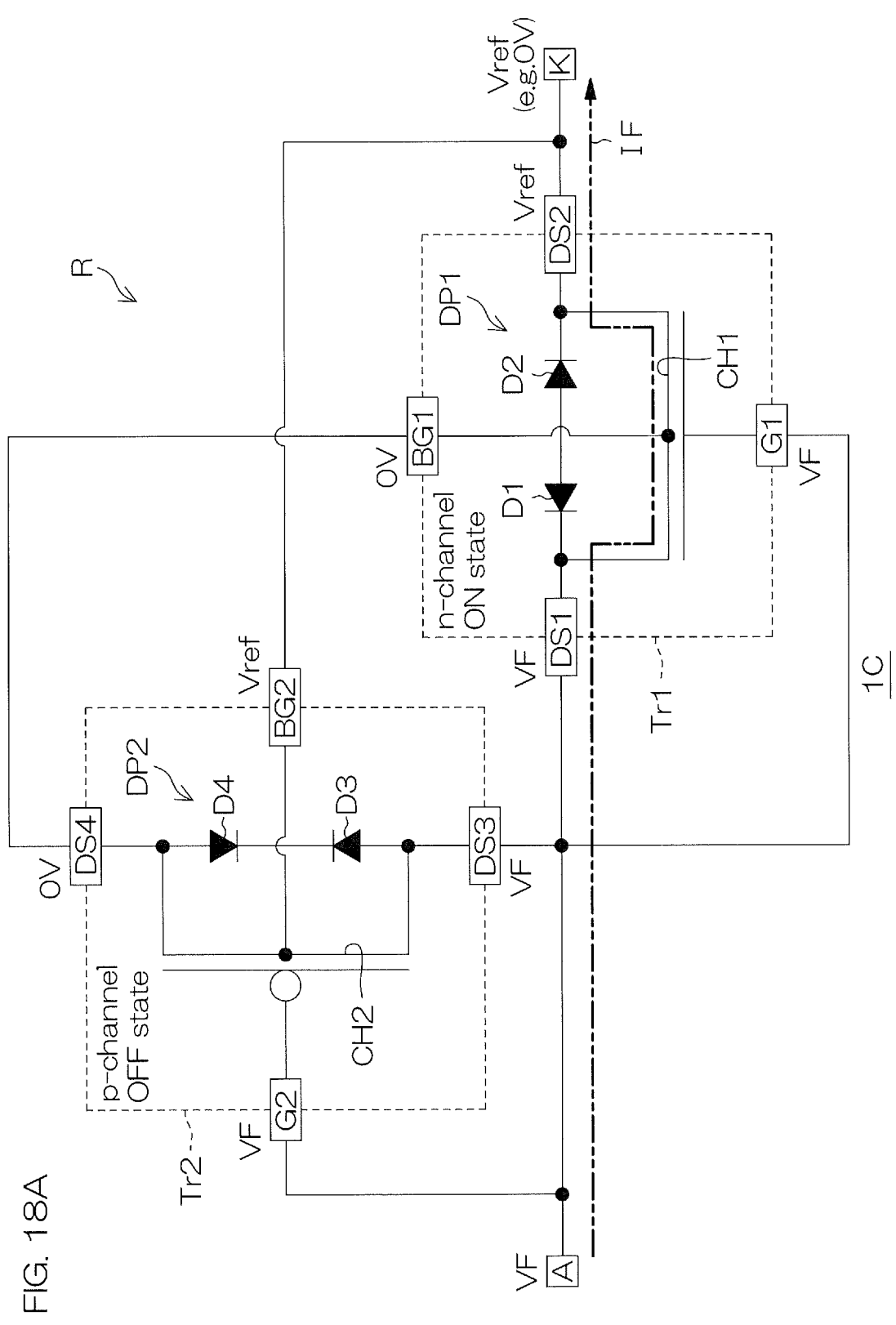
FIG. 18A is a circuit diagram showing a forward operation of the rectifier shown in FIG. 17.
Figure 18B:
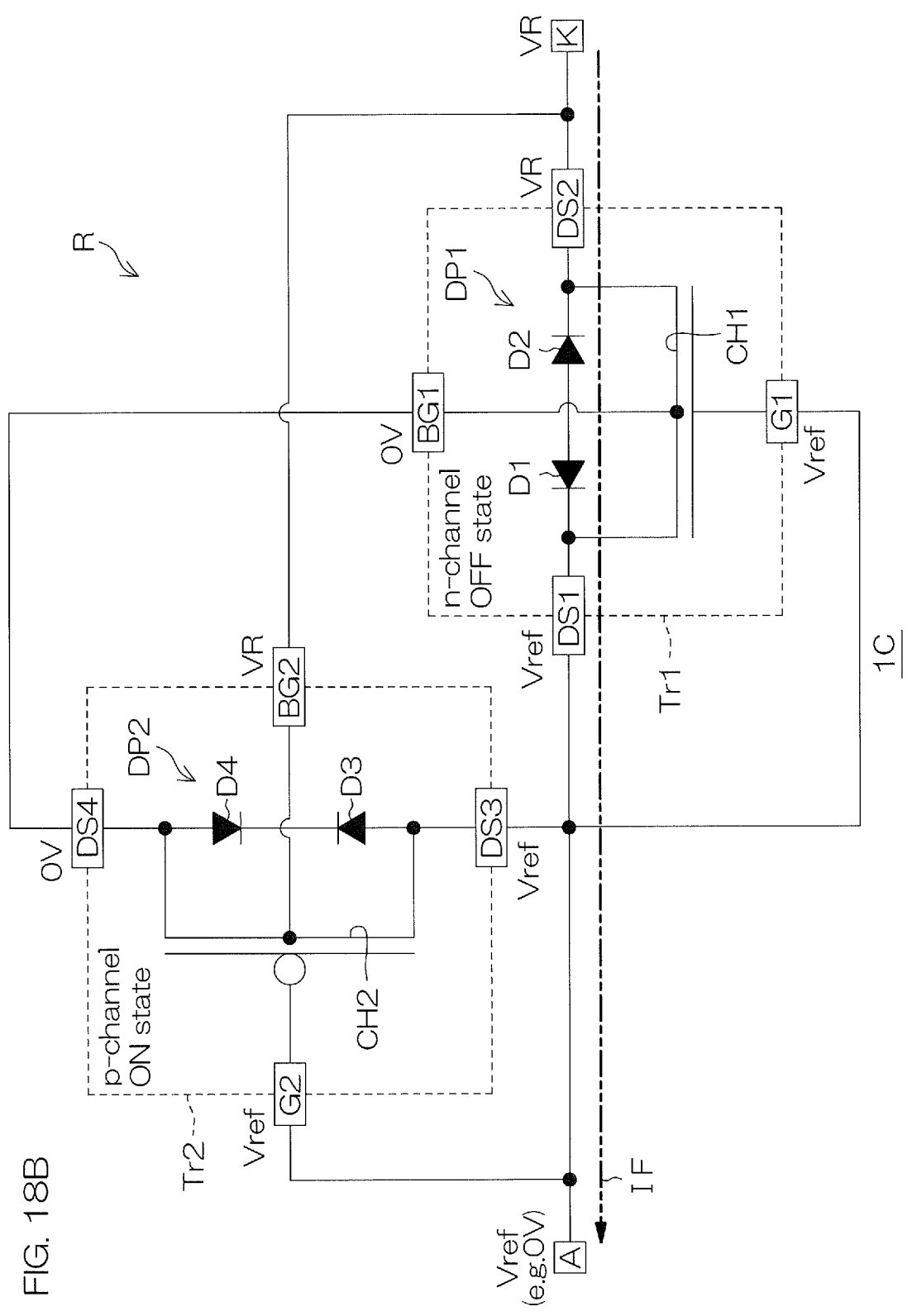
FIG. 18B is a circuit diagram showing a reverse operation of the rectifier shown in FIG. 17.

FIG. 18A is a circuit diagram showing a forward operation of the rectifier 1C shown in FIG. 17. FIG. 18B is a circuit diagram showing a reverse operation of the rectifier 1C shown in FIG. 17. Referring to FIG. 18A and FIG. 18B, the forward current IF flows to the first transistor Tr1 in the forward operation, and the reverse current IR flows to the first transistor Tr1 in the reverse operation.

In detail, in the forward operation, a forward potential VF based on the second drain source DS2 is applied to the first drain source DS1, and the forward current IF flows from the first drain source DS1 toward the second drain source DS2 with reference to FIG. 18A. In FIG. 18A, a circuit operation is shown when a reference potential Vref (for example, ground potential) is applied to the second drain source DS2 and when the forward potential VF is applied to the first drain source DS1.

In the forward operation, the first gate G1, the first drain source DS1, the second gate G2, and the third drain source DS3 are fixed at the forward potential VF. The second drain source DS2 and the second back gate BG2 are fixed at the reference potential Vref. The first back gate BG1 and the fourth drain source DS4 are fixed at a zero potential without forming a voltage drop.

In the first transistor Tr1, the first gate G1 is fixed at the forward potential VF, and the first back gate BG1 is fixed at a zero potential. Therefore, the first transistor Tr1 reaches an OFF state when the forward voltage VF is less than the first gate threshold voltage Vgth1, and the first transistor Tr1 reaches an ON state when the forward voltage VF is equal to or more than the first gate threshold voltage Vgth1. When the first transistor Tr1 reaches an ON state, the forward current IF flows from the first drain source DS1 toward the second drain source DS2 through the first channel CH1 of the first transistor Tr1.

In the second transistor Tr2, the second gate G2 is fixed at the forward potential VF, and the second back gate BG2 is fixed at the reference potential Vref. Therefore, the second transistor Tr2 reaches an OFF state. The second transistor Tr2 does not form a current path between the first drain source DS1 and the second drain source DS2, and therefore the forward current IF does not flow through the second transistor Tr2.

Thus, in the forward operation, the first transistor Tr1 is controlled to be an ON state, and the second transistor Tr2 is controlled to be an OFF state by means of a bias effect caused by the second transistor Tr2. In this state, the forward current IF flows between the first drain source DS1 and the second drain source DS2 through the first channel CH1 of the first transistor Tr1.

In other words, the first transistor Tr1 has the first gate threshold voltage Vgth1 that serves as the forward threshold voltage Vth of the rectifier stage R. Also, the first transistor Tr1 passes a drain-source current that serves as the forward current IF of the rectifier stage R. In other words, the characteristic of the forward current IF coincides with the characteristic of the drain-source current of the first transistor Tr1.

Referring to FIG. 18B, in the reverse operation, the reverse potential VR based on the first drain source DS1 is applied to the second drain source DS2, and the reverse current IR flows from the second drain source DS2 toward the first drain source DS1. In FIG. 18B, a circuit operation is shown when the reference potential Vref (for example, ground potential) is applied to the first drain source DS1 and when the reverse potential VR is applied to the second drain source DS2.

In the reverse operation, the first gate G1, the first drain source DS1, the second gate G2, and the third drain source DS3 are fixed at the reference potential Vref. The second drain source DS2 and the second back gate BG2 are fixed at the reverse potential VR. The first back gate BG1 and the fourth drain source DS4 are fixed at a zero potential without forming a voltage drop.

In the first transistor Tr1, the first gate G1 is fixed at the reference potential Vref (zero potential), and the first back gate BG1 is fixed at a zero potential. Therefore, the first transistor Tr1 reaches an OFF state. When the reverse voltage VR is less than the first breakdown voltage VB1, a leak current serving as the reverse current IR flows between the first drain source DS1 and the second drain source DS2.

When the reverse voltage VR is equal to or more than the first breakdown voltage VB1, the first diode pair DP1 breaks down, and a breakdown current serving as the reverse current IR flows between the first drain source DS1 and the second drain source DS2. Both the characteristic of the leak current and the characteristic of the breakdown current depend on the characteristic of the first diode pair DP1.

In the second transistor Tr2, the second gate G2 is fixed at the reference potential Vref, and the second back gate BG2 is fixed at the reverse potential VR. Therefore, the second transistor Tr2 reaches an OFF state when the reverse voltage VR is less than the second gate threshold voltage Vgth2, and the second transistor Tr2 reaches an ON state when the reverse voltage VR is equal to or more than the second gate threshold voltage Vgth2.

The second gate threshold voltage Vgth2 is less than the first breakdown voltage VB1. Therefore, the second transistor Tr2 reaches an ON state before the first diode pair DP1 breaks down. The second transistor Tr2 does not form a current path between the first drain source DS1 and the second drain source DS2, and therefore the reverse current IR does not flow through the second transistor Tr2.

Thus, in the reverse operation, the first transistor Tr1 is controlled to be an OFF state, and the second transistor Tr2 is controlled to be an ON state by means of a bias effect caused by the second transistor Tr2. In this state, the reverse current IR flows between the first drain source DS1 and the second drain source DS2 through the first diode pair DP1.

In other words, the characteristic of the reverse current IR coincides with the characteristic of the first diode pair DP1. The withstand voltage of the rectifier stage R with respect to the reverse voltage VR is limited to a lower withstand voltage between the withstand voltage of the first diode pair DP1 (the first breakdown voltage VB1) and the gate withstand voltage of the second transistor Tr2 (the gate dielectric breakdown resistance).

The rectifier 1C includes the drain/source common field effect type first transistor Tr1 and the drain/source common field effect type second transistor Tr2 as described above. The second transistor Tr2 is diode-connected to the first transistor Tr1 so as to allow the first transistor Tr1 to perform a diode operation, and configures the rectifier stage R with the first transistor Tr1.

The first transistor Tr1 is an n-channel type in this embodiment. The second transistor Tr2 is a p-channel type in this embodiment. This structure makes it possible to provide the rectifier 1C having a novel configuration in the same way as the rectifier 1A. In detail, this structure makes it possible to provide the rectifier 1C having electrical properties that cannot be realized by the pn junction diode (first reference rectifier R1) or by the Schottky barrier diode (second reference rectifier R2) (see also FIG. 4, etc.).

Figure 19:
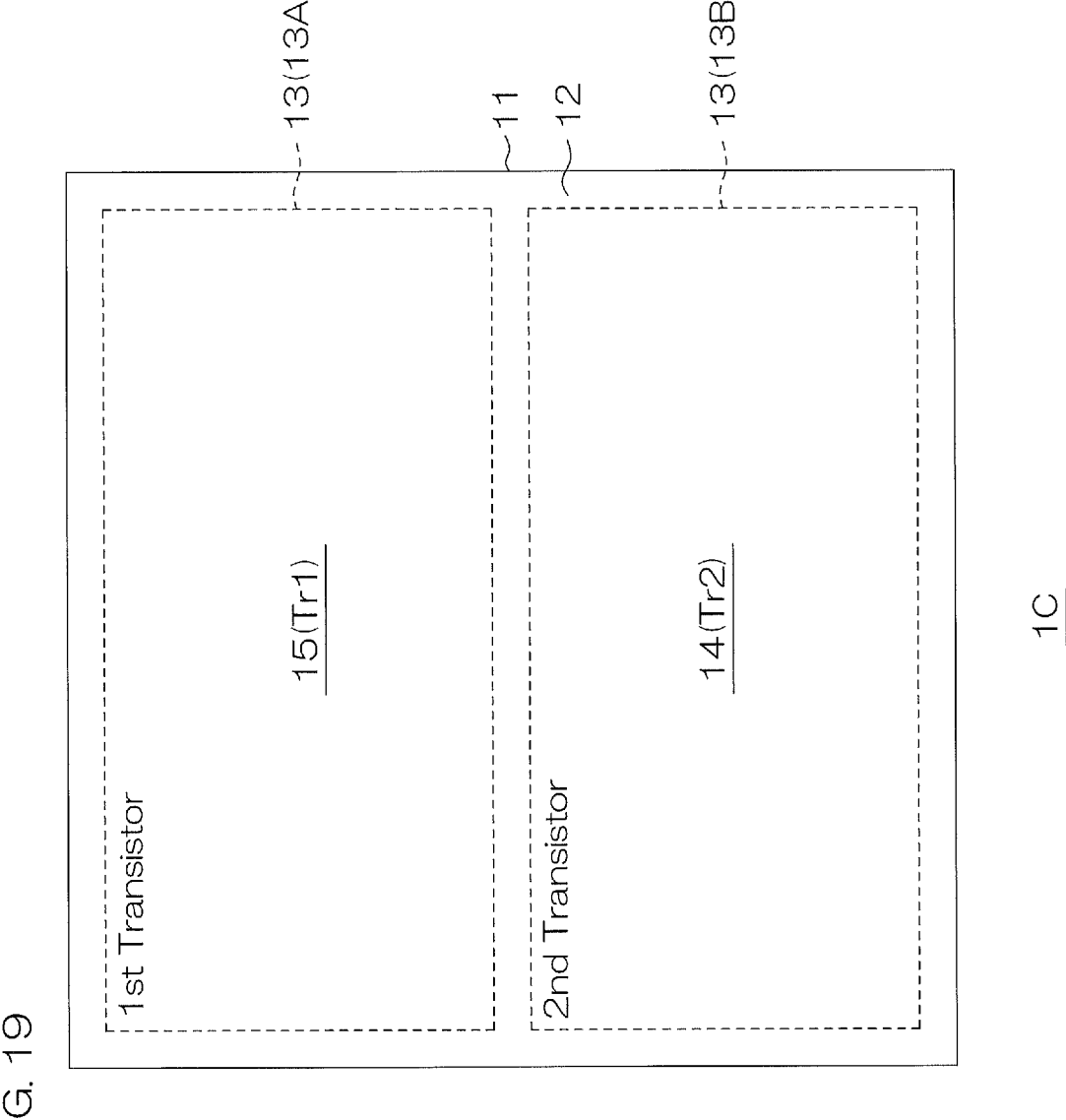
FIG. 19 is a schematic plan view showing a first configuration example of the rectifier shown in FIG. 17.
Figure 20:
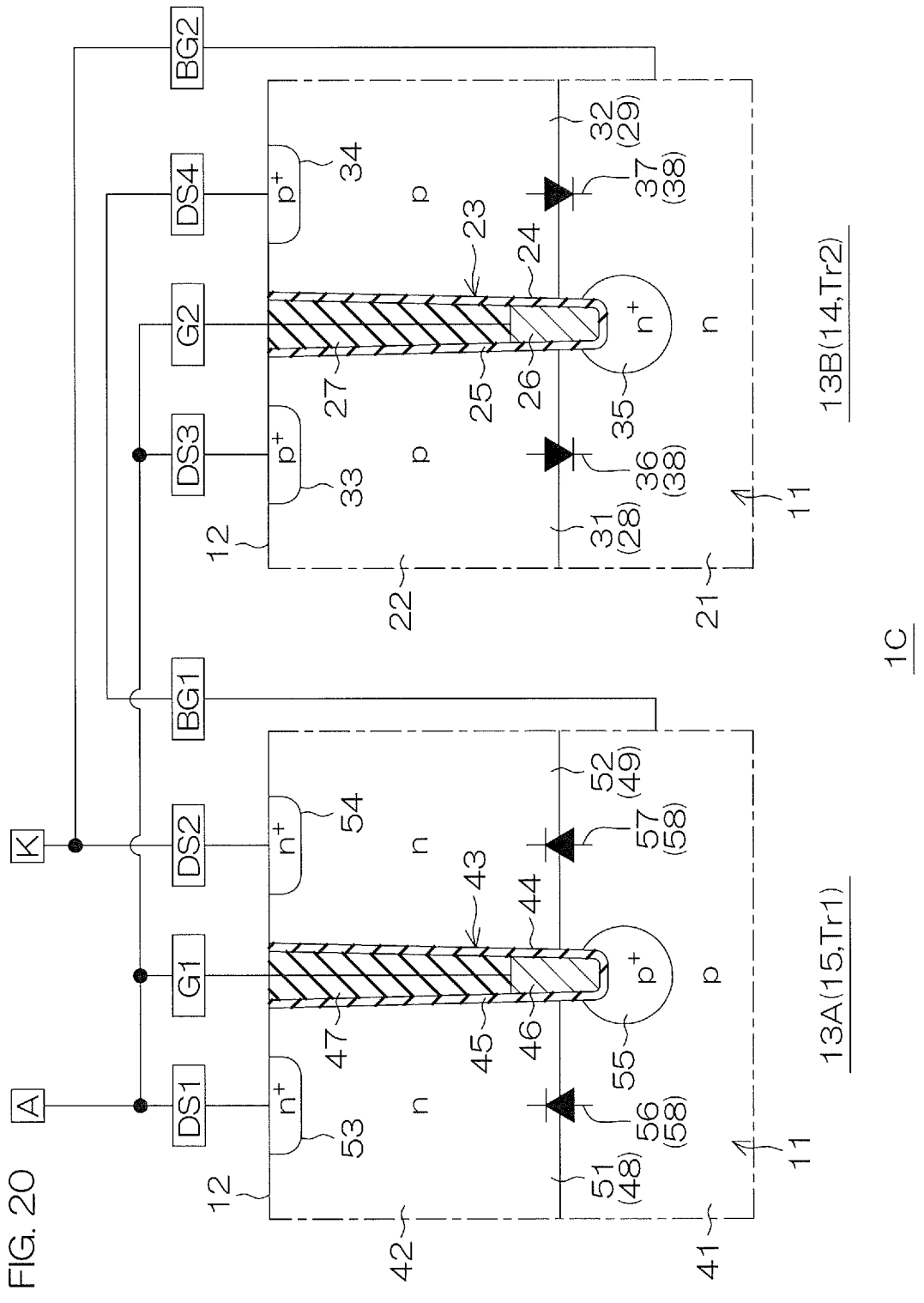
FIG. 20 is a schematic cross-sectional view of the rectifier shown in FIG. 19.

The rectifier 1C may have a configuration shown in FIG. 19 and FIG. 20. FIG. 19 is a schematic plan view showing a first configuration example of the rectifier 1C shown in FIG. 17. FIG. 20 is a schematic cross-sectional view of the rectifier 1C shown in FIG. 19. As shown in FIG. 19 and FIG. 20, the rectifier 1C may have a single chip structure including the chip 11 in which the first transistor Tr1 and the second transistor Tr2 are formed in the same way as the rectifier 1A according to the first configuration example (see FIG. 7 and FIG. 8).

In the rectifier 1C according to the second configuration example, the n-type transistor structure 15 serving as the first transistor Tr1 is formed in the first circuit region 13A, and the p-type transistor structure 14 serving as the second transistor Tr2 is formed in the second circuit region 13B.

The first gate G1, the first drain source DS1, the second drain source DS2, the first back gate BG1, the first channel CH1, and the first diode pair DP1 of the first transistor Tr1 are configured by the second trench gate structure 43, the third drain source region 51 (third contact region 53), the fourth drain source region 52 (fourth contact region 54), the second back gate region 41, the second channel region 55 (part of the second back gate region 41), and the second diode pair portion 58 of the n-type transistor structure 15, respectively.

The second gate G2, the third drain source DS3, the fourth drain source DS4, the second back gate BG2, the second channel CH2, and the second diode pair DP2 of the second transistor Tr2 are configured by the first trench gate structure 23, the first drain source region 31 (first contact region 33), the second drain source region 32 (second contact region 34), the first back gate region 21, the first channel region 35 (part of the first back gate region 21), and the first diode pair portion 38 of the p-type transistor structure 14, respectively.

The p-type transistor structure 14 is diode-connected to the n-type transistor structure 15 so that the n-type transistor structure 15 performs a diode operation. In detail, the first trench gate structure 23 is electrically connected to the second trench gate structure 43 and to the third drain source region 51. Also, the first drain source region 31 is electrically connected to the second trench gate structure 43 and to the third drain source region 51. Also, the second drain source region 32 is electrically connected to the second back gate region 41. Also, the first back gate region 21 is electrically connected to the fourth drain source region 52.

In other words, on the n-type transistor structure 15 side, the third drain source region 51 is electrically connected to the second trench gate structure 43, whereas on the p-type transistor structure 14 side, the first drain source region 31 is electrically connected to the first trench gate structure 23. The rectifier stage R including the n-type transistor structure 15 (first transistor Tr1) and the p-type transistor structure 14 (second transistor Tr2) is thus configured in the single chip 11.

The thus formed electrical connection may be realized by forming a multilayer wiring structure on the main surface 12. In this case, the multilayer wiring structure includes a plurality of insulating films stacked on the main surface 12 and a plurality of wirings stacked and arranged in a multi-stage manner through a via electrode on the insulating films. In this case, the anode end A may be arranged on the multilayer wiring structure as an anode terminal. Also, the cathode end K may be arranged on the multilayer wiring structure as a cathode terminal. In other words, the rectifier 1C may be configured as a two-terminal device.

Figure 21:
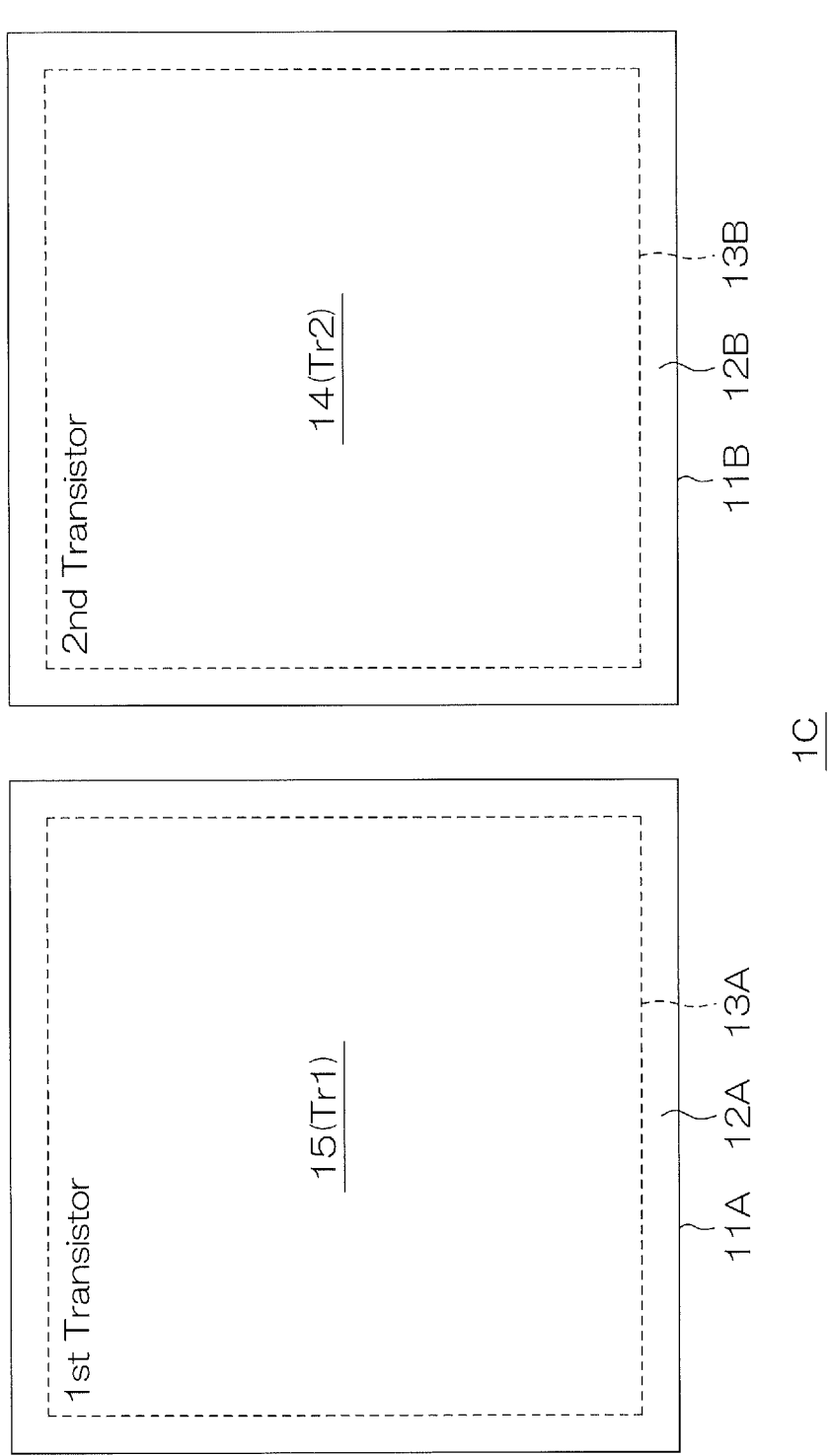
FIG. 21 is a schematic plan view showing a second configuration example of the rectifier shown in FIG. 17.
Figure 22:
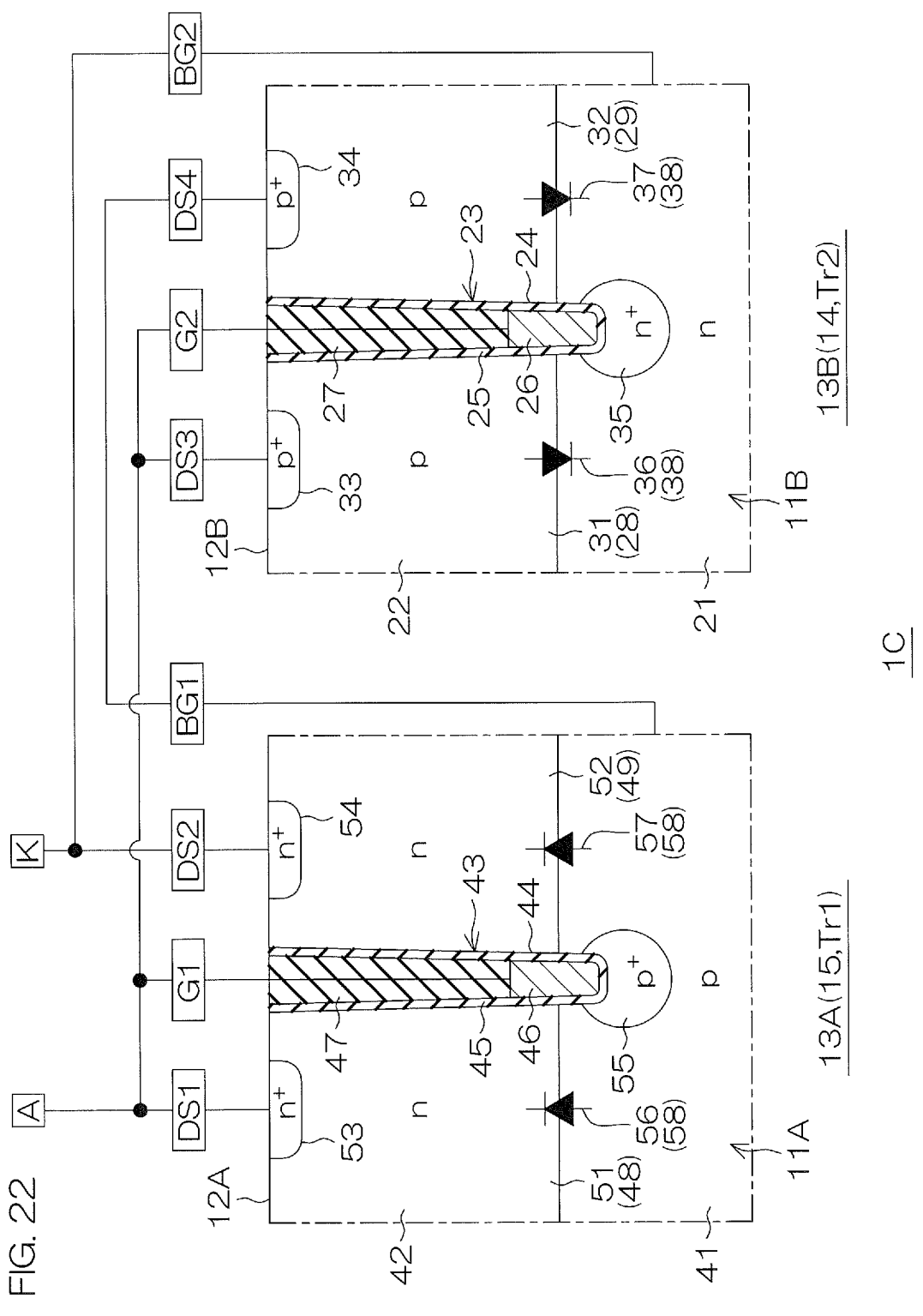
FIG. 22 is a schematic cross-sectional view of the rectifier shown in FIG. 21.

The rectifier 1C may have a configuration shown in FIG. 21 and FIG. 22. FIG. 21 is a schematic plan view showing a second configuration example of the rectifier 1C shown in FIG. 17. FIG. 22 is a schematic cross-sectional view of the rectifier 1C shown in FIG. 21. As shown in FIG. 21 and FIG. 22, the rectifier 1C may have a composite chip structure including the first chip 11A in which the first transistor Tr1 is formed and the second chip 11B in which the second transistor Tr2 is formed in the same way as the rectifier 1A according to the second configuration example (see FIG. 9 and FIG. 10).

In the rectifier 1C according to the second configuration example, the n-type transistor structure 15 serving as the first transistor Tr1 is formed in the first circuit region 13A (first main surface 12A) of the first chip 11A, and the p-type transistor structure 14 serving as the second transistor Tr2 is formed in the second circuit region 13B (second principal surface 12B) of the second chip 11B.

The electrical connection mode of the n-type transistor structure 15 on the second chip 11B side with respect to the p-type transistor structure 14 on the first chip 11A side is the same as in the case of the first configuration example. The thus formed electrical connection may be realized by a plurality of wirings formed on a mount board, such as PCB. In this case, the anode end A and the cathode end K may be formed by the wirings on the mount board.

Of course, the thus formed electrical connection may be realized by devising a connection mode of a plurality of bonding wires, lead terminals, and the like in a package in which the first chip 11A and the second chip 11B have been mounted. In this case, the anode end A and the cathode end K may be formed by lead terminals arranged in the package.

Figure 23:
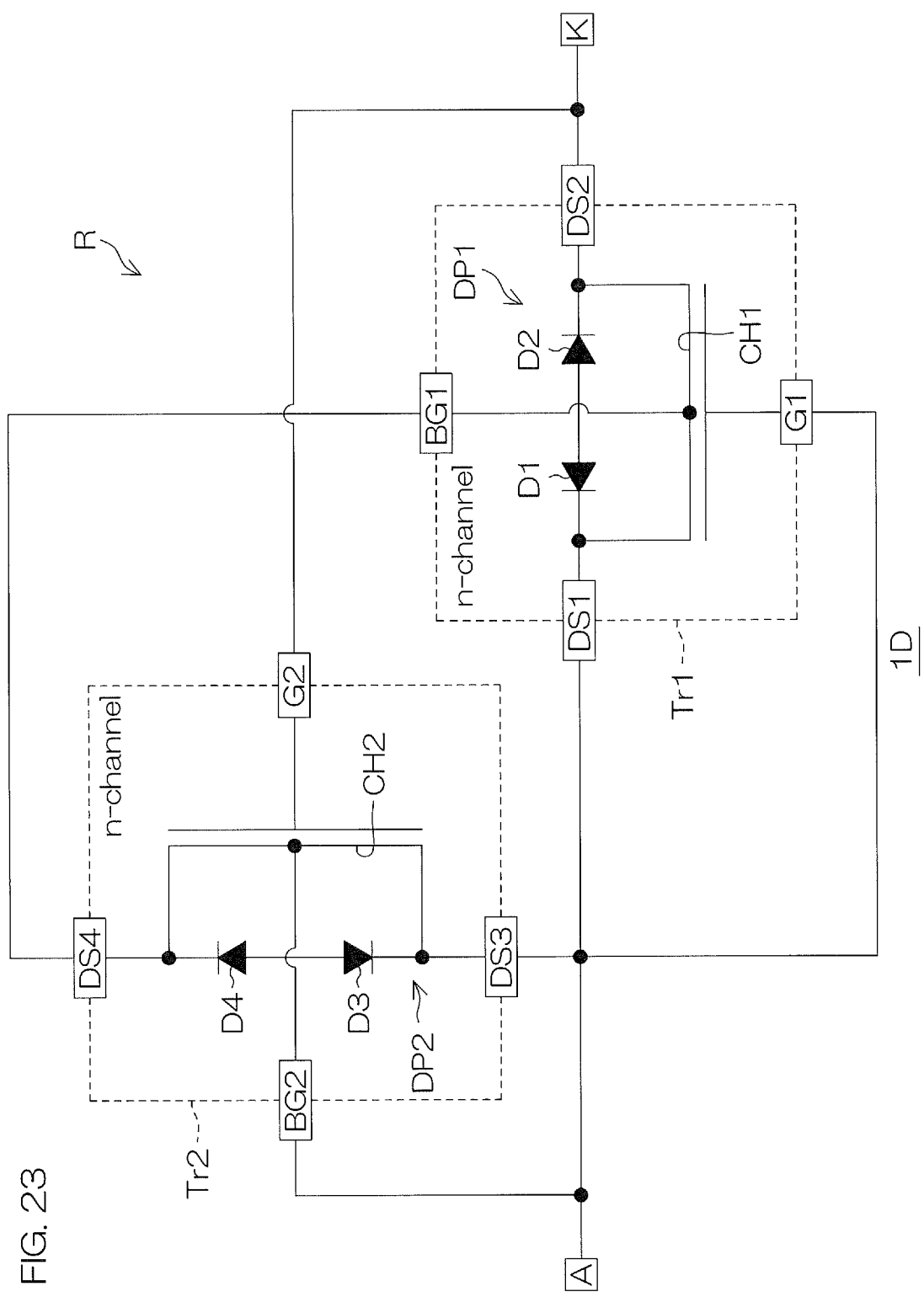
FIG. 23 is a circuit diagram showing an electrical configuration of a rectifier according to a fourth embodiment.

FIG. 23 is a circuit diagram showing an electrical configuration of a rectifier 1D according to a fourth embodiment. Referring to FIG. 23, the rectifier 1D has a form in which the rectifier LA has been modified. In detail, the rectifier 1D includes the first transistor Tr1 of a drain/source common field effect type of an n-channel instead of the first transistor Tr1 of the drain/source common field effect type of the p-channel.

The first transistor Tr1 may be an Si transistor formed in an Si monocrystal, or may be a wide bandgap semiconductor transistor formed in a monocrystal of a wide bandgap semiconductor. The first transistor Tr1 may be an SiC transistor formed in an SiC monocrystal as an example of the wide bandgap semiconductor.

The first transistor Tr1 has the first gate G1, the first drain source DS1, the second drain source DS2, the first back gate BG1, and the first diode pair DP1. Each of the first drain source DS1 and the second drain source DS2 integrally includes a source and a drain.

The first diode pair DP1 includes the first body diode D1 and the second body diode D2 that are reverse bias connected so as to be an anode common, and is electrically connected to the first drain source DS1 and to the second drain source DS2. The first body diode D1 is a pn junction diode, and the second body diode D2 is a pn junction diode.

The first body diode D1 includes an anode that forms a node with respect to the second body diode D2 and a cathode electrically connected to the first drain source DS1. The second body diode D2 includes an anode electrically connected to the anode of the first body diode D1 and a cathode electrically connected to the second drain source DS2. The first transistor Tr1 has the aforementioned first gate threshold voltage Vgth1, the aforementioned first breakdown voltage VB1, and the aforementioned first on-resistance Ron1.

The rectifier stage R is configured by allowing the second transistor Tr2 to be diode-connected to the first transistor Tr1 so that the first transistor Tr1 performs a diode operation. In detail, the second transistor Tr2 is provided as a bias circuit that enables the first transistor Tr1 to perform a diode operation by means of a bias voltage, hence configuring the rectifier stage R together with the first transistor Tr1.

In more detail, the second gate G2 is electrically connected to the second drain source DS2, the third drain source DS3 is electrically connected to the first gate G1 and to the first drain source DS1, the fourth drain source DS4 is electrically connected to the first back gate BG1, and the second back gate BG2 is electrically connected to the first gate G1 and to the first drain source DS1.

In other words, the first drain source DS1 is electrically connected to the first gate G1 on the first transistor Tr1 side, and the second back gate BG2 is electrically connected to the third drain source DS3 on the second transistor Tr2 side. Hence, the first gate G1, the first drain source DS1, the third drain source DS3, and the second back gate BG2 are fixed at the same potential. Also, the first back gate BG1 and the fourth drain source DS4 are fixed at the same potential. Also, the second drain source DS2 and the second gate G2 are fixed at the same potential. The fourth drain source DS4 configures a short circuit with the first back gate BG1, and does not form a voltage drop between the first back gate BG1 and the fourth drain source DS4. In other words, the first back gate BG1 and the fourth drain source DS4 are fixed at a zero potential (same potential). The first back gate BG1 and the fourth drain source DS4 are fixed at a zero potential both at ON and at OFF of the rectifier stage R (the first transistor Tr1).

Figure 24A:
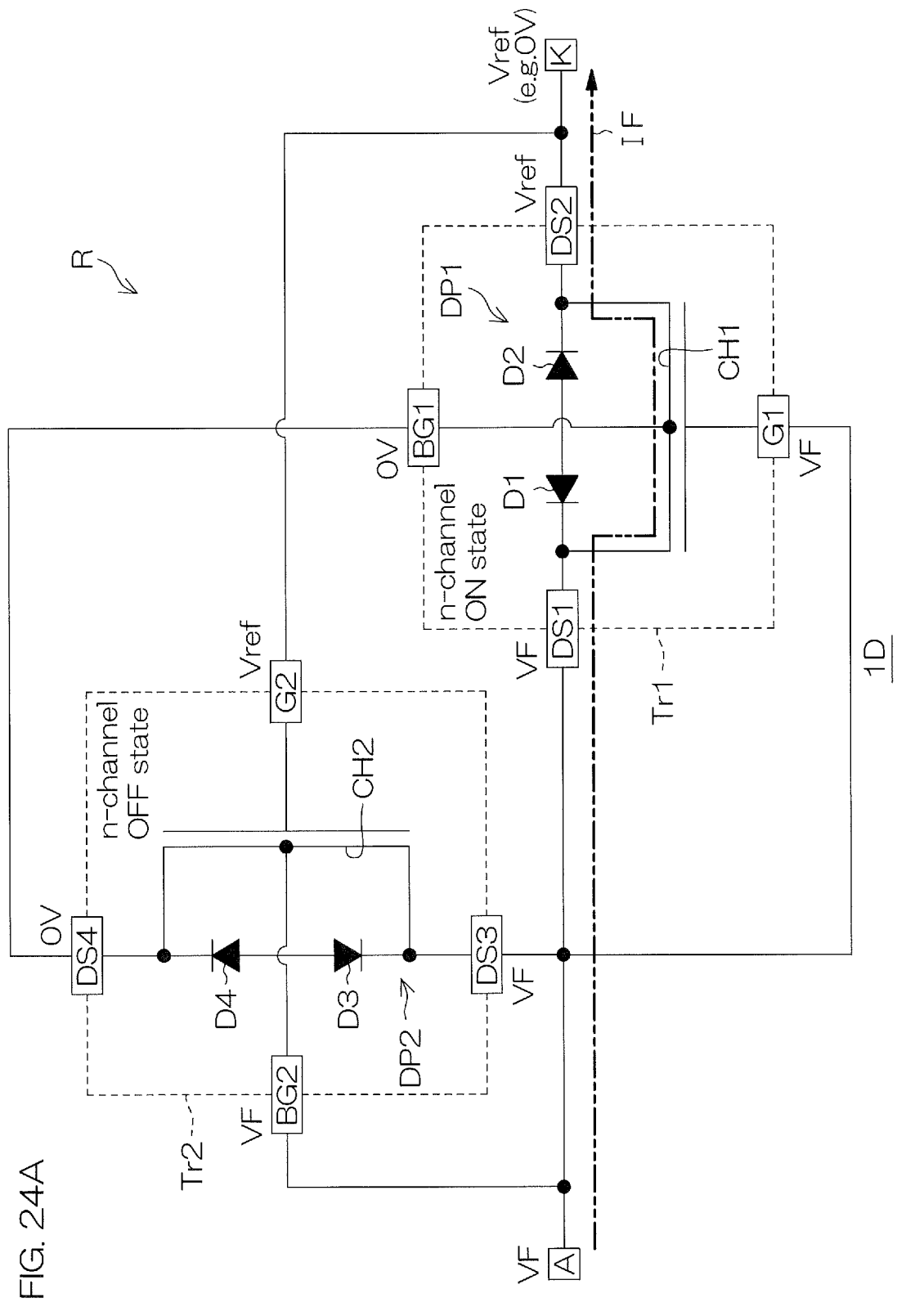
FIG. 24A is a circuit diagram showing a forward operation of the rectifier shown in FIG. 23.
Figure 24B:
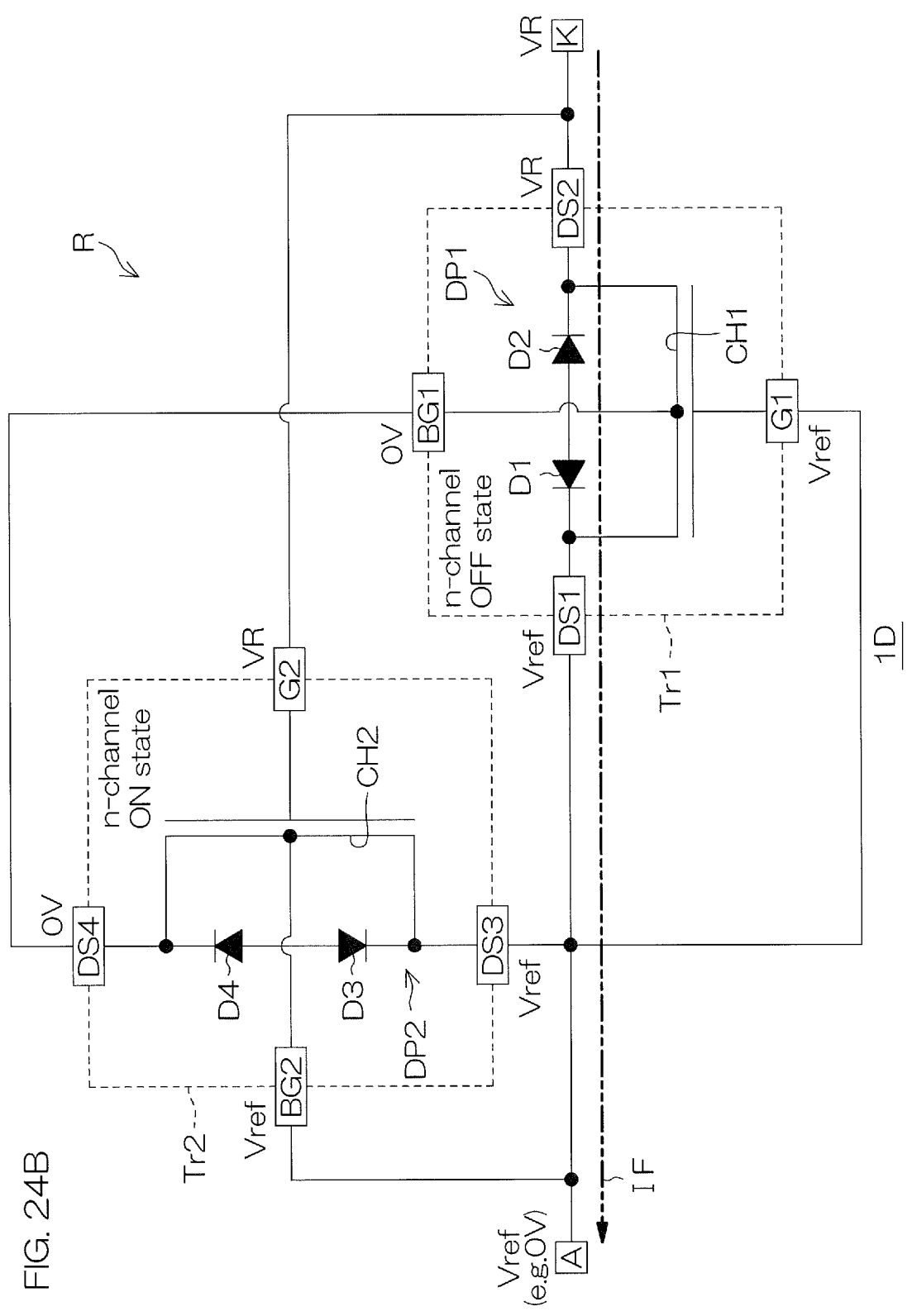
FIG. 24B is a circuit diagram showing a reverse operation of the rectifier shown in FIG. 23.

FIG. 24A is a circuit diagram showing a forward operation of the rectifier 1D shown in FIG. 23. FIG. 24B is a circuit diagram showing a reverse operation of the rectifier 1D shown in FIG. 23. Referring to FIG. 24A and FIG. 24B, the forward current IF flows to the first transistor Tr1 in the forward operation, and the reverse current IR flows to the first transistor Tr1 in the reverse operation.

In detail, in the forward operation, a forward potential VF based on the second drain source DS2 is applied to the first drain source DS1, and the forward current IF flows from the first drain source DS1 toward the second drain source DS2 with reference to FIG. 24A. In FIG. 24A, a circuit operation is shown when a reference potential Vref (for example, ground potential) is applied to the second drain source DS2 and when the forward potential VF is applied to the first drain source DS1.

In the forward operation, the first gate G1, the first drain source DS1, the third drain source DS3, and the second back gate BG2 are fixed at the forward potential VF. The second drain source DS2 and the second gate G2 are fixed at the reference potential Vref. The first back gate BG1 and the fourth drain source DS4 are fixed at a zero potential without forming a voltage drop.

In the first transistor Tr1, the first gate G1 is fixed at the forward potential VF, and the first back gate BG1 is fixed at a zero potential. Therefore, the first transistor Tr1 reaches an OFF state when the forward voltage VF is less than the first gate threshold voltage Vgth1, and the first transistor Tr1 reaches an ON state when the forward voltage VF is equal to or more than the first gate threshold voltage Vgth1. When the first transistor Tr1 reaches an ON state, the forward current IF flows from the first drain source DS1 toward the second drain source DS2 through the first channel CH1 of the first transistor Tr1.

In the second transistor Tr2, the second gate G2 is fixed at the reference potential Vref, and the second back gate BG2 is fixed at the forward potential VF. Therefore, the second transistor Tr2 reaches an OFF state. The second transistor Tr2 does not form a current path between the first drain source DS1 and the second drain source DS2, and therefore the forward current IF does not flow through the second transistor Tr2.

Thus, in the forward operation, the first transistor Tr1 is controlled to be an ON state, and the second transistor Tr2 is controlled to be an OFF state by means of a bias effect caused by the second transistor Tr2. In this state, the forward current IF flows between the first drain source DS1 and the second drain source DS2 through the first channel CH1 of the first transistor Tr1.

In other words, the first transistor Tr1 has the first gate threshold voltage Vgth1 that serves as the forward threshold voltage Vth of the rectifier stage R. Also, the first transistor Tr1 passes a drain-source current that serves as the forward current IF of the rectifier stage R. In other words, the characteristic of the forward current IF coincides with the characteristic of the drain-source current of the first transistor Tr1.

Referring to FIG. 24B, in the reverse operation, the reverse potential VR based on the first drain source DS1 is applied to the second drain source DS2, and the reverse current IR flows from the second drain source DS2 toward the first drain source DS1. In FIG. 24B, a circuit operation is shown when the reference potential Vref (for example, ground potential) is applied to the first drain source DS1 and when the reverse potential VR is applied to the second drain source DS2.

In the reverse operation, the first gate G1, the first drain source DS1, the third drain source DS3, and the second back gate BG2 are fixed at the reference potential Vref. The second drain source DS2 and the second gate G2 are fixed at the reverse potential VR. The first back gate BG1 and the fourth drain source DS4 are fixed at a zero potential without forming a voltage drop.

In the first transistor Tr1, the first gate G1 is fixed at the reference potential Vref (zero potential), and the first back gate BG1 is fixed at a zero potential. Therefore, the first transistor Tr1 reaches an OFF state. When the reverse voltage VR is less than the first breakdown voltage VB1, a leak current serving as the reverse current IR flows between the first drain source DS1 and the second drain source DS2.

When the reverse voltage VR is equal to or more than the first breakdown voltage VB1, the first diode pair DP1 breaks down, and a breakdown current serving as the reverse current IR flows between the first drain source DS1 and the second drain source DS2. Both the characteristic of the leak current and the characteristic of the breakdown current depend on the characteristic of the first diode pair DP1.

In the second transistor Tr2, the second gate G2 is fixed at the reverse potential VR, and the second back gate BG2 is fixed at the reference potential Vref. Therefore, the second transistor Tr2 reaches an OFF state when the reverse voltage VR is less than the second gate threshold voltage Vgth2, and the second transistor Tr2 reaches an ON state when the reverse voltage VR is equal to or more than the second gate threshold voltage Vgth2.

The second gate threshold voltage Vgth2 is less than the first breakdown voltage VB1. Therefore, the second transistor Tr2 reaches an ON state before the first diode pair DP1 breaks down. The second transistor Tr2 does not form a current path between the first drain source DS1 and the second drain source DS2, and therefore the reverse current IR does not flow through the second transistor Tr2.

Thus, in the reverse operation, the first transistor Tr1 is controlled to be an OFF state, and the second transistor Tr2 is controlled to be an ON state by means of a bias effect caused by the second transistor Tr2. In this state, the reverse current IR flows between the first drain source DS1 and the second drain source DS2 through the first diode pair DP1.

In other words, the characteristic of the reverse current IR coincides with the characteristic of the first diode pair DP1. The withstand voltage of the rectifier stage R with respect to the reverse voltage VR is limited to a lower withstand voltage between the withstand voltage of the first diode pair DP1 (the first breakdown voltage VB1) and the gate withstand voltage of the second transistor Tr2 (the gate dielectric breakdown resistance).

The rectifier 1D includes the drain/source common field effect type first transistor Tr1 and the drain/source common field effect type second transistor Tr2 as described above. The second transistor Tr2 is diode-connected to the first transistor Tr1 so as to allow the first transistor Tr1 to perform a diode operation, and configures the rectifier stage R with the first transistor Tr1.

The first transistor Tr1 is an n-channel type in this embodiment. The second transistor Tr2 is an n-channel type in this embodiment. This structure makes it possible to provide the rectifier 1D having a novel configuration in the same way as the rectifier LA. In detail, this structure makes it possible to provide the rectifier 1D having electrical properties that cannot be realized by the pn junction diode (first reference rectifier R1) or by the Schottky barrier diode (second reference rectifier R2) (see also FIG. 4, etc.). Also, the rectifier 1D is enabled to have a tendency in which the forward current IF in the low current region IFS (first voltage range RV1) is smaller than in the rectifiers 1A to 1C (see also FIG. 4, etc.).

Figure 25:
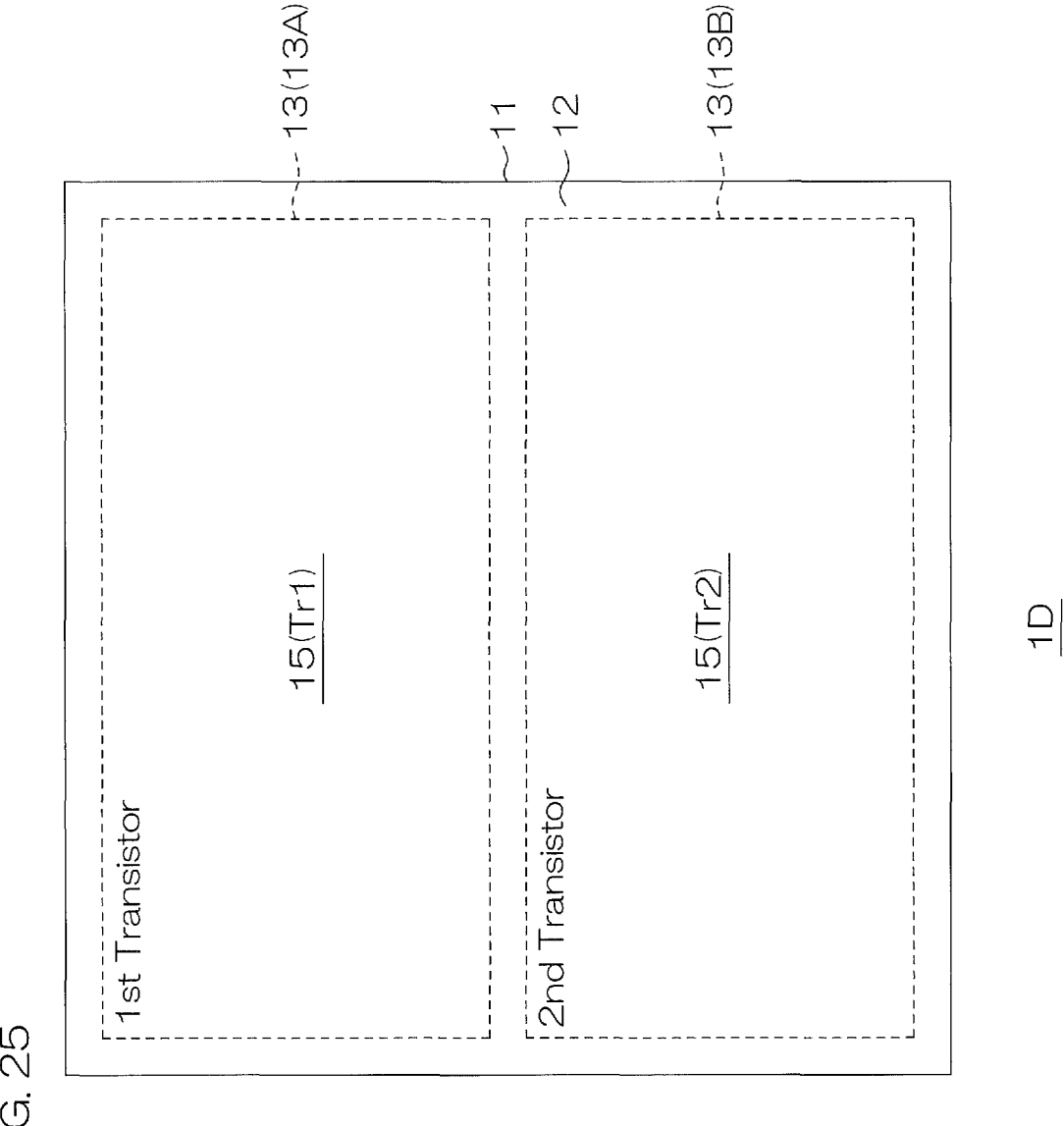
FIG. 25 is a schematic plan view showing a first configuration example of the rectifier shown in FIG. 23.
Figure 26:
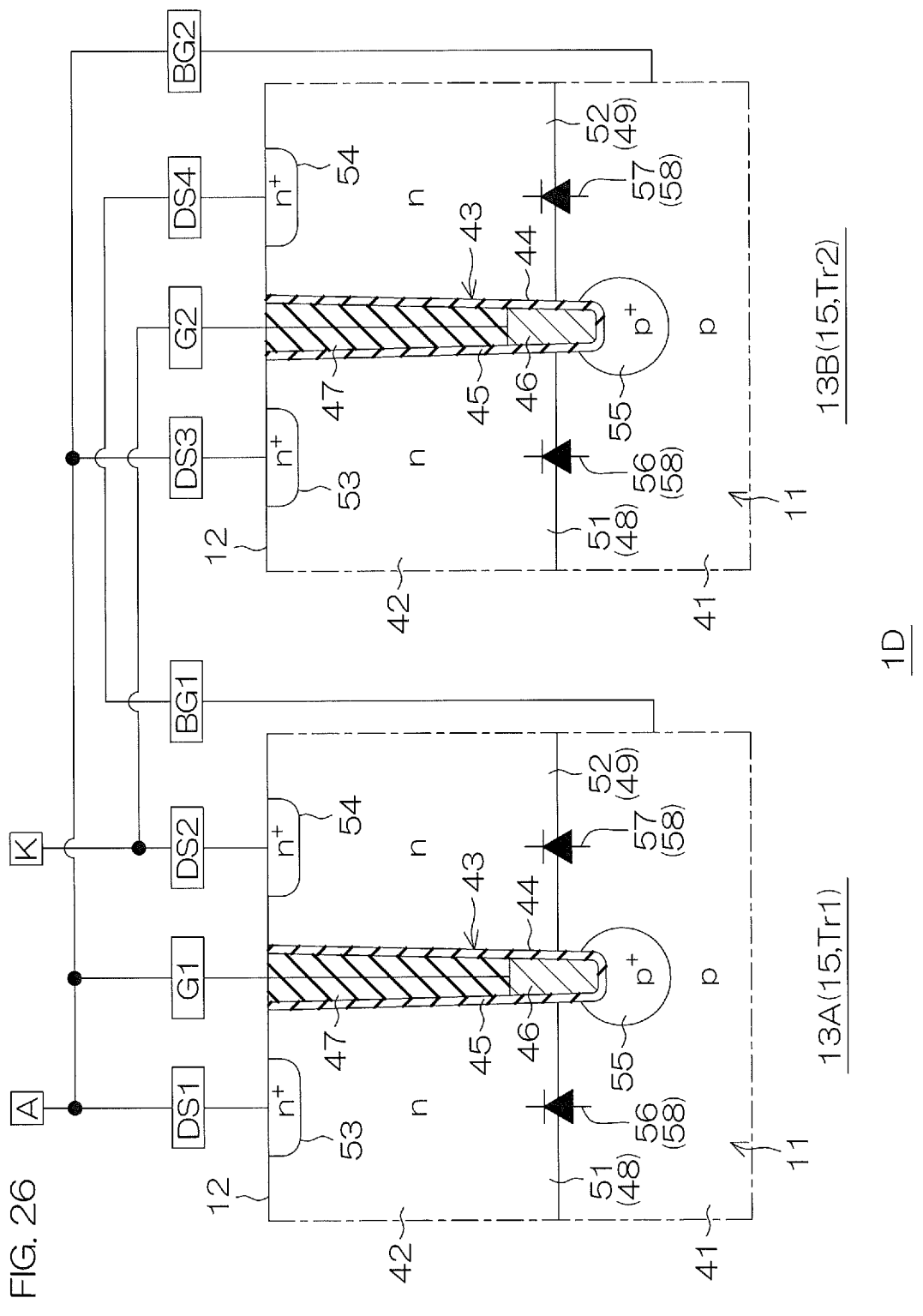
FIG. 26 is a schematic cross-sectional view of the rectifier shown in FIG. 25.

The rectifier 1D may have a configuration shown in FIG. 25 and FIG. 26. FIG. 25 is a schematic plan view showing a first configuration example of the rectifier 1D shown in FIG. 23. FIG. 26 is a schematic cross-sectional view of the rectifier 1D shown in FIG. 25. As shown in FIG. and FIG. 26, the rectifier 1D may have a single chip structure including the chip 11 in which the first transistor Tr1 and the second transistor Tr2 are formed in the same way as the rectifier 1A according to the first configuration example (see FIG. 7 and FIG. 8).

In the rectifier 1D according to the second configuration example, the n-type transistor structure 15 serving as the first transistor Tr1 is formed in the first circuit region 13A, and the n-type transistor structure 15 serving as the second transistor Tr2 is formed in the second circuit region 13B.

The first gate G1, the first drain source DS1, the second drain source DS2, the first back gate BG1, the first channel CH1, and the first diode pair DP1 of the first transistor Tr1 are configured by the second trench gate structure 43, the third drain source region 51 (third contact region 53), the fourth drain source region 52 (fourth contact region 54), the second back gate region 41, the second channel region 55 (part of the second back gate region 41), and the second diode pair portion 58 of the n-type transistor structure 15, respectively.

The second gate G2, the third drain source DS3, the fourth drain source DS4, the second back gate BG2, the second channel CH2, and the second diode pair DP2 of the second transistor Tr2 are configured by the second trench gate structure 43, the third drain source region 51 (third contact region 53), the fourth drain source region 52 (fourth contact region 54), the second back gate region 41, the second channel region 55 (part of the second back gate region 41), and the second diode pair portion 58 of the n-type transistor structure 15, respectively.

The n-type transistor structure 15 on the second circuit region 13B side is diode-connected to the n-type transistor structure 15 on the first circuit region 13A side so that the n-type transistor structure 15 on the first circuit region 13A side performs a diode operation. In detail, the second trench gate structure 43 on the second circuit region 13B side is electrically connected to the fourth drain source region 52 on the first circuit region 13A side.

Also, the third drain source region 51 on the second circuit region 13B side is electrically connected to the second trench gate structure 43 and the third drain source region 51 on the first circuit region 13A side. Also, the fourth drain source region 52 on the second circuit region 13B side is electrically connected to the second back gate region 41 on the first circuit region 13A side. Also, the second back gate region 41 on the second circuit region 13B side is electrically connected to the second trench gate structure 43 and the third drain source region 51 on the first circuit region 13A side.

In other words, on the first circuit region 13A side, the third drain source region 51 is electrically connected to the second trench gate structure 43, whereas on the second circuit region 13B side, the second back gate region 41 is electrically connected to the third drain source region 51. The rectifier stage R including the n-type transistor structure 15 (first transistor Tr1) and the n-type transistor structure 15 (second transistor Tr2) is thus configured in the single chip 11.

The thus formed electrical connection may be realized by forming a multilayer wiring structure on the main surface 12. In this case, the multilayer wiring structure includes a plurality of insulating films stacked on the main surface 12 and a plurality of wirings stacked and arranged in a multi-stage manner through a via electrode on the insulating films. In this case, the anode end A may be arranged on the multilayer wiring structure as an anode terminal. Also, the cathode end K may be arranged on the multilayer wiring structure as a cathode terminal. In other words, the rectifier 1D may be configured as a two-terminal device.

Figure 27:
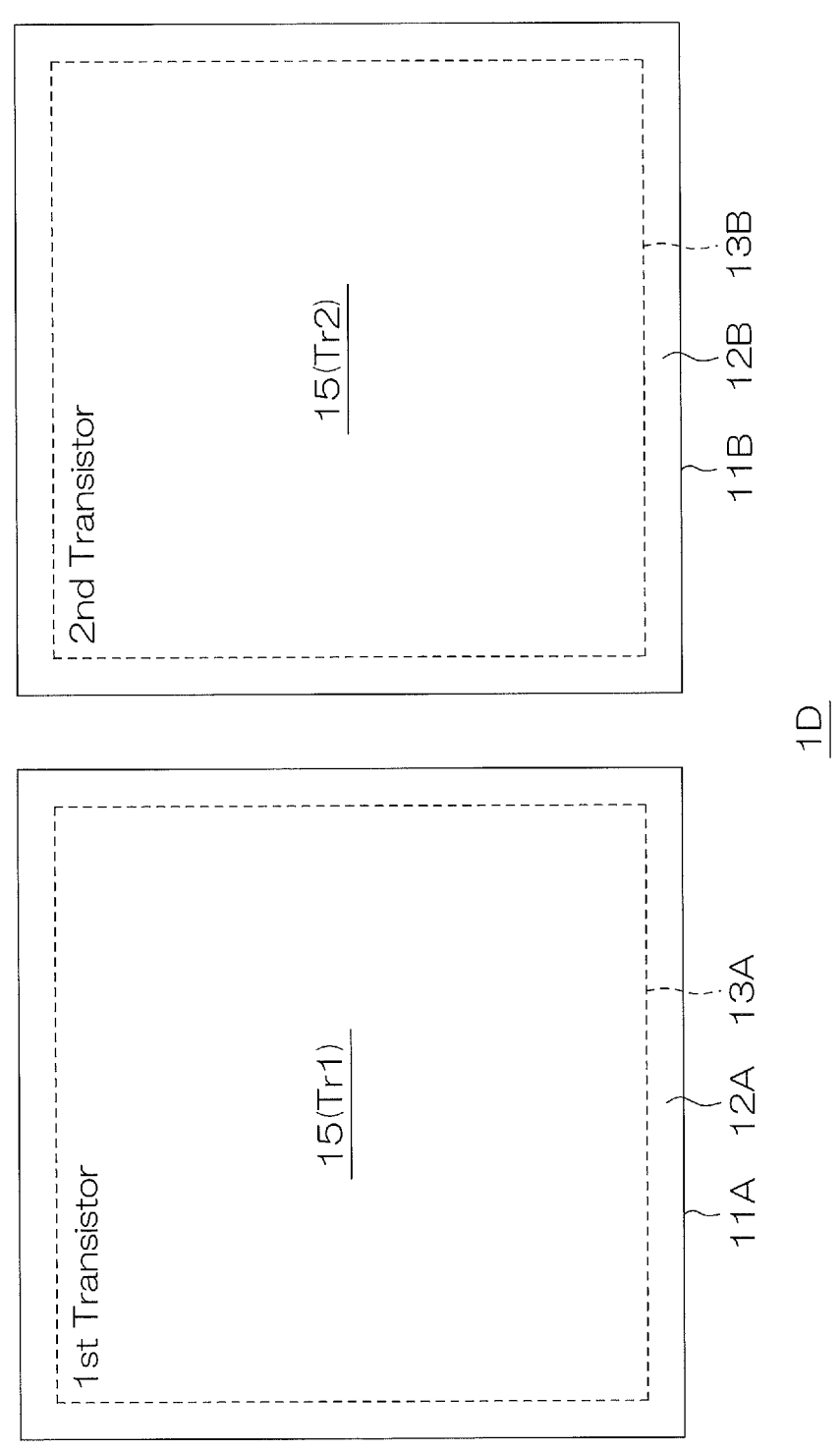
FIG. 27 is a schematic plan view showing a second configuration example of the rectifier shown in FIG. 23.
Figure 28:
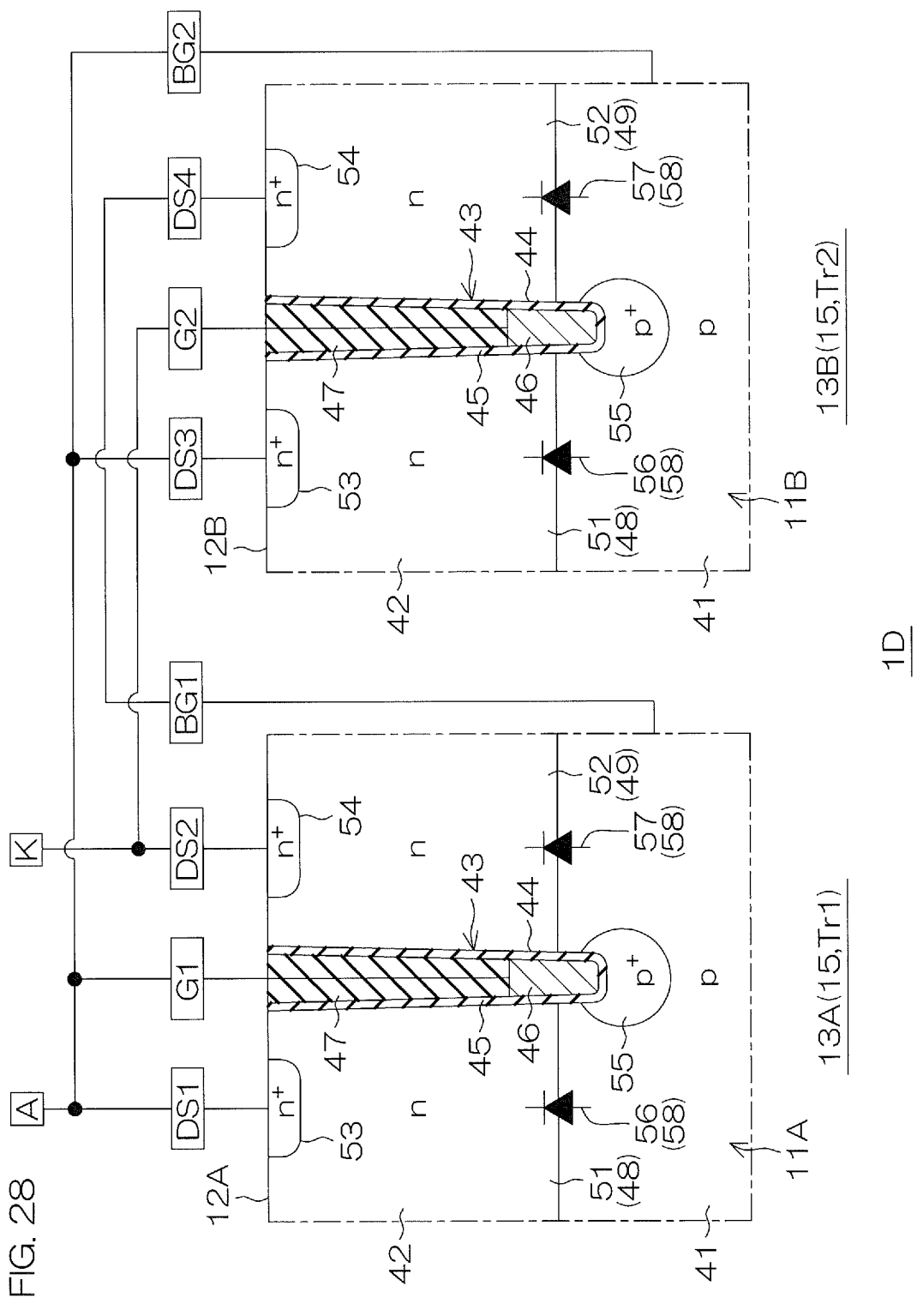
FIG. 28 is a schematic cross-sectional view of the rectifier shown in FIG. 27.

The rectifier 1D may have a configuration shown in FIG. 27 and FIG. 28. FIG. 27 is a schematic plan view showing a second configuration example of the rectifier 1D shown in FIG. 23. FIG. 28 is a schematic cross-sectional view of the rectifier 1D shown in FIG. 27. As shown in FIG. 27 and FIG. 28, the rectifier 1D may have a composite chip structure including the first chip 11A in which the first transistor Tr1 is formed and the second chip 11B in which the second transistor Tr2 is formed in the same way as the rectifier 1A according to the second configuration example (see FIG. 9 and FIG. 10).

In the rectifier 1D according to the second configuration example, the n-type transistor structure 15 serving as the first transistor Tr1 is formed in the first circuit region 13A (first main surface 12A) of the first chip 11A, and the n-type transistor structure 15 serving as the second transistor Tr2 is formed in the second circuit region 13B (second principal surface 12B) of the second chip 11B.

The electrical connection mode of the n-type transistor structure 15 on the second chip 11B side with respect to the n-type transistor structure 15 on the first chip 11A side is the same as in the case of the first configuration example. The thus formed electrical connection may be realized by a plurality of wirings formed on a mount board, such as PCB. In this case, the anode end A and the cathode end K may be formed by the wirings on the mount board.

Of course, the thus formed electrical connection may be realized by devising a connection mode of a plurality of bonding wires, lead terminals, and the like in a package in which the first chip 11A and the second chip 11B have been mounted. In this case, the anode end A and the cathode end K may be formed by lead terminals arranged in the package.

Figure 29:
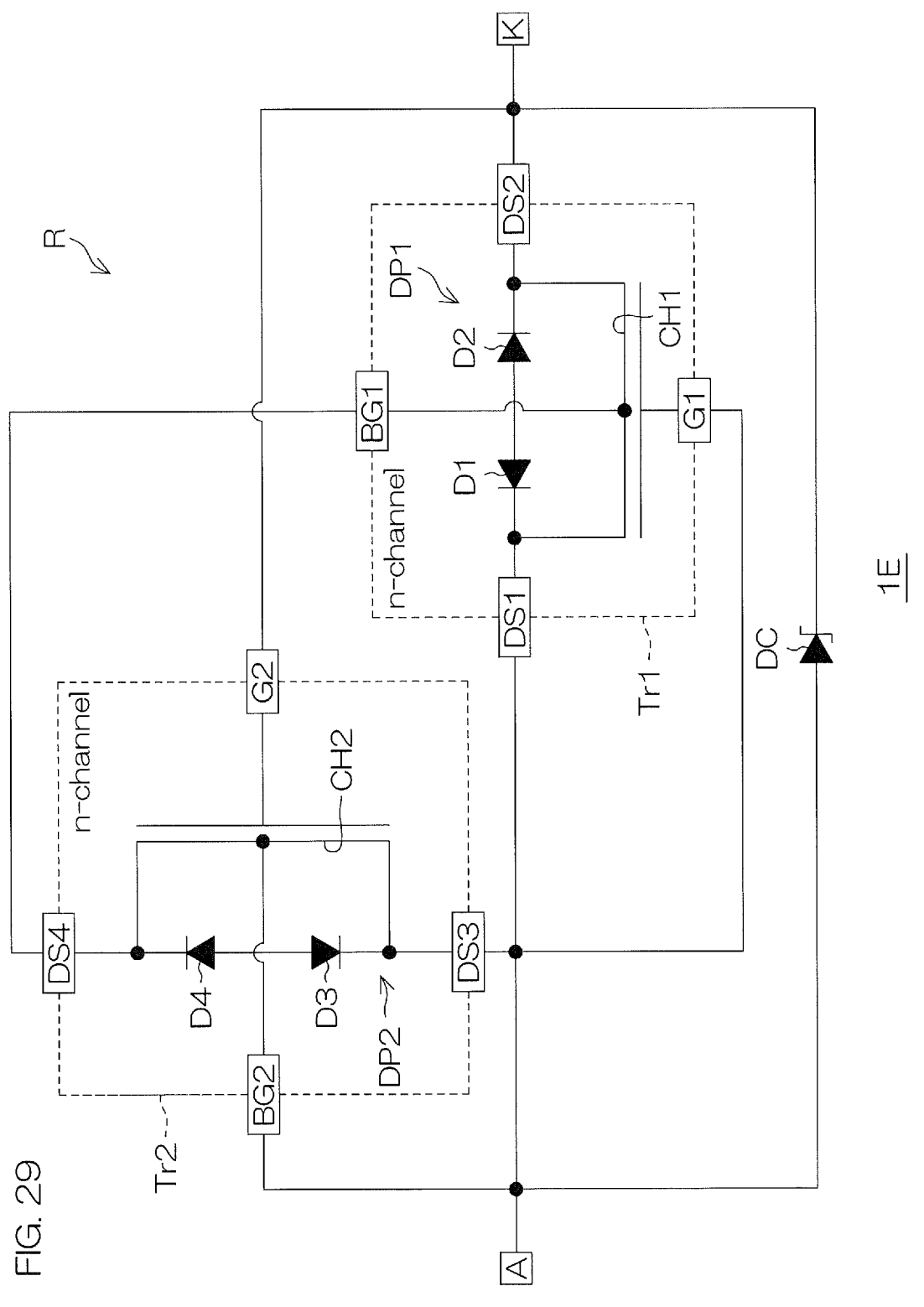
FIG. 29 is a circuit diagram showing an electrical configuration of a rectifier according to a fifth embodiment.

FIG. 29 is a circuit diagram showing an electrical configuration of a rectifier 1E according to a fifth embodiment. The rectifier 1E has a configuration in which a complementary diode DC has been added to the rectifier 1D. The complementary diode DC may be an Si diode formed in an Si monocrystal, or may be a wide bandgap semiconductor diode formed in a monocrystal of a wide bandgap semiconductor. The complementary diode DC may be an SiC diode formed in an SiC monocrystal as an example of a wide bandgap semiconductor.

The complementary diode DC may include at least one among a pn junction diode, a pin junction diode, a Zener diode, and a Schottky barrier diode. In this embodiment, the complementary diode DC consists of a Schottky barrier diode.

The complementary diode DC includes an anode electrically connected to the first drain source DS1 and a cathode electrically connected to the second drain source DS2. In other words, the complementary diode DC is connected in forward-parallel with the first transistor Tr1, and configures the rectifier stage R together with the first transistor Tr1 and with the second transistor Tr2.

Preferably, the complementary diode DC has a second forward threshold voltage Vth2 less than the first gate threshold voltage Vgth1 (forward threshold voltage Vth) of the first transistor Tr1. In other words, preferably, the complementary diode DC is configured to reach an ON state before the first transistor Tr1 reaches an ON state. The second forward threshold voltage Vth2 may be equal to or more than the second gate threshold voltage Vgth2, or may be less than the second gate threshold voltage Vgth2.

The second forward threshold voltage Vth2 may exceed 0 V and not more than 1 V. The second forward threshold voltage Vth2 may have a value that belongs to any one of the ranges of beyond 0 V and not more than 0.1 V, not less than 0.1 V and not more than 0.2 V, not less than V and not more than 0.3 V, not less than 0.3 V and not more than 0.4 V, not less than 0.4 V and not more than 0.5 V, not less than 0.5 V and not more than 0.6 V, not less than 0.6 V and not more than 0.7 V, not less than 0.7 V and not more than 0.8 V, not less than 0.8 V and not more than 0.9 V, and not less than 0.9 V and less than 1 V. Preferably, the second forward threshold voltage Vth2 is equal to or less than 0.5 V.

The complementary diode DC has a third breakdown voltage VB3. The third breakdown voltage VB3 is larger than the first gate threshold voltage Vgth1 and the second gate threshold voltage Vgth2. The third breakdown voltage VB3 may be substantially equal to the first breakdown voltage VB1 of the first transistor Tr1, or may be less than the first breakdown voltage VB1, or may be larger than the first breakdown voltage VB1. The third breakdown voltage VB3 may be substantially equal to the second breakdown voltage VB2 of the second transistor Tr2, or may be less than the second breakdown voltage VB2, or may be larger than the second breakdown voltage VB2.

Figure 30A:
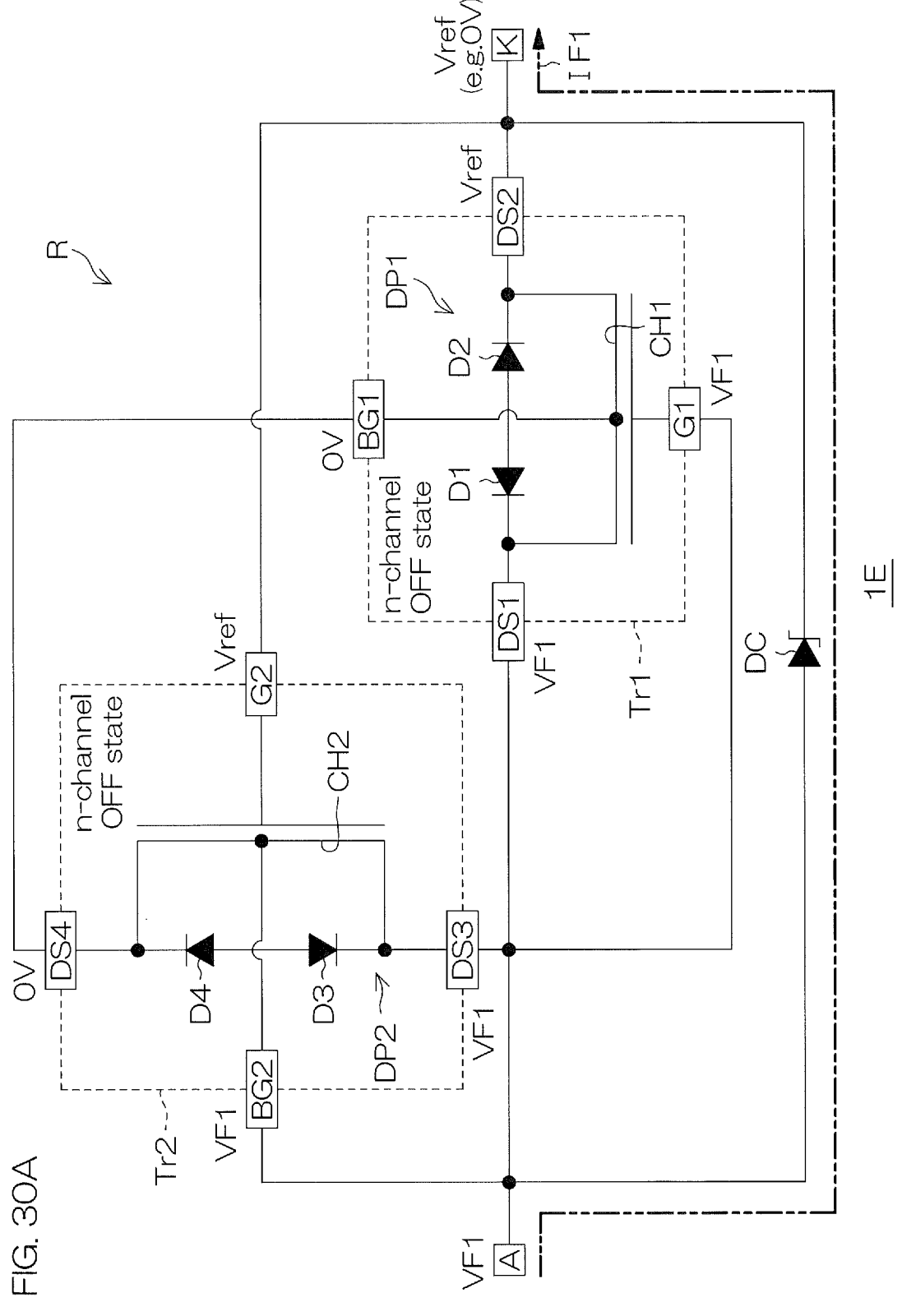
FIG. 30A is a circuit diagram showing a first forward operation of the rectifier shown in FIG. 29.
Figure 30B:
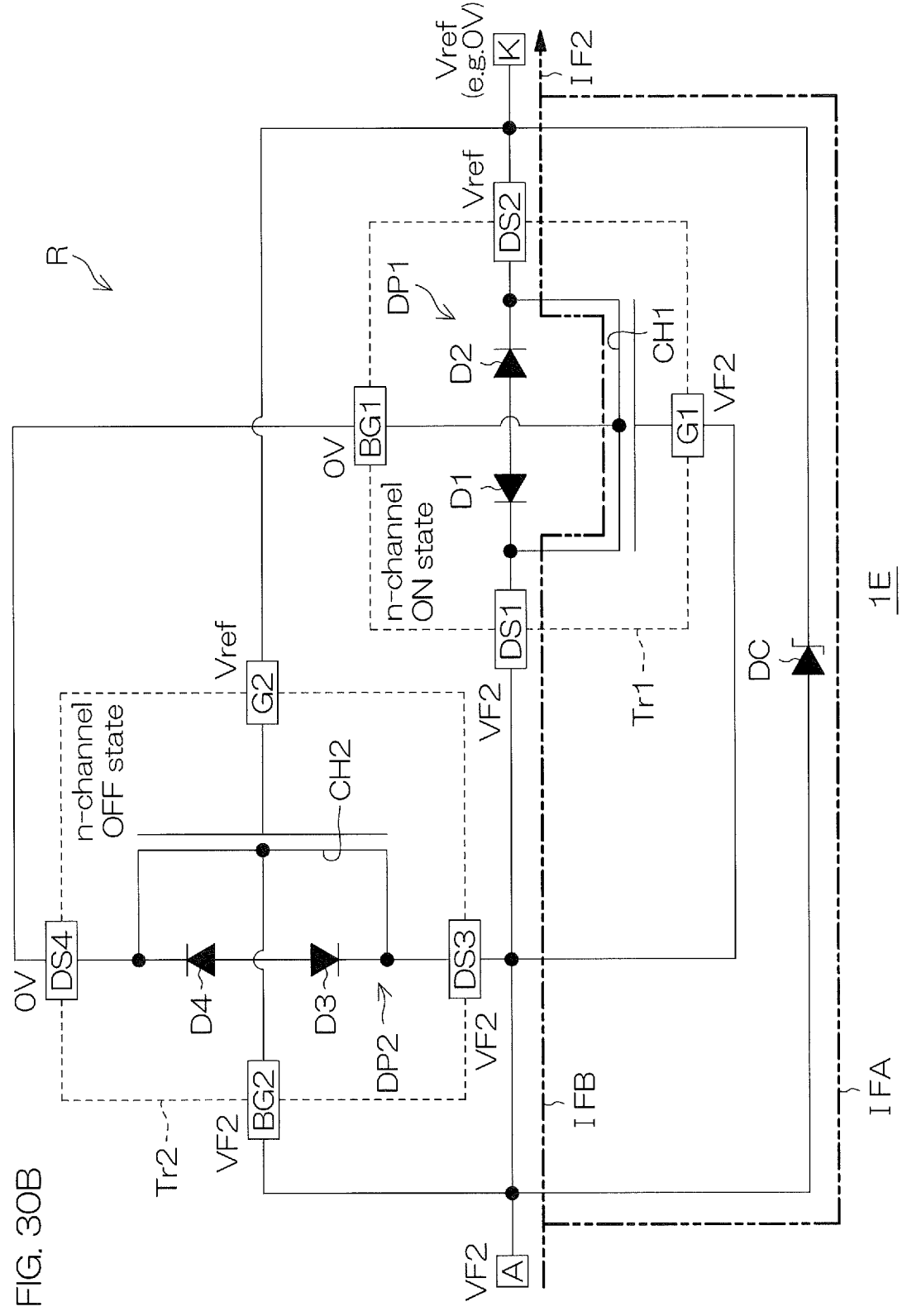
FIG. 30B is a circuit diagram showing a second forward operation of the rectifier shown in FIG. 29.
Figure 30C:
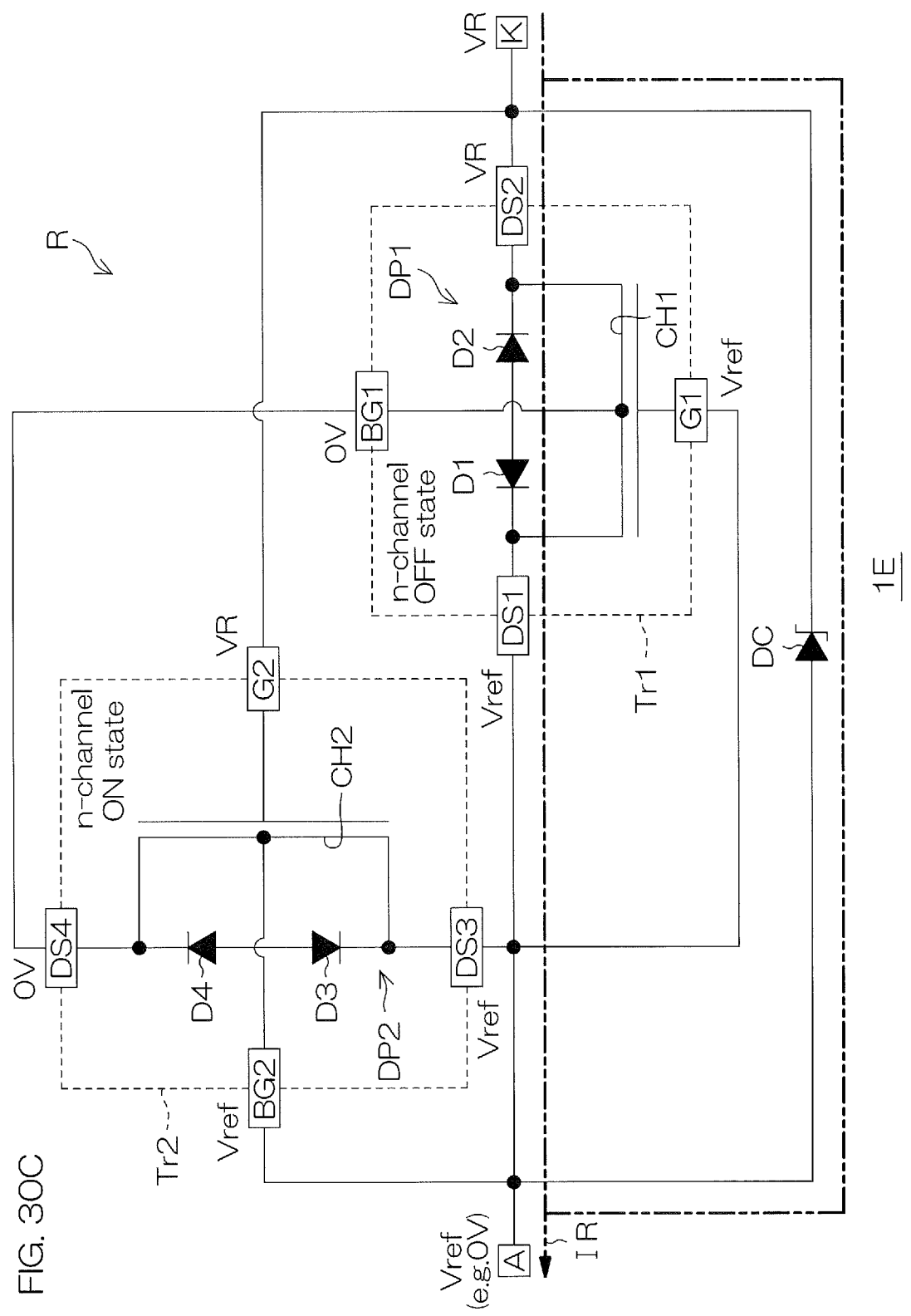
FIG. 30C is a circuit diagram showing a reverse operation of the rectifier shown in FIG. 29.

FIG. 30A is a circuit diagram showing a first forward operation of the rectifier 1E shown in FIG. 29. FIG. 30B is a circuit diagram showing a second forward operation of the rectifier 1E shown in FIG. 29. FIG. 30C is a circuit diagram showing a reverse operation of the rectifier 1E shown in FIG. 29. Referring to FIG. 30A to FIG. 30C, a first forward current IF1 flows to the complementary diode DC in the first forward operation, and a second forward current IF2 flows to the complementary diode DC and to the first transistor Tr1 in the second forward operation, and the reverse current IR flows to the complementary diode DC and to the first transistor Tr1 in the reverse operation.

In detail, referring to FIG. 30A, a first forward potential VF1 is applied between the first drain source DS1 and the second drain source DS2 in the first forward operation. The first forward potential VF1 is equal to or more than the second forward threshold voltage Vth2, and is less than the first gate threshold voltage Vgth1 (forward threshold voltage Vth). A circuit operation is shown in FIG. 30A when the reference potential Vref (for example, ground potential) is applied to the second drain source DS2 and when the first forward potential VF1 is applied to the first drain source DS1.

In the first forward operation, the first gate G1, the first drain source DS1, the third drain source DS3, and the second back gate BG2 are fixed at the first forward potential VF1. The second drain source DS2 and the second gate G2 are fixed at the reference potential Vref. The first back gate BG1 and the fourth drain source DS4 are fixed at the zero potential without forming a voltage drop.

In the complementary diode DC, the anode is fixed at the first forward potential VF1 Vth2), and the cathode is fixed at the reference potential Vref. Therefore, the complementary diode DC reaches an ON state. In the first transistor Tr1, the first gate G1 is fixed at the first forward potential VF1 (<Vgth1), and the first back gate BG1 is fixed at the zero potential. Therefore, the first transistor Tr1 reaches an OFF state. In the second transistor Tr2, the second gate G2 is fixed at the reference potential Vref, and the second back gate BG2 is fixed at the first voltage V1. Therefore, the second transistor Tr2 reaches an OFF state.

Thus, in the first forward operation, the complementary diode DC is controlled to be an ON state, the first transistor Tr1 is controlled to be an OFF state, and the second transistor Tr2 is controlled to be an OFF state by means of a bias effect caused by the second transistor Tr2. Hence, the first forward current IF1 flows from the first drain source DS1 toward the second drain source DS2 through the complementary diode DC. The characteristic of the first forward current IF1 coincides with the characteristic of the forward current IF of the complementary diode DC.

Referring to FIG. 30B, a second forward potential VF2 is applied between the first drain source DS1 and the second drain source DS2 in the second forward operation. The second forward potential VF2 is equal to or more than the first gate threshold voltage Vgth1 (forward threshold voltage Vth). A circuit operation is shown in FIG. 30B when the reference potential Vref (for example, ground potential) is applied to the second drain source DS2 and when the second forward potential VF2 is applied to the first drain source DS1.

In the second forward operation, the first gate G1, the first drain source DS1, the third drain source DS3, and the second back gate BG2 are fixed at the second forward potential VF2. The second drain source DS2 and the second gate G2 are fixed at the reference potential Vref. The first back gate BG1 and the fourth drain source DS4 are fixed at the zero potential without forming a voltage drop.

In the complementary diode DC, the anode is fixed at the second forward potential VF2 (>Vth2), and the cathode is fixed at the reference potential Vref. Therefore, the complementary diode DC reaches an ON state. In the first transistor Tr1, the first gate G1 is fixed at the second forward potential VF2 Vgth1), and the first back gate BG1 is fixed at the zero potential. Therefore, the first transistor Tr1 reaches an ON state. In the second transistor Tr2, the second gate G2 is fixed at the reference potential Vref, and the second back gate BG2 is fixed at the second voltage V2. Therefore, the second transistor Tr2 reaches an OFF state.

Thus, in the second forward operation, the complementary diode DC is controlled to be an ON state, the first transistor Tr1 is controlled to be an ON state, and the second transistor Tr2 is controlled to be an OFF state by means of a bias effect caused by the second transistor Tr2. Hence, the second forward current IF2 flows from the first drain source DS1 toward the second drain source DS2 through the first transistor Tr1 and the complementary diode DC.

In other words, the second forward current IF2 includes a first current component IFA flowing through the complementary diode DC and a second current component IFB flowing through the first transistor Tr1. The second current component IFB corresponds to the forward current IF of the rectifier 1D.

Preferably, the second current component IFB is less than the first current component IFA in the first voltage range RV1 (see FIG. 4). Preferably, the second current component IFB reaches the first current component IFA or more in the second voltage range RV2 (see FIG. 4). In the second voltage range RV2, a ratio IFB/IFA of the second current component IFB (maximum value) to the first current component IFA (maximum value) may be not less than 1 and not more than 50.

The ratio IFB/IFA may be set at a value that belongs to any one of the ranges of not less than 1 and not more than 5, not less than 5 and not more than 10, not less than 10 and not more than 15, not less than 15 and not more than 20, not less than 20 and not more than 25, not less than 25 and not more than 30, not less than 30 and not more than 35, not less than 35 and not more than 40, not less than 40 and not more than 45, and not less than 45 and not more than 50. Preferably, the ratio IFB/IFA is 2 or more. Particularly preferably, the ratio IFB/IFA is 5 or more.

In the second voltage range RV2, the maximum value of the second current component IFB may be not less than 0.1 A and not more than 5 A. Preferably, the maximum value of the second current component IFB is 0.5 A or more. Particularly preferably, the maximum value of the second current component IFB is 1 A or more. The maximum value of the second current component IFB may be 4 A or less. The maximum value of the second current component IFB may be 3 A or less. The maximum value of the second current component IFB may be 2 A or less.

Referring to FIG. 30C, in the reverse operation, the reverse potential VR based on the first drain source DS1 is applied to the second drain source DS2, and the reverse current IR flows from the second drain source DS2 toward the first drain source DS1. In FIG. 30C, a circuit operation is shown when the reference potential Vref (for example, ground potential) is applied to the first drain source DS1 and when the reverse potential VR is applied to the second drain source DS2.

In the reverse operation, the first gate G1, the first drain source DS1, the third drain source DS3, and the second back gate BG2 are fixed at the reference potential Vref. The second drain source DS2 and the second gate G2 are fixed at the reverse potential VR. The first back gate BG1 and the fourth drain source DS4 are fixed at a zero potential without forming a voltage drop.

In the complementary diode DC, the anode is fixed at the reference potential Vref (zero potential), and the cathode is fixed at the reverse potential VR. Therefore, the complementary diode DC reaches an OFF state. When the reverse voltage VR is less than the third breakdown voltage VB3, a leak current serving as the reverse current IR flows between the first drain source DS1 and the second drain source DS2.

When the reverse voltage VR is equal to or more than the third breakdown voltage VB3, the complementary diode DC breaks down, and a breakdown current serving as the reverse current IR flows between the first drain source DS1 and the second drain source DS2. Both the characteristic of the leak current and the characteristic of the breakdown current depend on the characteristic of the complementary diode DC.

In the first transistor Tr1, the first gate G1 is fixed at the reference potential Vref (zero potential), and the first back gate BG1 is fixed at a zero potential. Therefore, the first transistor Tr1 reaches an OFF state. When the reverse voltage VR is less than the first breakdown voltage VB1, a leak current serving as the reverse current IR flows between the first drain source DS1 and the second drain source DS2.

When the reverse voltage VR is equal to or more than the first breakdown voltage VB1, the first diode pair DP1 breaks down, and a breakdown current serving as the reverse current IR flows between the first drain source DS1 and the second drain source DS2. Both the characteristic of the leak current and the characteristic of the breakdown current depend on the characteristic of the first diode pair DP1.

In the second transistor Tr2, the second gate G2 is fixed at the reverse potential VR, and the second back gate BG2 is fixed at the reference potential Vref. Therefore, the second transistor Tr2 reaches an OFF state when the reverse voltage VR is less than the second gate threshold voltage Vgth2, and the second transistor Tr2 reaches an ON state when the reverse voltage VR is equal to or more than the second gate threshold voltage Vgth2.

The second gate threshold voltage Vgth2 is less than the third breakdown voltage VB3. Therefore, the second transistor Tr2 reaches an ON state before the complementary diode DC breaks down. Also, the second gate threshold voltage Vgth2 is less than the first breakdown voltage VB1. Therefore, the second transistor Tr2 reaches an ON state before the first diode pair DP1 breaks down. The second transistor Tr2 does not form a current path between the first drain source DS1 and the second drain source DS2, and therefore the reverse current IR does not flow through the second transistor Tr2.

The rectifier 1E includes the drain/source common field effect type first transistor Tr1, the drain/source common field effect type second transistor Tr2, and the complementary diode DC as described above. The second transistor Tr2 is diode-connected to the first transistor Tr1 so as to allow the first transistor Tr1 to perform a diode operation, and configures the rectifier stage R with the first transistor Tr1. The complementary diode DC is connected in forward-parallel with the first transistor Tr1.

The first transistor Tr1 is an n-channel type in this embodiment. The second transistor Tr2 is an n-channel type in this embodiment. This structure makes it possible to provide the rectifier 1E having a novel configuration in the same way as the rectifier 1A. In detail, this structure makes it possible to provide the rectifier 1E having electrical properties that cannot be realized by the pn junction diode (first reference rectifier R1) or by the Schottky barrier diode (second reference rectifier R2) (see also FIG. 4, etc.).

Also, the rectifier 1E enables the first forward current IF1 to flow through the complementary diode DC before the first transistor Tr1 reaches an ON state, and enables the second forward current IF2 to flow through both the first transistor Tr1 and the complementary diode DC after the first transistor Tr1 reaches an ON state.

Figure 31:
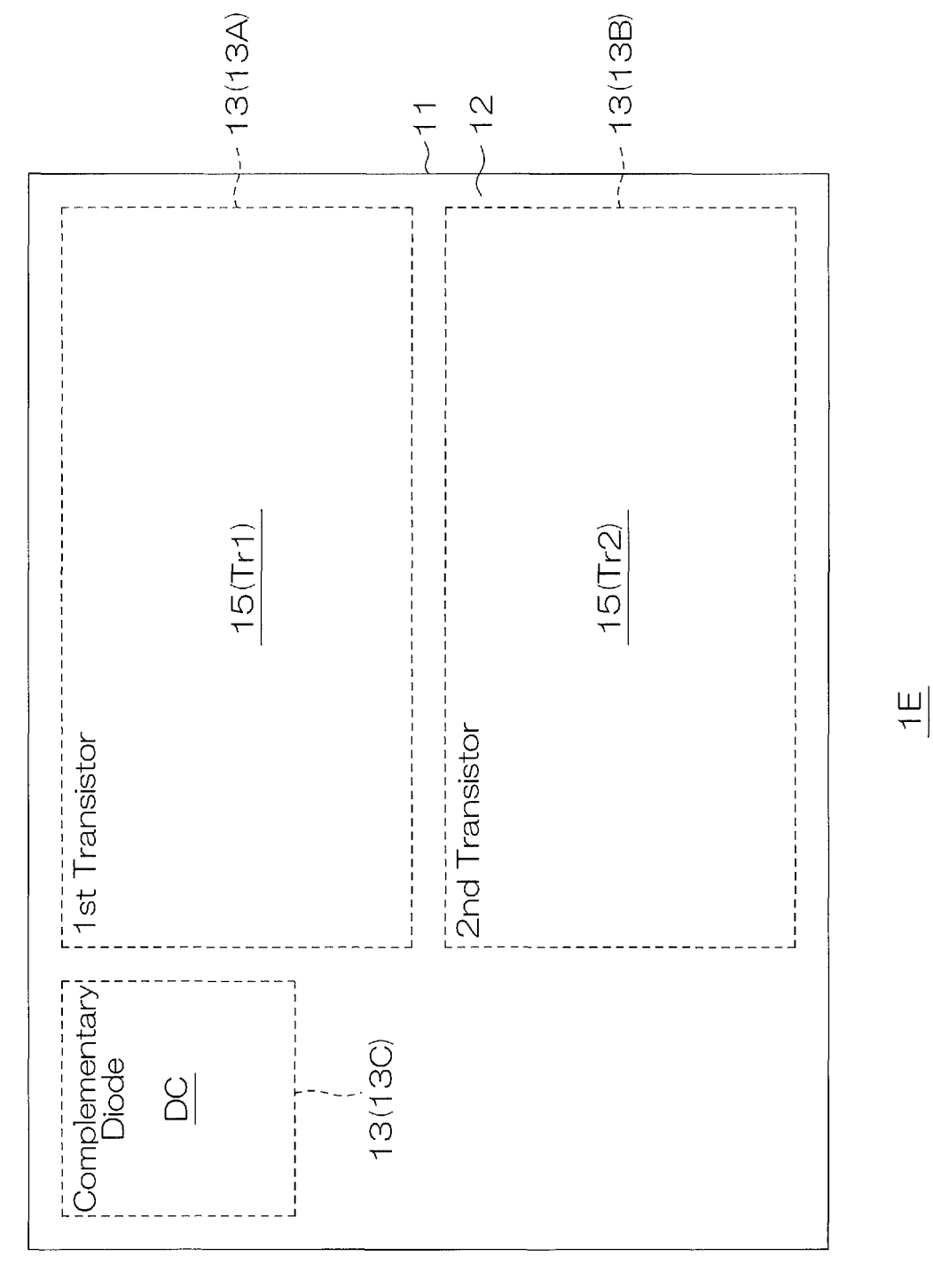
FIG. 31 is a schematic plan view showing a first configuration example of the rectifier shown in FIG. 29.
Figure 32:
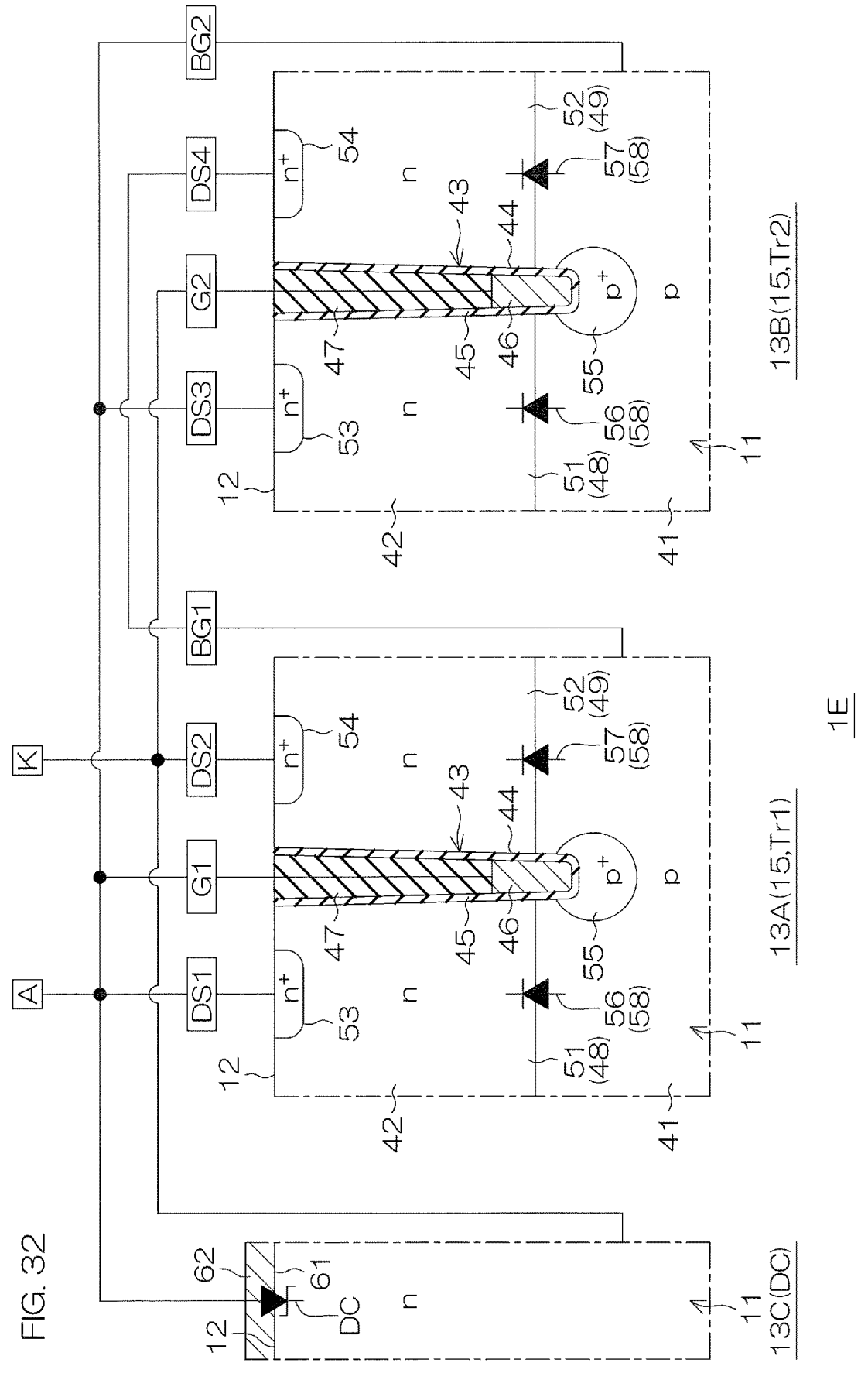
FIG. 32 is a schematic cross-sectional view of the rectifier shown in FIG. 31.

The rectifier 1E may have a configuration shown in FIG. 31 and FIG. 32. FIG. 31 is a schematic plan view showing a first configuration example of the rectifier 1E shown in FIG. 29. FIG. 32 is a schematic cross-sectional view of the rectifier 1E shown in FIG. 31. As shown in FIG. 31 and FIG. 32, the rectifier 1E includes the chip 11, the first circuit region 13A (first transistor Tr1), and the second circuit region 13B (second transistor Tr2) in the same way as the rectifier 1D according to the first configuration example (see FIG. 25 and FIG. 26).

The rectifier 1E also includes a third device region 13C provided in a region differing from both the first circuit region 13A and the second circuit region 13B in the main surface 12 of the chip 11. The third device region 13C is electrically separated from the first circuit region 13A and from the second circuit region 13B.

The rectifier 1E includes the complementary diode DC formed in the third device region 13C. In this embodiment, the complementary diode DC consists of a Schottky barrier diode. The complementary diode DC includes an n-type diode region 61 formed in the surface layer portion of the main surface 12 and a Schottky electrode 62 arranged on the main surface 12 so as to form a Schottky junction with the diode region 61.

Hence, the complementary diode DC (Schottky barrier diode) including the Schottky electrode 62 serving as an anode and the diode region 61 serving as a cathode is formed. The conductivity type of the diode region 61 may be a p-type. If the complementary diode DC consists of a pn junction diode, the complementary diode DC includes a p-type anode region formed in the surface layer portion of the main surface 12 and an n-type cathode region that forms a pn junction with the anode region.

The first transistor Tr1 and the second transistor Tr2 are electrically connected in the same way as the rectifier 1D according to the first configuration example (see FIG. 25 and FIG. 26). The Schottky electrode 62 (anode) of the complementary diode DC is electrically connected to the third drain source region 51 of the first transistor Tr1. The diode region 61 (cathode) of the complementary diode DC is electrically connected to the fourth drain source region 52 of the first transistor Tr1.

The thus formed electrical connection may be realized by forming a multilayer wiring structure on the main surface 12. In this case, the multilayer wiring structure includes a plurality of insulating films stacked on the main surface 12 and a plurality of wirings stacked and arranged in a multi-stage manner through a via electrode on the insulating films. In this case, the anode end A may be arranged on the multilayer wiring structure as an anode terminal. Also, the cathode end K may be arranged on the multilayer wiring structure as a cathode terminal. In other words, the rectifier 1E may be configured as a two-terminal device.

Figure 33:
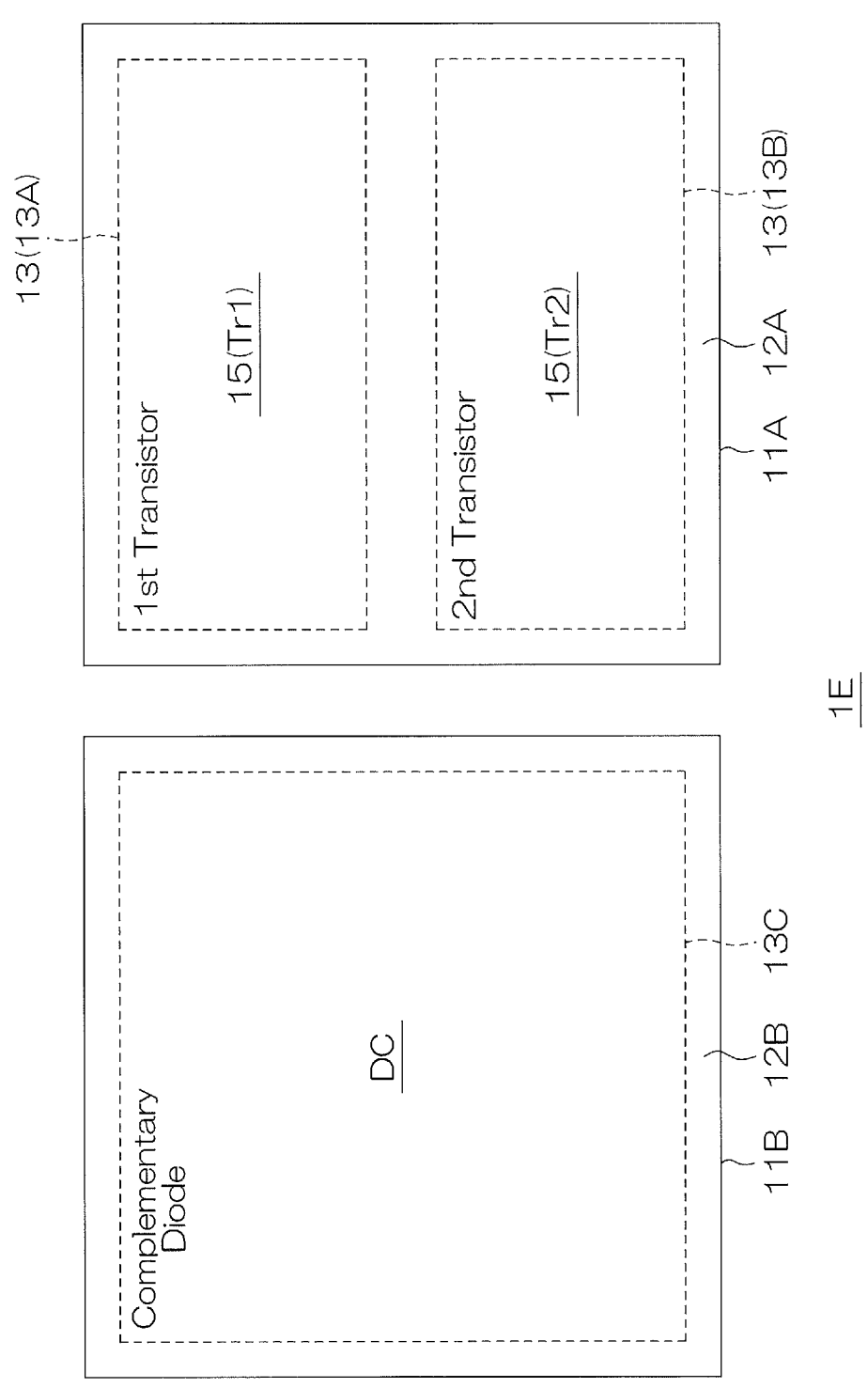
FIG. 33 is a schematic plan view showing a second configuration example of the rectifier shown in FIG. 29.
Figure 34:
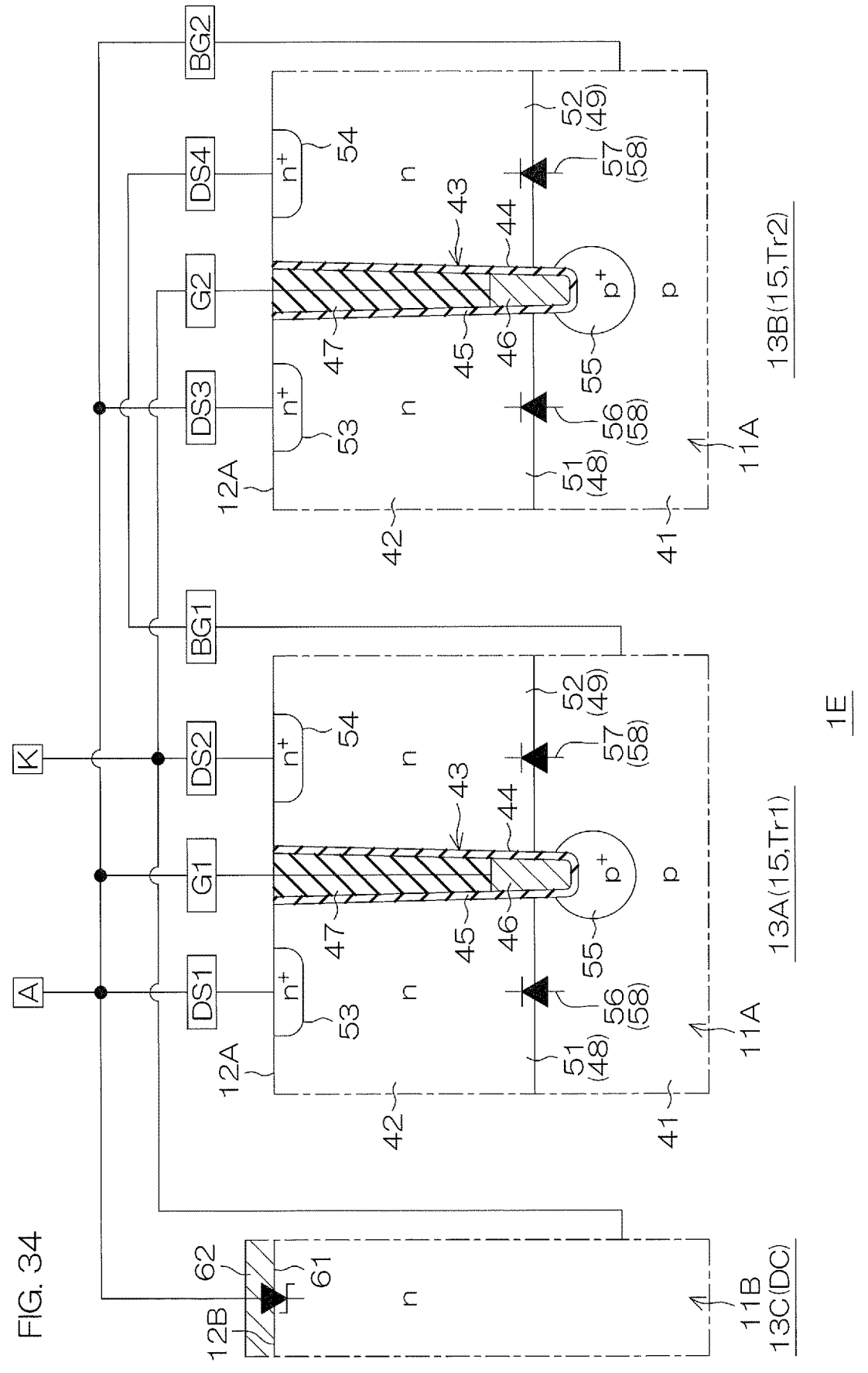
FIG. 34 is a schematic cross-sectional view of the rectifier shown in FIG. 33.

The rectifier 1E may have a configuration shown in FIG. 33 and FIG. 34. FIG. 33 is a schematic plan view showing a second configuration example of the rectifier 1E shown in FIG. 29. FIG. 34 is a schematic cross-sectional view of the rectifier 1E shown in FIG. 33. As shown in FIG. 33 and FIG. 34, the rectifier 1E may include the first chip 11A in which the first transistor Tr1 and the second transistor Tr2 are formed and the second chip 11B in which the complementary diode DC is formed.

The first chip 11A is formed in a rectangular parallelepiped shape, and has the quadrangular first main surface 12A. The first chip 11A may include an Si monocrystal or a monocrystal of a wide bandgap semiconductor (for example, SiC monocrystal). The rectifier 1E includes the first circuit region 13A (first transistor Tr1) formed in the first main surface 12A and the second circuit region 13B (second transistor Tr2) in the first chip 11A.

The second chip 11B is formed in a rectangular parallelepiped shape, and has a quadrangular second main surface 12B. The second chip 11B may include an Si monocrystal or a monocrystal of a wide bandgap semiconductor (for example, SiC monocrystal). The rectifier 1E includes the third device region 13C (complementary diode DC) formed in the second main surface 12B in the second chip 11B. The first transistor Tr1, the second transistor Tr2, and the complementary diode DC are electrically connected in the same way as in the first configuration example.

Figure 35:
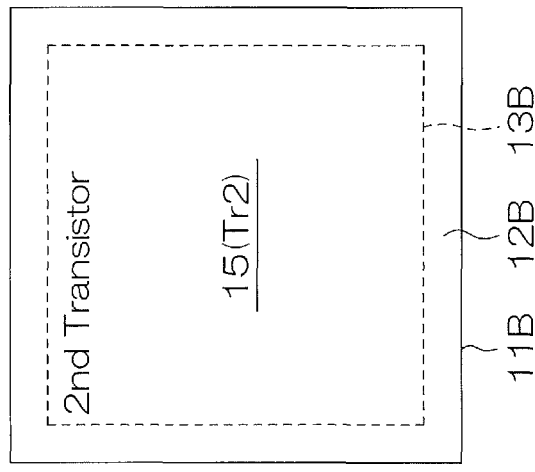
FIG. 35 is a schematic plan view showing a third configuration example of the rectifier shown in FIG. 29.
Figure 35:
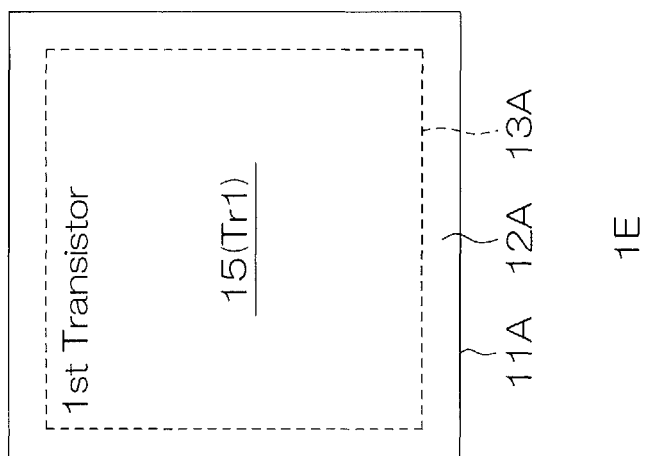
Figure 35:
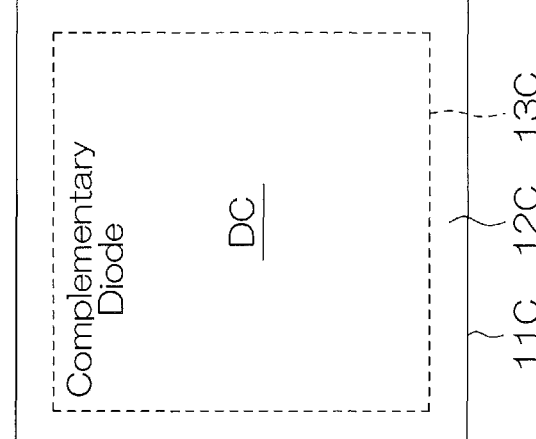
Figure 36:
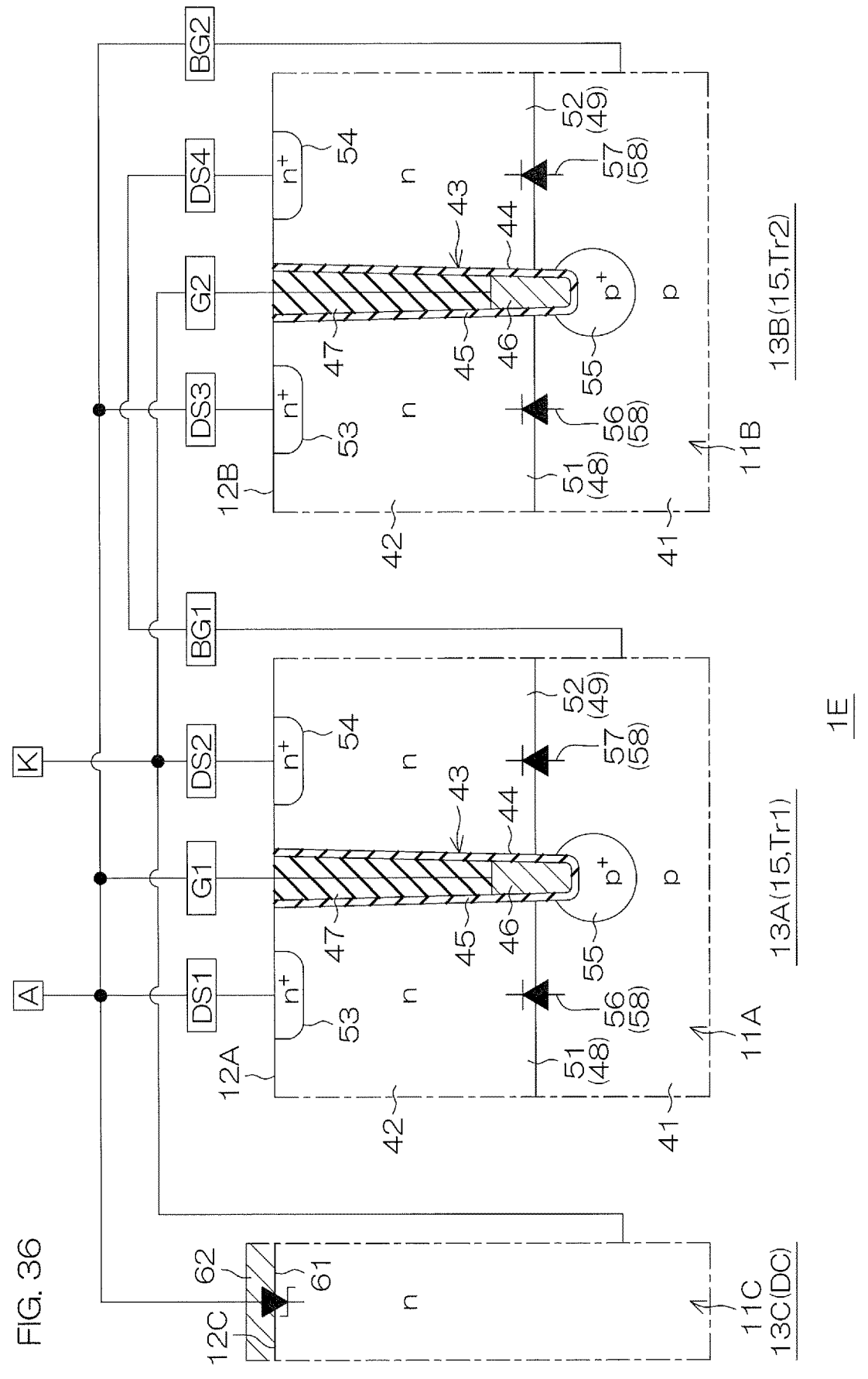
FIG. 36 is a schematic cross-sectional view of the rectifier shown in FIG. 35.

The rectifier 1E may have a configuration shown in FIG. 35 and FIG. 36. FIG. 35 is a schematic plan view showing a third configuration example of the rectifier 1E shown in FIG. 29. FIG. 36 is a schematic cross-sectional view of the rectifier 1E shown in FIG. 35. As shown in FIG. and FIG. 36, the rectifier 1E may include the first chip 11A in which the first transistor Tr1 is formed, the second chip 11B in which the second transistor Tr2 is formed, and a third chip 11C in which the complementary diode DC is formed.

The first chip 11A is formed in a rectangular parallelepiped shape, and has the quadrangular first main surface 12A. The first chip 11A may include an Si monocrystal or a monocrystal of a wide bandgap semiconductor (for example, SiC monocrystal). The rectifier 1E includes the first circuit region 13A (first transistor Tr1) formed in the first main surface 12A in the first chip 11A.

The second chip 11B is formed in a rectangular parallelepiped shape, and has the quadrangular first main surface 12A. The second chip 11B may include an Si monocrystal or a monocrystal of a wide bandgap semiconductor (for example, SiC monocrystal). The rectifier 1E includes the second circuit region 13B (second transistor Tr2) formed in the second main surface 12B in the second chip 11B.

The third chip 11C is formed in a rectangular parallelepiped shape, and has a quadrangular third main surface 12C. The third chip 11C may include an Si monocrystal or a monocrystal of a wide bandgap semiconductor (for example, SiC monocrystal). The rectifier 1E includes the third device region 13C (complementary diode DC) formed in the third main surface 12C in the third chip 11C. The first transistor Tr1, the second transistor Tr2, and the complementary diode DC are electrically connected in the same way as in the first configuration example.

Figure 37:
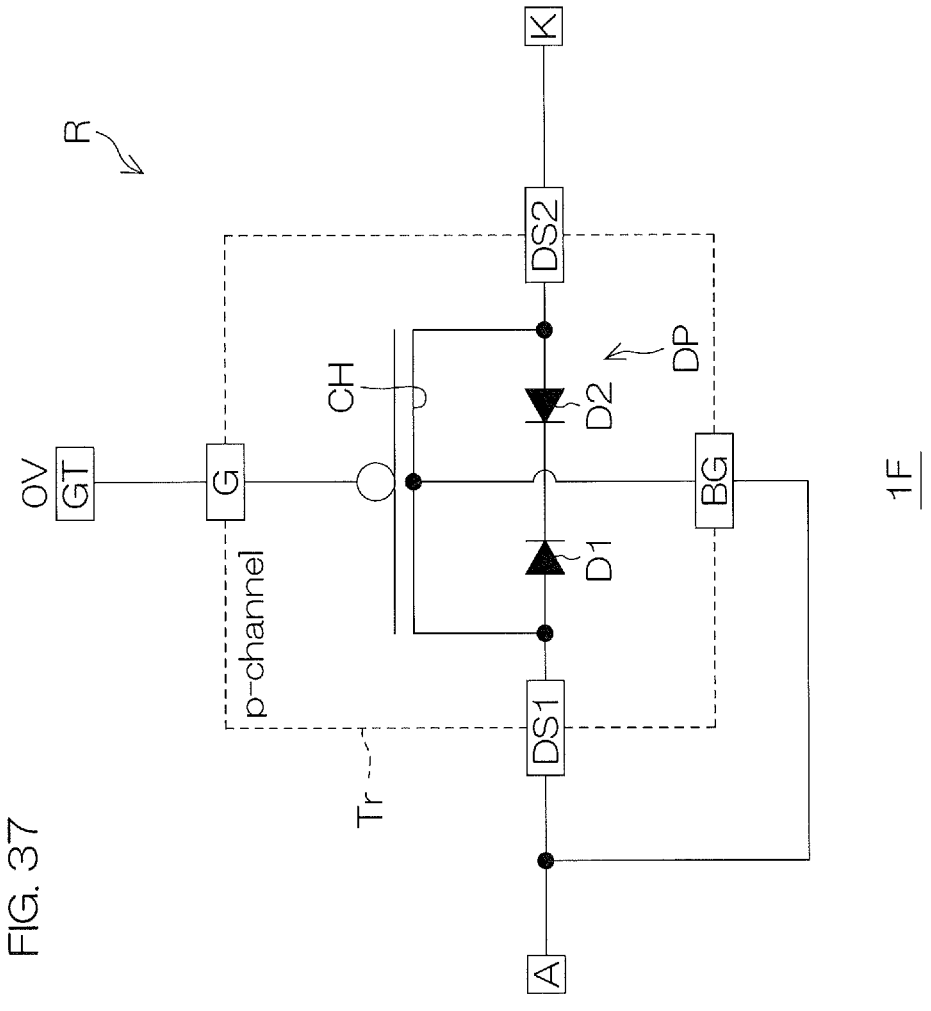
FIG. 37 is a circuit diagram showing an electrical configuration of a rectifier according to a sixth embodiment.

FIG. 37 is a circuit diagram showing an electrical configuration of a rectifier 1F according to a sixth embodiment. Referring to FIG. 37, the rectifier 1F includes a transistor Tr of a drain/source common field effect type of a p-channel. The transistor Tr may be an Si transistor formed in an Si monocrystal, or may be a wide bandgap semiconductor transistor formed in a monocrystal of a wide bandgap semiconductor. The transistor Tr may be an SiC transistor formed in an SiC monocrystal as an example of the wide bandgap semiconductor.

The transistor Tr has a gate G, the first drain source DS1, the second drain source DS2, a back gate BG, and a diode pair DP. Each of the first drain source DS1 and the second drain source DS2 integrally includes a source and a drain.

The diode pair DP includes the first body diode D1 and the second body diode D2 that are reverse bias connected so as to be a cathode common, and is electrically connected to the first drain source DS1 and to the second drain source DS2. The first body diode D1 is a pn junction diode, and the second body diode D2 is a pn junction diode.

The first body diode D1 includes an anode that is electrically connected to the first drain source DS1 and a cathode that forms a node with respect to the second body diode D2. The second body diode D2 includes an anode electrically connected to the second drain source DS2 and a cathode electrically connected to the cathode of the first body diode D1.

The transistor Tr has a gate threshold voltage Vgth, a breakdown voltage VB, and an on-resistance Ron. The gate threshold voltage Vgth, the breakdown voltage VB, and the on-resistance Ron correspond to the aforementioned first gate threshold voltage Vgth1, the aforementioned first breakdown voltage VB1, and the aforementioned first on-resistance Ron1, respectively.

The rectifier stage R is configured by allowing the gate G to be fixed at a zero potential and by allowing the back gate BG to be electrically connected to the first drain source DS1. In other words, the rectifier 1F has a gate end GT serving as a zero-potential application end. The first drain source DS1 is electrically connected to the anode end A, and the second drain source DS2 is electrically connected to the cathode end K.

Figure 38A:
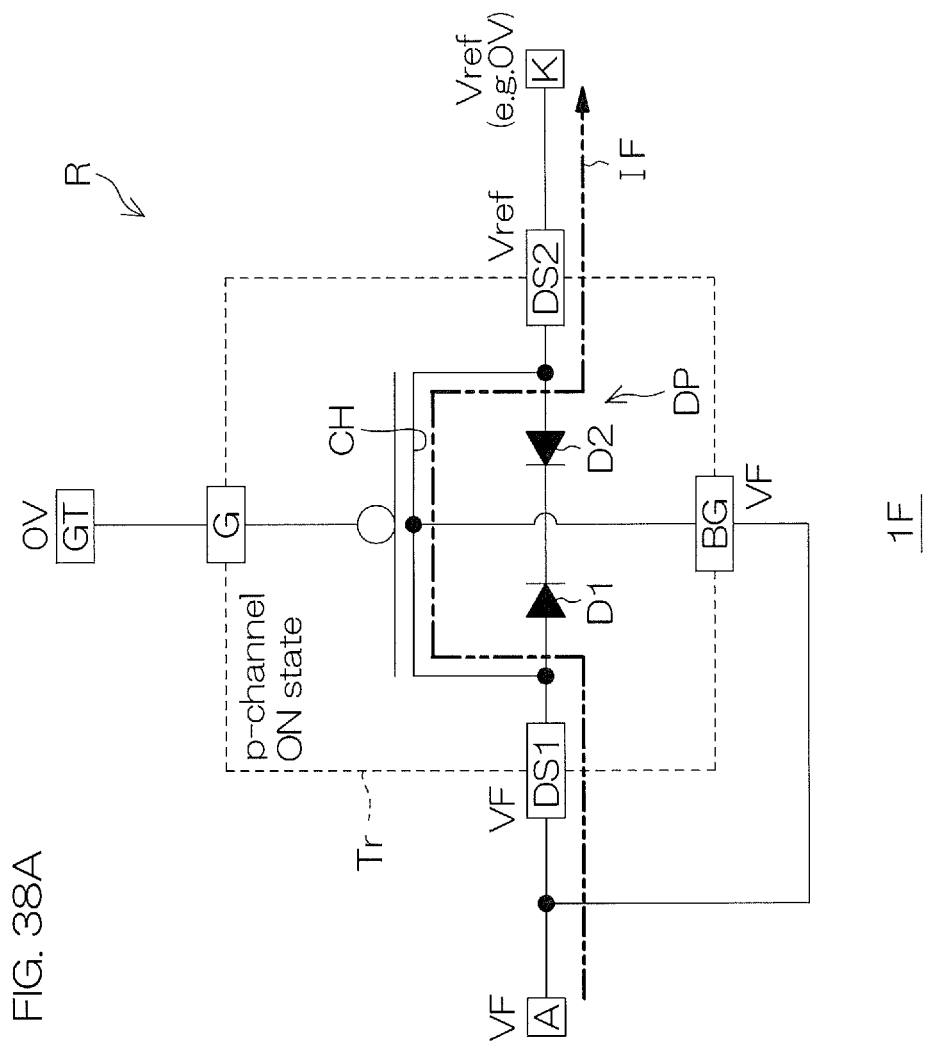
FIG. 38A is a circuit diagram showing a forward operation of the rectifier shown in FIG. 37.
Figure 38B:
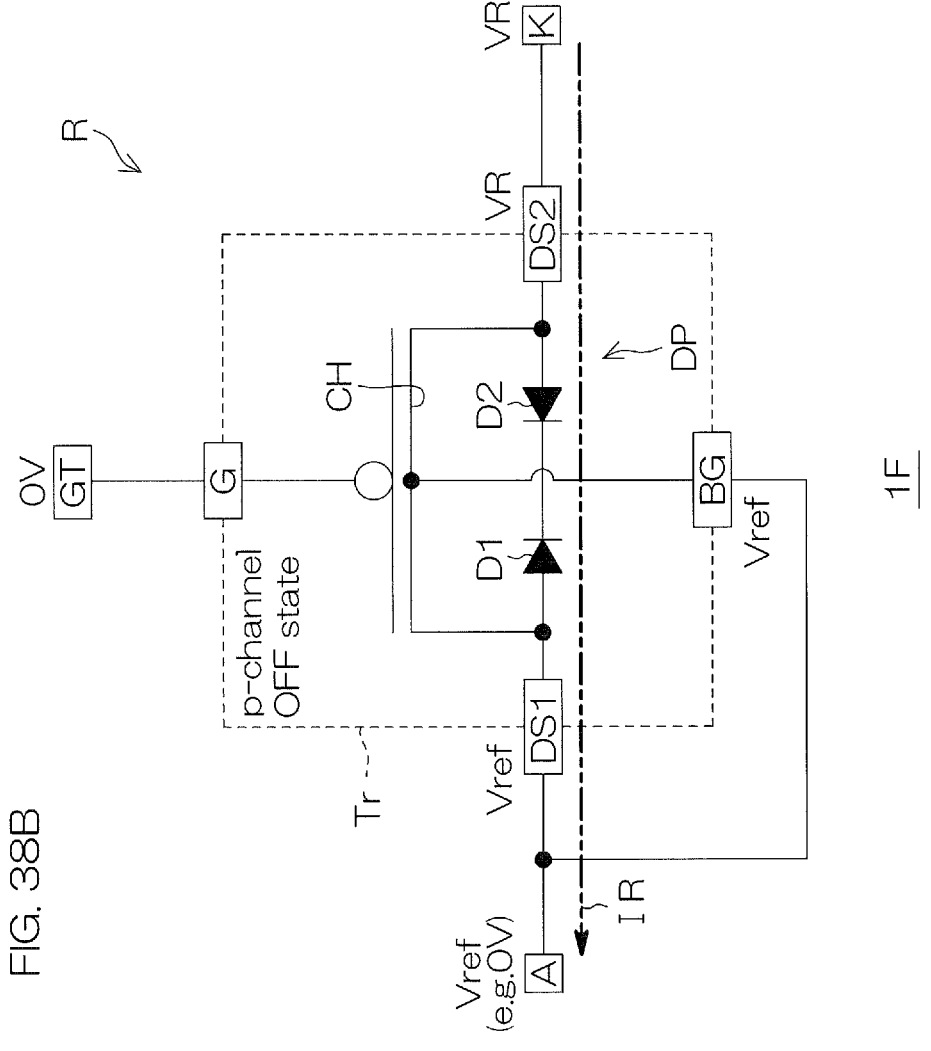
FIG. 38B is a circuit diagram showing a reverse operation of the rectifier shown in FIG. 37.

FIG. 38A is a circuit diagram showing a forward operation of the rectifier 1F shown in FIG. 37. FIG. 38B is a circuit diagram showing a reverse operation of the rectifier 1F shown in FIG. 37. Referring to FIG. 38A and FIG. 38B, the forward current IF flows to the transistor Tr in the forward operation, and the reverse current IR flows to the transistor Tr in the reverse operation.

In detail, in the forward operation, a forward potential VF based on the second drain source DS2 is applied to the first drain source DS1, and the forward current IF flows from the first drain source DS1 toward the second drain source DS2 with reference to FIG. 38A. In FIG. 38A, a circuit operation is shown when a reference potential Vref (for example, ground potential) is applied to the second drain source DS2 and when the forward potential VF is applied to the first drain source DS1.

In the forward operation, the gate G is fixed at a zero potential, the first drain source DS1 and the back gate BG are fixed at the forward potential VF, and the second drain source DS2 is fixed at the reference potential Vref. Therefore, the transistor Tr reaches an OFF state when the forward voltage VF is less than the gate threshold voltage Vgth, and the transistor Tr reaches an ON state when the forward voltage VF is equal to or more than the gate threshold voltage Vgth.

The forward current IF flows from the first drain source DS1 toward the second drain source DS2 through a channel CH of the transistor Tr when the transistor Tr reaches an ON state. In other words, the transistor Tr has the gate threshold voltage Vgth that becomes equal to the threshold voltage Vth of the rectifier stage R. Also, the transistor Tr passes a first drain-source DS1 current that becomes equal to the forward current IF of the rectifier stage R. In other words, the characteristic of the forward current IF coincides with the characteristic of the drain-source current of the transistor Tr.

Referring to FIG. 38B, in the reverse operation, the reverse potential VR based on the first drain source DS1 is applied to the second drain source DS2, and the reverse current IR flows from the second drain source DS2 toward the first drain source DS1. In FIG. 38B, a circuit operation is shown when the reference potential Vref (for example, ground potential) is applied to the first drain source DS1 and when the reverse potential VR is applied to the second drain source DS2.

In the reverse operation, the gate G is fixed at a zero potential, the first drain source DS1 and the back gate BG are fixed at the reference potential Vref, and the second drain source DS2 is fixed at the reverse potential VR. Therefore, the transistor Tr reaches an OFF state. When the reverse voltage VR is less than the breakdown voltage VB, a leak current serving as the reverse current IR flows between the first drain source DS1 and the second drain source DS2.

When the reverse voltage VR is equal to or more than the breakdown voltage VB, the diode pair DP breaks down, and a breakdown current serving as the reverse current IR flows between the first drain source DS1 and the second drain source DS2. In other words, the characteristic of the reverse current IR coincides with the characteristic of the diode pair DP. Both the characteristic of the leak current and the characteristic of the breakdown current depend on the characteristic of the diode pair DP.

The rectifier 1F includes the p-channel drain/source common field effect type transistor Tr as described above. The transistor Tr configures the rectifier stage R. In detail, the transistor Tr has the gate G fixed at a zero potential, the first drain source DS1 that functions as an anode of the rectifier stage R, the second drain source DS2 that functions as a cathode of the rectifier stage R, and the back gate BG electrically connected to the first drain source DS1.

This structure makes it possible to provide the rectifier 1F having a novel configuration in the same way as the rectifier 1A. In detail, this structure makes it possible to provide the rectifier 1F having electrical properties that cannot be realized by the pn junction diode (first reference rectifier R1) or by the Schottky barrier diode (second reference rectifier R2) (see also FIG. 4, etc.).

Figure 39:
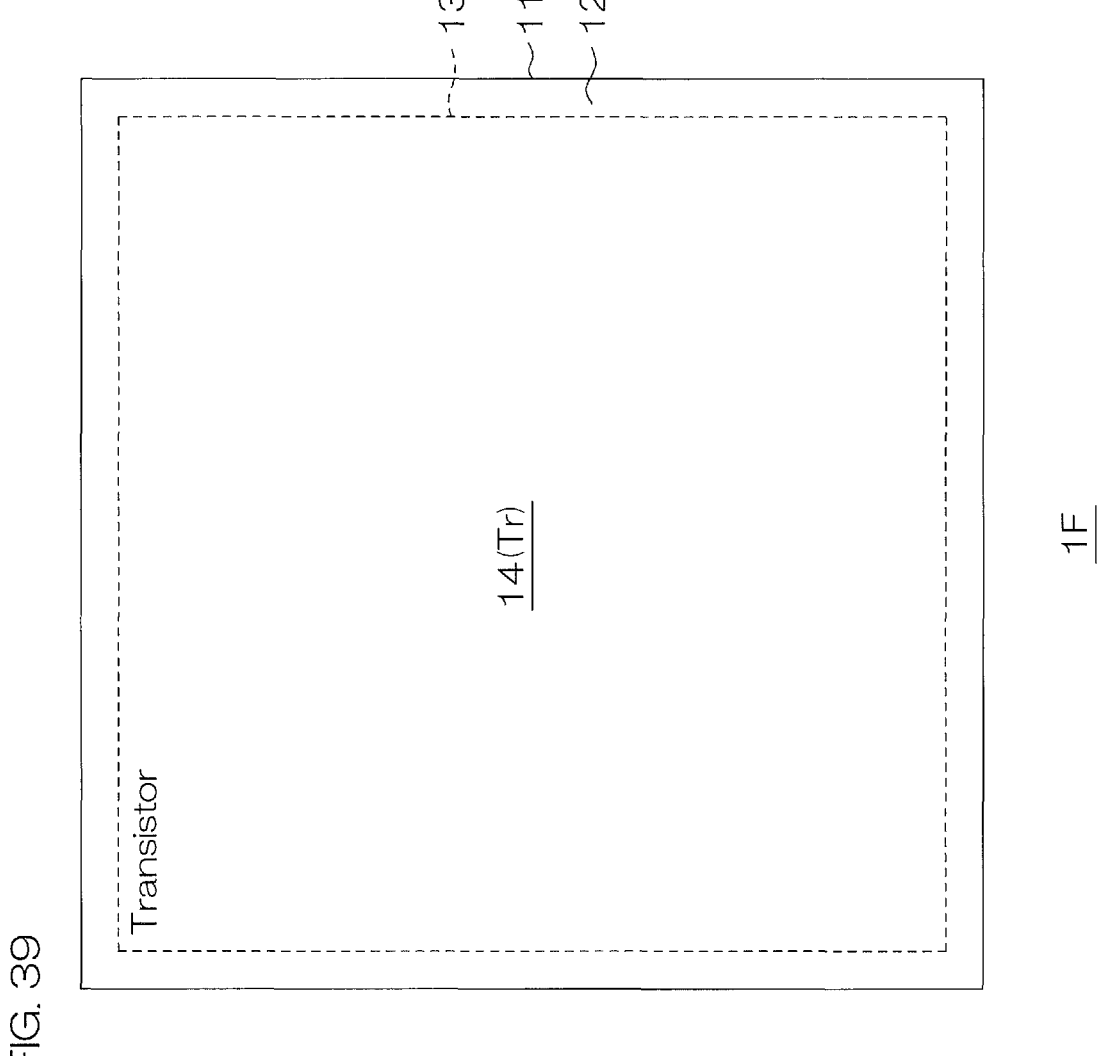
FIG. 39 is a schematic plan view showing a configuration example of the rectifier shown in FIG. 37.
Figure 40:
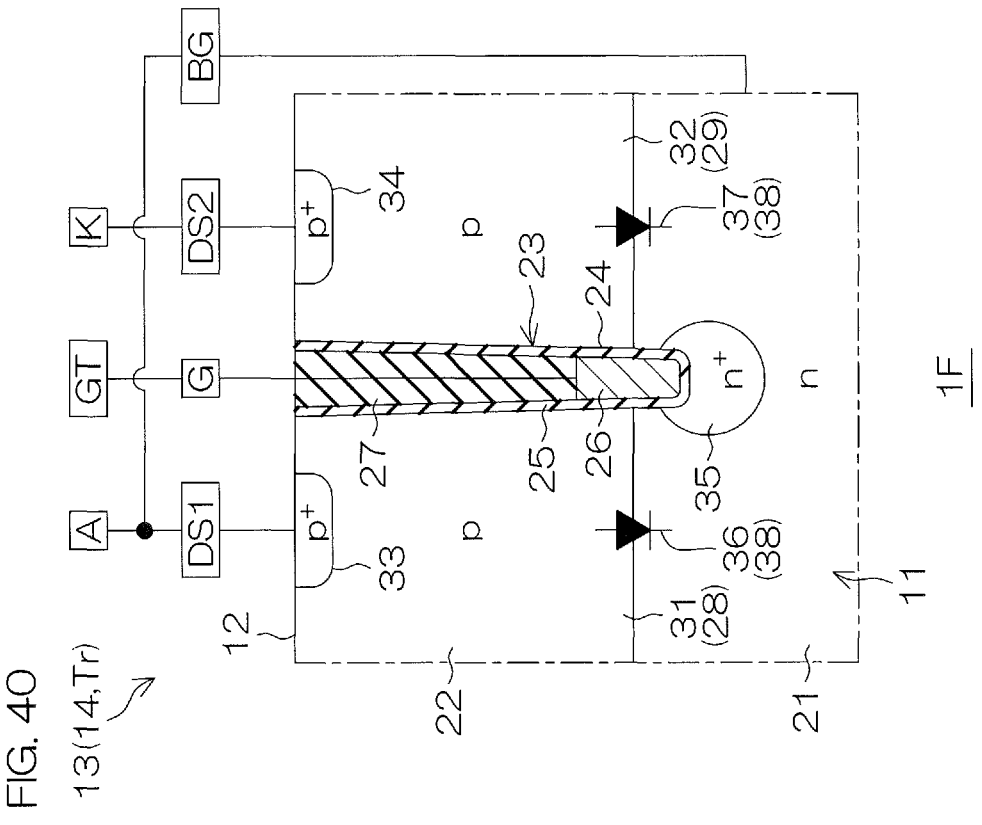
FIG. 40 is a schematic cross-sectional view of the rectifier shown in FIG. 39.

FIG. 39 is a schematic plan view showing a configuration example of the rectifier 1F shown in FIG. 37. FIG. 40 is a schematic cross-sectional view of the rectifier 1F shown in FIG. 39. As shown in FIG. 39 and FIG. 40, the rectifier 1F may have a single chip structure including the chip 11 in which the transistor Tr is formed. In the rectifier 1F, the p-type transistor structure 14 serving as the transistor Tr is formed in the circuit region 13.

The gate G, the first drain source DS1, the second drain source DS2, the back gate BG, the channel CH, and the diode pair DP of the transistor Tr are configured by the first trench gate structure 23, the first drain source region 31 (first contact region 33), the second drain source region 32 (second contact region 34), the first back gate region 21, the first channel region 35 (part of the first back gate region 21), and the first diode pair portion 38 of the p-type transistor structure 14, respectively.

The p-type transistor structure 14 includes the first trench gate structure 23 fixed at a zero potential and the first back gate region 21 electrically connected to the first drain source region 31. The thus formed electrical connection may be realized by forming a multilayer wiring structure on the main surface 12. In this case, the multilayer wiring structure includes a plurality of insulating films stacked on the main surface 12 and a plurality of wirings stacked and arranged in a multistage manner through a via electrode on the insulating films.

In this case, the rectifier 1F may include an anode terminal serving as the anode end A arranged on the multilayer wiring structure, a cathode terminal serving as the cathode end K arranged on the multilayer wiring structure, and a gate terminal serving as the gate end GT arranged on the multilayer wiring structure. In other words, the rectifier 1F may be configured as a three-terminal device.

Of course, the thus formed electrical connection may be realized by a plurality of wirings formed on a mount board, such as PCB. In this case, the anode end A, the cathode end K, and the gate end GT may be formed by the wirings on the mount board. Also, the thus formed electrical connection may be realized by devising a connection mode of a plurality of bonding wires, lead terminals, and the like in a package in which the chip 11 has been mounted. In this case, the anode end A, the cathode end K, and the gate end GT may be formed by lead terminals arranged in the package.

Figure 41:
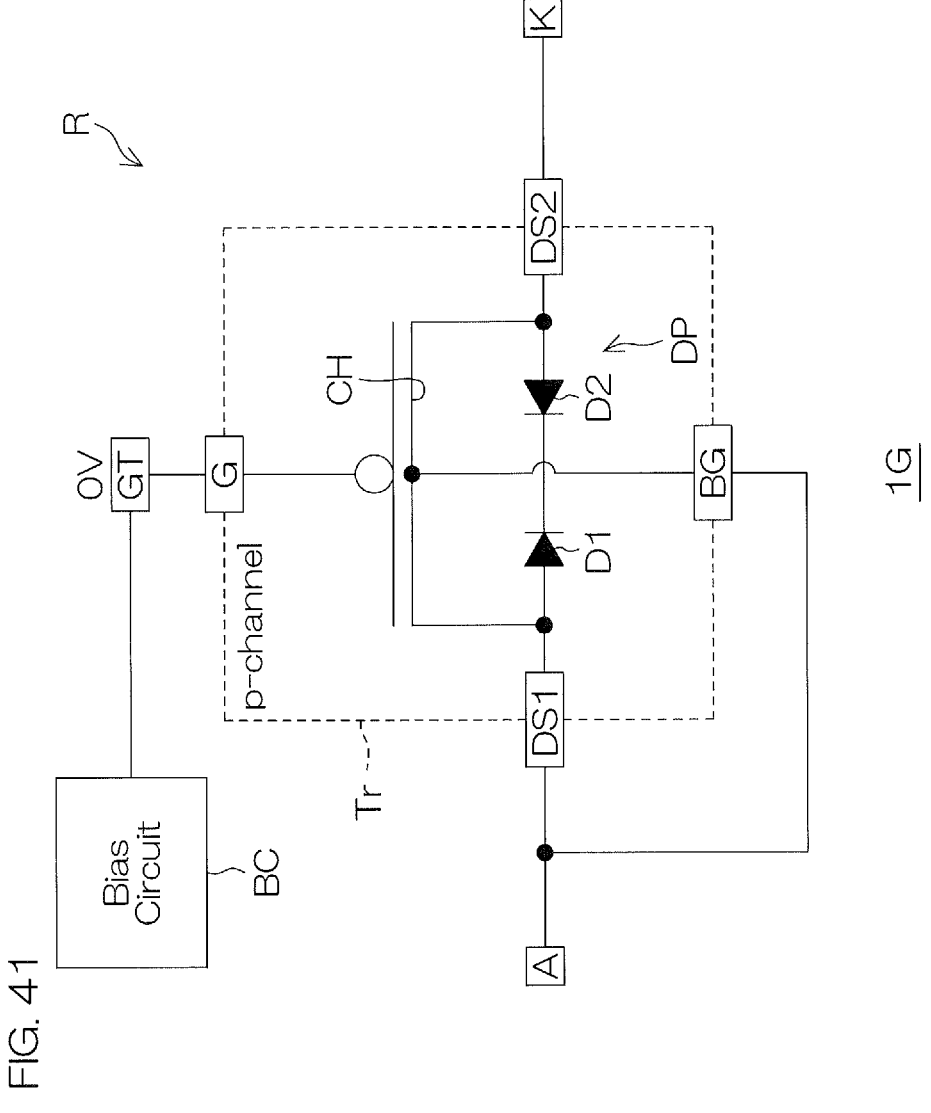
FIG. 41 is a circuit diagram showing an electrical configuration of a rectifier according to a seventh embodiment.

FIG. 41 is a circuit diagram showing an electrical configuration of a rectifier 1G according to a seventh embodiment. Referring to FIG. 41, the rectifier 1G also includes a bias circuit BC electrically connected to the gate G so as to fix the gate G at a zero potential in the aforementioned rectifier 1F. The bias circuit BC may be configured by a single circuit device such as the second transistor Tr2 according to the first and second embodiments mentioned above.

Of course, the bias circuit BC may be configured by a plurality of circuit devices. Also, the configuration of the bias circuit BC is optional as long as the gate G can be fixed at a zero potential, and various circuit configurations (circuit devices) can be included. Also, the bias circuit BC may be formed in the single chip 11 together with the transistor Tr in the rectifier 1F according to the first configuration example (see FIG. 40). In this case, it is recommended to provide a circuit region 13 used for the bias circuit BC at the main surface 12 and to form the bias circuit BC in the circuit region 13. Of course, the bias circuit BC may be realized by using a single or a plurality of chips differing from the transistor Tr.

Figure 42:
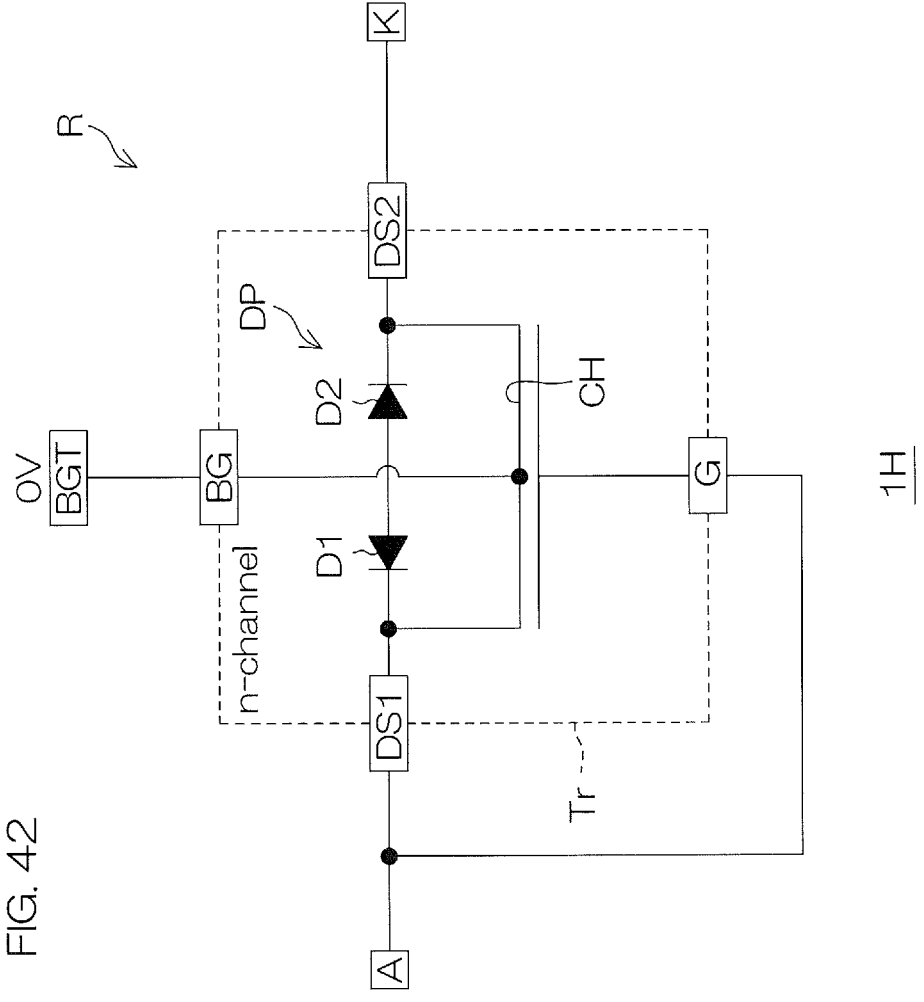
FIG. 42 is a circuit diagram showing an electrical configuration of a rectifier according to an eighth embodiment.

FIG. 42 is a circuit diagram showing an electrical configuration of a rectifier 1H according to an eighth embodiment. Referring to FIG. 42, the rectifier 1H includes the transistor Tr of a drain/source common field effect type of an n-channel. The transistor Tr may be an Si transistor formed in an Si monocrystal, or may be a wide bandgap semiconductor transistor formed in a monocrystal of a wide bandgap semiconductor. The transistor Tr may be an SiC transistor formed in an SiC monocrystal as an example of the wide bandgap semiconductor.

The transistor Tr has the gate G, the first drain source DS1, the second drain source DS2, the back gate BG, and the diode pair DP. Each of the first drain source DS1 and the second drain source DS2 integrally includes a source and a drain.

The diode pair DP includes the first body diode D1 and the second body diode D2 that are reverse bias connected so as to be an anode common, and is electrically connected to the first drain source DS1 and to the second drain source DS2. The first body diode D1 is a pn junction diode, and second body diode D2 is a pn junction diode.

The first body diode D1 includes an anode that forms a node with respect to the second body diode D2 and a cathode that is electrically connected to the first drain source DS1. The second body diode D2 includes an anode electrically connected to the anode of the first body diode D1 and a cathode electrically connected to the second drain source DS2.

The transistor Tr has the gate threshold voltage Vgth, the breakdown voltage VB, and the on-resistance Ron. The gate threshold voltage Vgth, the breakdown voltage VB, and the on-resistance Ron correspond to the aforementioned first gate threshold voltage Vgth1, the aforementioned first breakdown voltage VB1, and the aforementioned first on-resistance Ron1, respectively.

The rectifier stage R is configured by allowing the first drain source DS1 to be electrically connected to the gate G and by allowing the back gate BG to be fixed at a zero potential. In other words, the rectifier 1H has a back gate end BGT serving as a zero-potential application end. The first drain source DS1 is electrically connected to the anode end A, and the second drain source DS2 is electrically connected to the cathode end K.

Figure 43A:
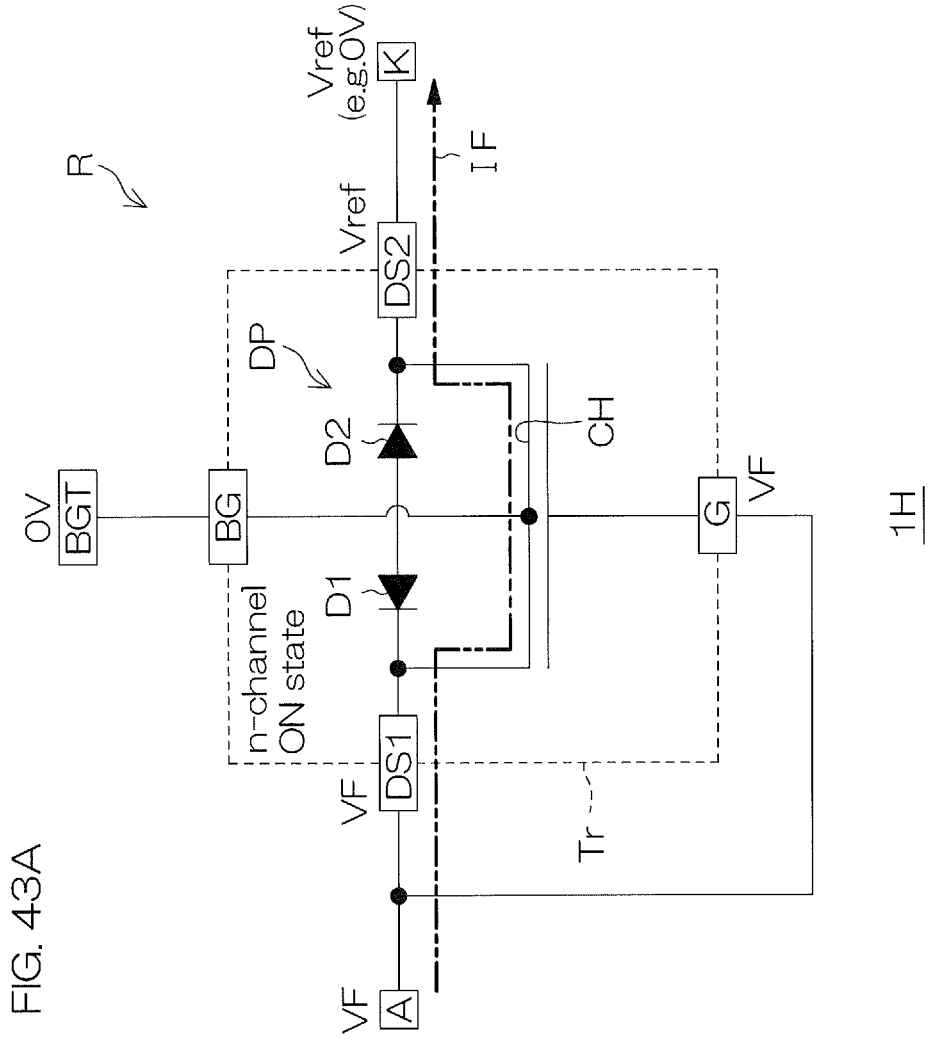
FIG. 43A is a circuit diagram showing a forward operation of the rectifier shown in FIG. 42.
Figure 43B:
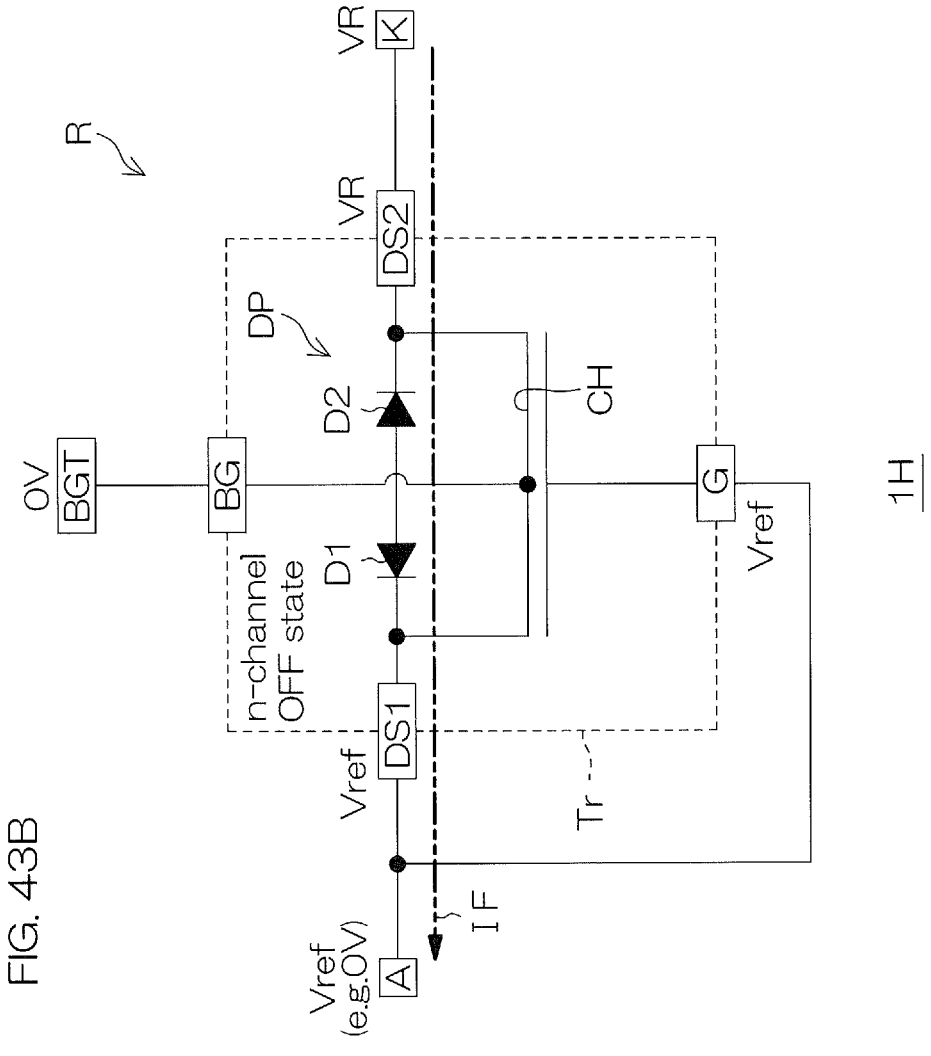
FIG. 43B is a circuit diagram showing a reverse operation of the rectifier shown in FIG. 42.

FIG. 43A is a circuit diagram showing a forward operation of the rectifier 1H shown in FIG. 42. FIG. 43B is a circuit diagram showing a reverse operation of the rectifier 1H shown in FIG. 42. Referring to FIG. 43A and FIG. 43B, the forward current IF flows to the transistor Tr in the forward operation, and the reverse current IR flows to the transistor Tr in the reverse operation.

In detail, in the forward operation, a forward potential VF based on the second drain source DS2 is applied to the first drain source DS1, and the forward current IF flows from the first drain source DS1 toward the second drain source DS2 with reference to FIG. 43A. In FIG. 43A, a circuit operation is shown when a reference potential Vref (for example, ground potential) is applied to the second drain source DS2 and when the forward potential VF is applied to the first drain source DS1.

In the forward operation, the gate G and the first drain source DS1 are fixed at the forward potential VF, the back gate BG is fixed at a zero potential, and the second drain source DS2 is fixed at the reference potential Vref. Therefore, the transistor Tr reaches an OFF state when the forward voltage VF is less than the gate threshold voltage Vgth, and the transistor Tr reaches an ON state when the forward voltage VF is equal to or more than the gate threshold voltage Vgth.

The forward current IF flows from the first drain source DS1 toward the second drain source DS2 through a channel CH of the transistor Tr when the transistor Tr reaches an ON state. In other words, the transistor Tr has the gate threshold voltage Vgth that becomes equal to the threshold voltage Vth of the rectifier stage R. Also, the transistor Tr passes a drain-source current that becomes equal to the forward current IF of the rectifier stage R. In other words, the characteristic of the forward current IF coincides with the characteristic of the drain-source current of the transistor Tr.

Referring to FIG. 43B, in the reverse operation, the reverse potential VR based on the first drain source DS1 is applied to the second drain source DS2, and the reverse current IR flows from the second drain source DS2 toward the first drain source DS1. In FIG. 43B, a circuit operation is shown when the reference potential Vref (for example, ground potential) is applied to the first drain source DS1 and when the reverse potential VR is applied to the second drain source DS2.

In the reverse operation, the gate G and the first drain source DS1 are fixed at the reference potential Vref, the back gate BG is fixed at a zero potential, and the second drain source DS2 is fixed at the reverse potential VR. Therefore, the transistor Tr reaches an OFF state. When the reverse voltage VR is less than the breakdown voltage VB, a leak current serving as the reverse current IR flows between the first drain source DS1 and the second drain source DS2.

When the reverse voltage VR is equal to or more than the breakdown voltage VB, the diode pair DP breaks down, and a breakdown current serving as the reverse current IR flows between the first drain source DS1 and the second drain source DS2. In other words, the characteristic of the reverse current IR coincides with the characteristic of the diode pair DP. Both the characteristic of the leak current and the characteristic of the breakdown current depend on the characteristic of the diode pair DP.

The rectifier 1H includes the n-channel drain/source common field effect type transistor Tr as described above. The transistor Tr configures the rectifier stage R. In detail, the transistor Tr has the gate G, the first drain source DS1 that is electrically connected to the gate G and that functions as an anode of the rectifier stage R, the second drain source DS2 that functions as a cathode of the rectifier stage R, and the back gate BG fixed at a zero potential.

This structure makes it possible to provide the rectifier 1H having a novel configuration in the same way as the rectifier 1A. In detail, this structure makes it possible to provide the rectifier 1H having electrical properties that cannot be realized by the pn junction diode (first reference rectifier R1) or by the Schottky barrier diode (second reference rectifier R2) (see also FIG. 4, etc.).

Figure 44:
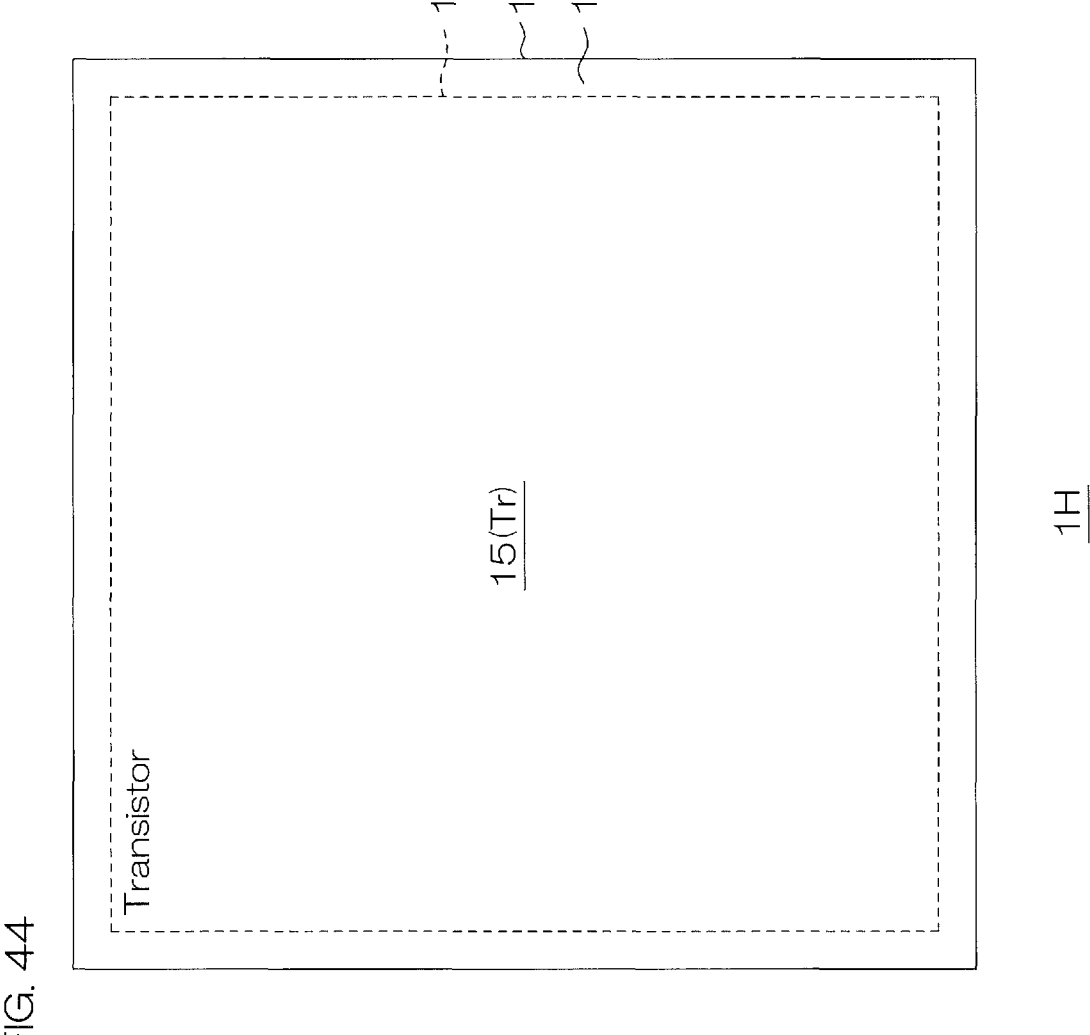
FIG. 44 is a schematic plan view showing a configuration example of the rectifier shown in FIG. 42.
Figure 45:
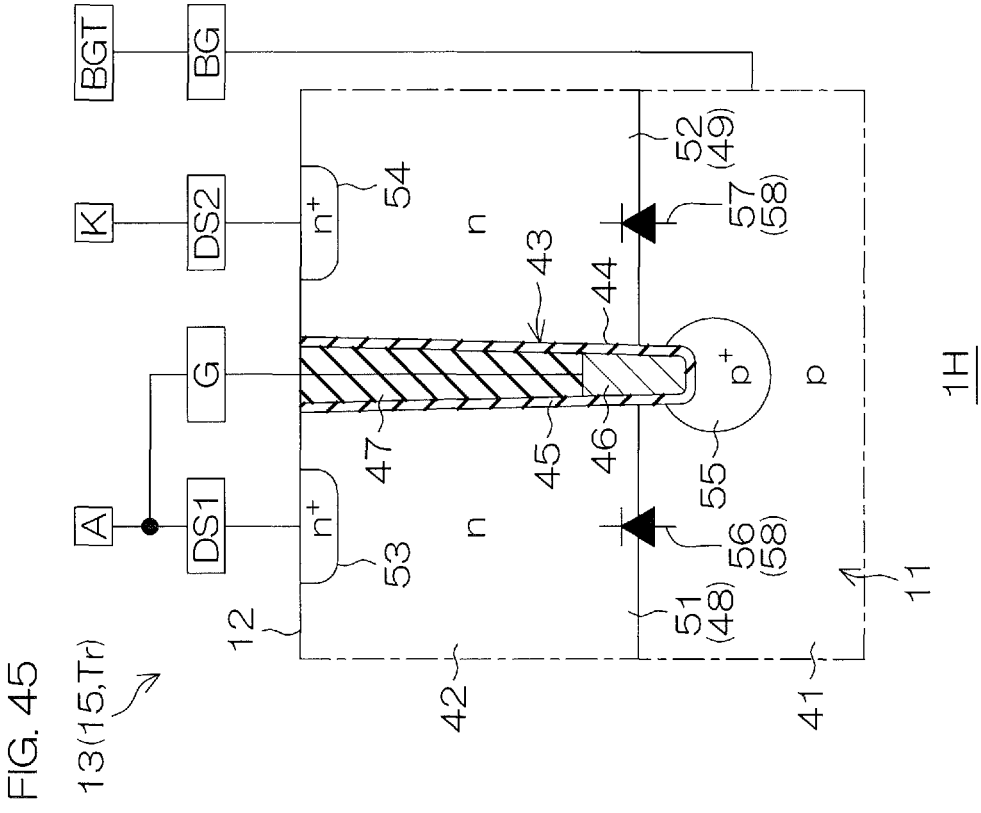
FIG. 45 is a schematic cross-sectional view of the rectifier shown in FIG. 44.

FIG. 44 is a schematic plan view showing a configuration example of the rectifier 1H shown in FIG. 42. FIG. 45 is a schematic cross-sectional view of the rectifier 1H shown in FIG. 44. As shown in FIG. 44 and FIG. 45, the rectifier 1H may have a single chip structure including the chip 11 in which the transistor Tr is formed. In the rectifier 1H, the n-type transistor structure 15 serving as the transistor Tr is formed in the circuit region 13.

The gate G, the first drain source DS1, the second drain source DS2, the back gate BG, the channel CH, and the diode pair DP of the transistor Tr are configured by the second trench gate structure 43, the third drain source region 51 (the third contact region 53), the fourth drain source region 52 (the fourth contact region 54), the second back gate region 41, the second channel region 55 (part of the second back gate region 41), and the second diode pair portion 58 of the n-type transistor structure 15, respectively.

The n-type transistor structure 15 includes the third drain source region 51 electrically connected to the second trench gate structure 43 and the second back gate region 41 fixed at a zero potential. The thus formed electrical connection may be realized by forming a multilayer wiring structure on the main surface 12. In this case, the multilayer wiring structure includes a plurality of insulating films stacked on the main surface 12 and a plurality of wirings stacked and arranged in a multistage manner through a via electrode on the insulating films.

In this case, the rectifier 1H may include an anode terminal serving as the anode end A arranged on the multilayer wiring structure, a cathode terminal serving as the cathode end K arranged on the multilayer wiring structure, and a back gate terminal serving as the back gate end BGT arranged on the multilayer wiring structure. In other words, the rectifier 1H may be configured as a three-terminal device. Of course, the back gate terminal may be provided on the rear surface side of the chip 11.

Of course, the thus formed electrical connection may be realized by a plurality of wirings formed on a mount board, such as PCB. In this case, the anode end A, the cathode end K, and the back gate end BGT may be formed by the wirings on the mount board. Also, the thus formed electrical connection may be realized by devising a connection mode of a plurality of bonding wires, lead terminals, and the like in a package in which the chip 11 has been mounted. In this case, the anode end A, the cathode end K, and the back gate end BGT may be formed by lead terminals arranged in the package.

Figure 46:
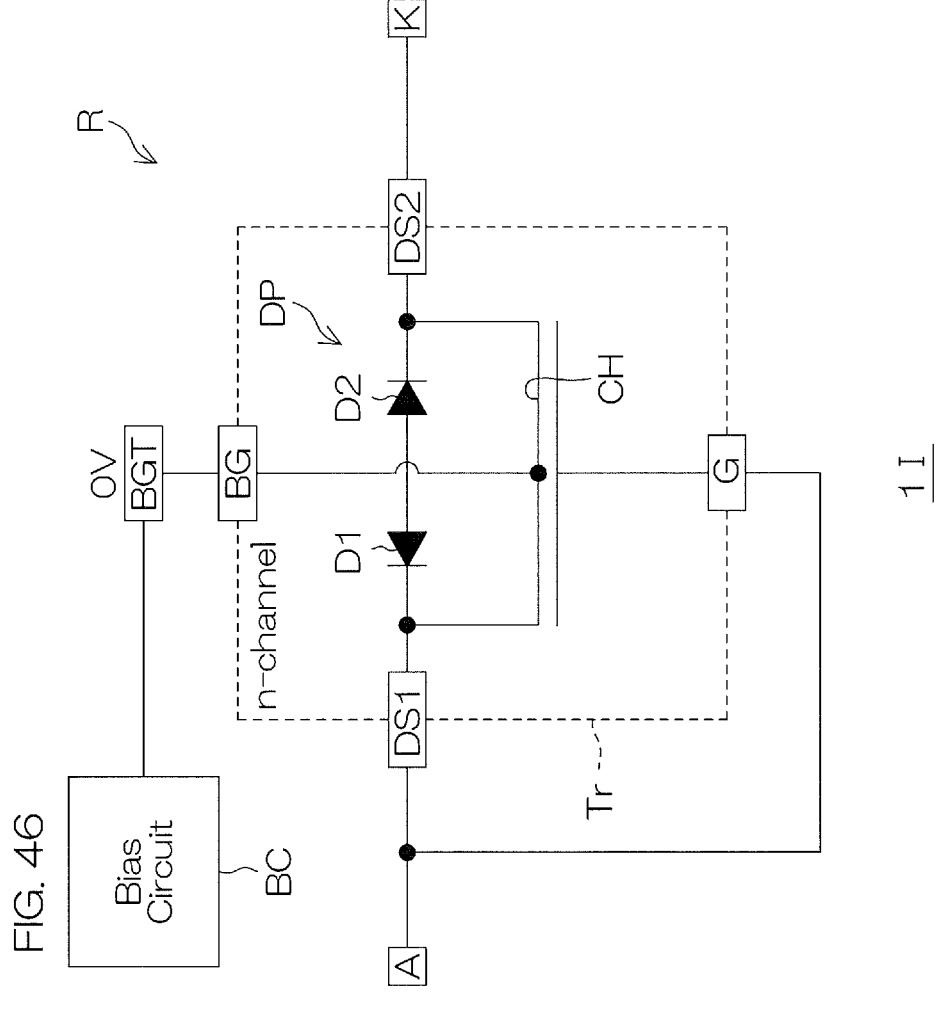
FIG. 46 is a circuit diagram showing an electrical configuration of a rectifier according to a ninth embodiment.

FIG. 46 is a circuit diagram showing an electrical configuration of a rectifier 1I according to a ninth embodiment. Referring to FIG. 46, the rectifier 1I also includes the bias circuit BC electrically connected to the back gate BG so as to fix the back gate BG at a zero potential in the aforementioned rectifier 1H. The bias circuit BC may be configured by a single circuit device such as the second transistor Tr2 according to the third and fourth embodiments mentioned above.

Of course, the bias circuit BC may be configured by a plurality of circuit devices. Also, the configuration of the bias circuit BC is optional as long as the back gate BG can be fixed at a zero potential, and various circuit configurations (circuit devices) can be included. Also, the bias circuit BC may be formed in the single chip 11 together with the transistor Tr in the rectifier 1H according to the first configuration example (see FIG. 44). In this case, it is recommended to provide the circuit region 13 used for the bias circuit BC at the main surface 12 and to form the bias circuit BC in the circuit region 13. Of course, the bias circuit BC may be realized by using a single or a plurality of chips differing from the transistor Tr.

Although the first to ninth embodiments have been described as above, a composite type rectifier in which at least two among the rectifiers LA to 1I according to the first to ninth embodiments are concurrently included may be employed. The composite type rectifier may be realized by using a single chip or by using a plurality of chips.

Examples of features extracted from this description and from the accompanying drawings are shown below. Alphanumeric characters and the like in the parentheses represent corresponding components in each of the aforementioned embodiments in the following examples, and yet these do not denote that the scope of each clause is limited to the embodiments. "Rectifier (1A to 1I)" according to the following clauses may be replaced by "rectifier circuit (1A to 1I)," "semiconductor rectifier circuit (1A to 1I)," "semiconductor rectifier (1A to 1I)," "semiconductor rectifier device (1A to 1I)," "semiconductor device (1A to 1I)," or "semiconductor module (1A to 1I)" if necessary.

[A1] A rectifier (1A to 1I) comprising: a first transistor (Tr1) of a drain/source common field effect type; and a second transistor (Tr2) of a drain/source common field effect type, the second transistor (Tr2) being diode-connected to the first transistor (Tr1) so as to allow the first transistor (Tr1) to perform a diode operation and configuring a rectifier stage (R) with the first transistor (Tr1).

[A2] The rectifier (1A to 1I) according to A1, wherein the rectifier stage (R) has a forward threshold voltage (Vth) consisting of a gate threshold voltage (Vgth1) of the first transistor (Tr1).

[A3] The rectifier (1A to 1I) according to A1 or A2, wherein when a forward voltage (VF) of the rectifier stage (R) is applied, the first transistor (Tr1) reaches an ON state, and the second transistor (Tr2) reaches an OFF state.

[A4] The rectifier (1A to 1I) according to A3, wherein a forward current (IF) of the rectifier stage (R) flows to the first transistor (Tr1).

[A5] The rectifier (1A to 1I) according to any one of A1 to A4, wherein when a reverse voltage (VR) of the rectifier stage (R) is applied, the first transistor (Tr1) reaches an OFF state, and the second transistor (Tr2) reaches an ON state.

[A6] The rectifier (1A to 1I) according to A5, wherein a reverse current (IR) of the rectifier stage (R) flows to the first transistor (Tr1).

[A7] The rectifier (1A to 1I) according to any one of A1 to A6, wherein the first transistor (Tr1) is a p-channel type.

[A8] The rectifier (1A to 1I) according to A7, wherein the first transistor (Tr1) has a gate (G1), a first drain source (DS1) that functions as an anode (A) of the rectifier stage (R), a second drain source (DS2) that functions as a cathode (K) of the rectifier stage (R), and a back gate (BG1) electrically connected to the first drain source (DS1), and the second transistor (Tr2) configures a bias circuit that fixes the gate (G1) of the first transistor (Tr1) at a zero potential.

[A9] The rectifier (1A to 1I) according to A8, wherein the gate (G1) is fixed at a zero potential both at ON and at OFF of the rectifier stage (R).

[A10] The rectifier (1A to 1I) according to A8 or A9, wherein the first transistor (Tr1) has a diode pair (DP1) including a first body diode (D1) and a second body diode (D2) that are connected together in series with a reverse bias between the first drain source (DS1) and the second drain source (DS2).

[A11] The rectifier (1A to 1I) according to any one of A1 to A6, wherein the first transistor (Tr1) is an n-channel type.

[A12] The rectifier (1A to 1I) according to A11, wherein the first transistor (Tr1) has a gate (G1), a first drain source (DS1) that is electrically connected to the gate (G1) and that functions as an anode (A) of the rectifier stage (R), a second drain source (DS2) that functions as a cathode (K) of the rectifier stage (R), and a back gate (BG1), and the second transistor (Tr2) configures a bias circuit that fixes the back gate (BG1) of the first transistor (Tr1) at a zero potential.

[A13] The rectifier (1A to 1I) according to A12, wherein the back gate (BG1) is fixed at a zero potential both at ON and at OFF of the rectifier stage (R).

[A14] The rectifier (1A to 1I) according to A12 or A13, wherein the first transistor (Tr1) has a diode pair (DP1) including a first body diode (D1) and a second body diode (D2) that are connected together in series with a reverse bias between the first drain source (DS1) and the second drain source (DS2).

[A15] A rectifier (1A to 1I) comprising: a transistor (Tr, Tr1) of a drain/source common field effect type of a p-channel, the transistor having a gate (G, G1) fixed at a zero potential, a first drain source (DS1) that functions as an anode (A) of a rectifier stage (R), a second drain source (DS2) that functions as a cathode (K) of the rectifier stage (R), and a back gate (BG, BG1) electrically connected to the first drain source (DS1).

[A16] The rectifier (1A to 1I) according to A15, wherein the gate (G, G1) is fixed at a zero potential both at ON and at OFF of the rectifier stage (R).

[A17] The rectifier (1A to 1I) according to A15 or A16, further comprising a bias circuit (BC, Tr2) that fixes the gate (G, G1) at a zero potential.

[A18] A rectifier (1A to 1I) comprising: a transistor (Tr, Tr1) of a drain/source common field effect type of an n-channel, the transistor (Tr, Tr1) having a gate (G, G1), a first drain source (DS1) that is electrically connected to the gate (G, G1) and that functions as an anode (A) of a rectifier stage (R), a second drain source (DS2) that functions as a cathode (K) of the rectifier stage (R), and a back gate (BG, BG1) fixed at a zero potential.

[A19] The rectifier (1A to 1I) according to A18, wherein the back gate (BG, BG1) is fixed at a zero potential both at ON and at OFF of the rectifier stage (R).

[A20] The rectifier (1A to 1I) according to A18 or A19, further comprising a bias circuit (BC, Tr2) that fixes the back gate (BG, BG1) at a zero potential.

Although the embodiments have been described in detail as above, these are merely concrete examples that specify technical contents. Various technical ideas extracted from this description can be appropriately combined together without being limited to the sequential descriptive order in this description, the sequential order of the embodiments, or the like.

What is claimed is:

1. A rectifier comprising:
a first transistor of a drain/source common field effect type; and
a second transistor of a drain/source common field effect type, the second transistor being diode-connected to the first transistor so as to allow the first transistor to perform a diode operation and configuring a rectifier stage with the first transistor, wherein
the first transistor is a p-channel type and the second transistor is an n-channel type.

2. The rectifier according to claim 1,
wherein the rectifier stage has a forward threshold voltage consisting of a gate threshold voltage of the first transistor.

3. The rectifier according to claim 1,
wherein when a forward voltage of the rectifier stage is applied, the first transistor reaches an ON state, and the second transistor reaches an OFF state.

4. The rectifier according to claim 3,
wherein a forward current of the rectifier stage flows to the first transistor.

5. The rectifier according to claim 1,
wherein when a reverse voltage of the rectifier stage is applied, the first transistor reaches an OFF state, and the second transistor reaches an ON state.

6. The rectifier according to claim 5,
wherein a reverse current of the rectifier stage flows to the first transistor.

7. The rectifier according to claim 1,
wherein the first transistor has a gate, a first drain source that functions as an anode of the rectifier stage, a second drain source that functions as a cathode of the rectifier stage, and a back gate electrically connected to the first drain source, and
the second transistor configures a bias circuit that fixes the gate of the first transistor at a zero potential.

8. The rectifier according to claim 7,
wherein the gate is fixed at the zero potential both at ON and at OFF of the rectifier stage.

9. The rectifier according to claim 7,
wherein the first transistor has a diode pair including a first body diode and a second body diode that are connected together in series with a reverse bias between the first drain source and the second drain source.

10. A rectifier comprising:
a transistor of a drain/source common field effect type of a p-channel, the transistor having a gate fixed at a zero potential, a first drain source that functions as an anode of a rectifier stage, a second drain source that functions as a cathode of the rectifier stage, and a back gate electrically connected to the first drain source.

11. The rectifier according to claim 10,
wherein the gate is fixed at the zero potential both at ON and at OFF of the rectifier stage.

12. The rectifier according to claim 10, further comprising:
a bias circuit that fixes the gate at the zero potential.

13. A rectifier comprising:
a transistor of a drain/source common field effect type of an n-channel, the transistor having a gate, a first drain source wherein the gate is electrically connected to the first drain source, and wherein the first drain source functions as an anode of a rectifier stage, a second drain source that functions as a cathode of the rectifier stage, and a back gate fixed at a zero potential.

14. The rectifier according to claim 13,
wherein the back gate is fixed at the zero potential both at ON and at OFF of the rectifier stage.

15. The rectifier according to claim 13, further comprising:
a bias circuit that fixes the back gate at the zero potential.

* * * * *